(12) United States Patent
Willemen

(10) Patent No.: US 11,764,205 B2
(45) Date of Patent: *Sep. 19, 2023

(54) SEMICONDUCTOR DEVICE

(71) Applicant: Infineon Technologies AG, Neubiberg (DE)

(72) Inventor: Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 74 days.

This patent is subject to a terminal disclaimer.

(21) Appl. No.: 17/348,291

(22) Filed: Jun. 15, 2021

(65) Prior Publication Data

US 2021/0313311 A1  Oct. 7, 2021

Related U.S. Application Data

(63) Continuation of application No. 16/538,182, filed on Aug. 12, 2019, now Pat. No. 11,069,674.

(30) Foreign Application Priority Data

Aug. 13, 2018 (DE) .......................... 102018213633.5

(51) Int. Cl.
*H01L 27/02* (2006.01)
*H01L 29/06* (2006.01)
(Continued)

(52) U.S. Cl.
CPC ...... *H01L 27/0248* (2013.01); *H01L 27/0814* (2013.01); *H01L 29/0649* (2013.01); *H01L 29/8618* (2013.01)

(58) Field of Classification Search
CPC ............. H01L 27/0248; H01L 27/0814; H01L 29/0649; H01L 29/8618
(Continued)

(56) References Cited

U.S. PATENT DOCUMENTS 6,614,087 B1   9/2003  Morishita et al.
10,847,509 B2  11/2020  Willemen
(Continued)

FOREIGN PATENT DOCUMENTS

JP   2014138054 A   7/2014

*Primary Examiner* — Dzung Tran
(74) *Attorney, Agent, or Firm* — Slater Matsil, LLP

(57) ABSTRACT

A semiconductor device includes "n" pairs of pn-junction structures, wherein the i-th pair includes two pn-junction structures of the i-th type, wherein the two pn-junction structures of the i-th type are anti-serially connected, wherein the pn-junction structure of the i-th type has an i-th junction grading coefficient $m_i$. A first pair of the n pairs of pn-junction structures has a first junction grading coefficient $m_1$ and a second pair of the n pairs of pn-junction structures has a second junction grading coefficient $m_2$. The junction grading coefficients $m_1$, $m_2$ are adjusted to result in generation of a spurious third harmonic signal of the semiconductor device with a signal power level, which is at least 10 dB lower than a reference signal power level of the spurious third harmonic signal obtained for a reference case in which the first and second junction grading coefficients $m_1$, $m_2$ are 0.25.

20 Claims, 27 Drawing Sheets

(51) Int. Cl.
*H01L 29/861* (2006.01)
*H01L 27/08* (2006.01)

(58) Field of Classification Search
USPC .......................................................... 257/506
See application file for complete search history.

(56) References Cited

U.S. PATENT DOCUMENTS

| | | |
|---|---|---|
| 11,069,674 B2 | 7/2021 | Willemen |
| 2005/0214957 A1 | 9/2005 | Kihara et al. |
| 2008/0191260 A1 | 8/2008 | De Vreede et al. |
| 2008/0290465 A1 | 11/2008 | de Vreede |
| 2009/0134960 A1 | 5/2009 | Larson et al. |
| 2012/0169398 A1 | 7/2012 | Brindle et al. |
| 2014/0167218 A1 | 6/2014 | Mallikarjunaswamy et al. |
| 2015/0084162 A1 | 3/2015 | Davis |
| 2015/0325573 A1 | 11/2015 | Wright et al. |
| 2016/0329918 A1 | 11/2016 | Wright |
| 2016/0351557 A1 | 12/2016 | Weyers |
| 2018/0047718 A1* | 2/2018 | Yao ..................... H01L 29/0649 |
| 2020/0051968 A1 | 2/2020 | Willemen |
| 2020/0051969 A1 | 2/2020 | Willemen |
| 2021/0313311 A1 | 10/2021 | Willemen |

* cited by examiner

SEMICONDUCTOR DEVICE

This application is a continuation of U.S. patent application Ser. No. 16/538,182, filed Aug. 12, 2019, which application claims the benefit of German Application No. 102018213633.5, filed on Aug. 13, 2018, which applications are hereby incorporated herein by reference.

TECHNICAL FIELD

Embodiments relate to a semiconductor device having at least two pairs of anti-serially connected pn-junction structures (also denoted diode structures herein) with adjusted junction grading coefficients (also called diode power law exponent) for providing an at least reduced or a minimum generation of a spurious odd harmonics, e.g., third harmonics.

Further embodiments relate to a semiconductor device having at least two anti-serially connected pn-junction structures with adjusted junction grading coefficients, wherein one of the two pn-junction structures comprises a "composite" diode structure, to adjust and obtain a desired TVS behavior (TVS=transient voltage suppressor) of the semiconductor device regarding breakdown voltage and to provide an at least reduced or a minimum generation of a spurious odd harmonics, third harmonics.

BACKGROUND

Discrete ESD protection devices (ESD=electrostatic discharge) and TVS devices (TVS=transient voltage suppressor), in general, have non-linear electrical properties which cause a harmonic distortion of RF signals (RF=radio frequency) that are present on signal lines, e.g., on PCB lines (PCB=printed circuit board), that are connected to the ESD protection device or TVS device. This harmonic generation creates spurious and unwanted harmonic signals which may interfere with other functions or functional blocks of an electronic system if those functions or functional blocks use frequency bands that are an integer multiple of the distorted RF signal.

For example, the third harmonic (H3) frequency of certain frequency bands in the range between 800 and 900 MHz used in mobile telecommunication standards interferes with RF signals in the 2.4 GHz-WiFi-band, i.e., in the frequent range between 2.412 and 2.472 GHz.

To avoid such unwanted interferences between the above exemplarily described frequency bands, electronic devices, such as TVS devices, should minimize its harmonic generation to a sufficiently low level.

In known implementations, the generation of even harmonics is, for example, minimized by utilizing a strictly symmetrical design and a highly symmetric behavior of the electronic device for positive and negative half waves of the RF signal. By ensuring asymmetry, even harmonics can be efficiently suppressed, however, the generation of odd harmonics is not effected or sufficiently suppressed by this approach.

With respect to a minimum generation of odd harmonics, e.g., the third harmonic (H3), it has been assumed in the prior art for a long time that a low capacitance and a flat capacitance versus voltage (CV) behavior of an electronic device leads to a low harmonics generation including the third harmonic.

However, current researches of the applicant have shown that, considering the comparison of the harmonics generation of electronic devices with different capacitance values and CV characteristics, the above approach for suppressing the generation of odd harmonics is not sufficient.

Generally, there is a need in the art for an approach to implement semiconductor devices, e.g., for discrete ESD protection devices or TVS devices, having a reduced or minimum generation of odd harmonics, e.g., of the third harmonic.

Generally, there is a need in the art for an approach to implement semiconductor devices, e.g., for discrete ESD protection devices or TVS devices, further having a reduced or tuned breakdown voltage.

SUMMARY

According to an embodiment, a semiconductor device comprises "n" pairs of pn-junction structures, with n is an integer$\geq 2$, wherein the i-th pair, with $i \in \{1, \ldots, n\}$, comprises two pn-junction structures of the i-th type, wherein the two pn-junction structures of the i-th type are anti-serially connected, wherein the pn-junction structure of the i-th type is arranged to have an i-th junction grading coefficient $m_i$, wherein at least a first pair of the n pairs of pn-junction structures is arranged to have a first junction grading coefficient $m_1$ with $m_1 \notin \{0.00, 0.50\}$ and $m_1 < 0.50$ and a second pair of the n pairs of pn-junction structures is arranged to have a second junction grading coefficient $m_2$ with $m_2 \notin \{0.00, 0.50\}$, and wherein the junction grading coefficients $m_1$, $m_2$ of the first and second pair of the n pairs of pn-junction structures are adjusted to result in generation of a spurious third harmonic signal of the semiconductor device with a signal power level (PH3), which is at least 10 dB lower than a (e.g., simulated) reference signal power level (PH3) of the spurious third harmonic signal obtained for a (e.g., simulated) reference case in which the first and second junction grading coefficients $m_1$, $m_2$ are 0.25.

In a commonly applied model of a pn-junction structure, the i-th junction grading coefficient $m_i$ is determined based on a voltage dependent capacitance characteristic $C_i(V_i)$ of a depletion region of the pn-junction structure of the i-th type for a reverse bias voltage $V_i$ applicable to the pn-junction structure of the i-th type, with $$C_i(V_i) = \frac{C_{Joi}}{\left(\frac{V_i}{V_{Ji}} + 1\right)^{m_i}}; \tag{A_1}$$

wherein $C_{Joi}$ denotes an i-th zero bias junction capacitance and $V_{Ji}$ denotes an i-th junction voltage potential.

The spurious odd harmonics generation, for instance for the reference case, may be determined by simulations using a standard circuit simulation tool such as the Advanced Design System (ADS) by Keysight Technologies for instance by a harmonic balance analysis which is generally known in the art.

According to a further embodiment, a semiconductor device comprises "n" pairs of pn-junction structures, with n is an integer$\geq 2$, wherein the i-th pair, with $i \in \{1, \ldots, n\}$, comprises two pn-junction structures of the i-th type, wherein the two pn-junction structures of the i-th type are anti-serially connected, wherein the pn-junction structure of the i-th type is arranged to have an i-th junction grading coefficient $m_i$, wherein the first to n-th junction grading coefficients $m_1$ to $m_n$ comply within a tolerance range of $\pm 0.05$ with the following ellipse equation:

$$\sum_{i=1}^{n} \left(\frac{m_i - 0,25}{a_i}\right)^2 = 1, \text{ with } \sum_{i=1}^{n} \left(\frac{1}{a_i}\right)^2 = 16,$$

wherein at least a first pair of the n pairs of pn-junction structures is arranged to have a first junction grading coefficient $m_1$ with $m_1 \notin \{0.00, 0.50\}$ and $m_1 < 0.50$ and a second pair of the n pairs of pn-junction structures is arranged to have a second junction grading coefficient $m_2$, with $m_2 \notin \{0.00, 0.50\}$, and wherein the parameters $a_i$ are determined based on a zero bias capacitance $C_{J0i}$ and a junction voltage potential $V_{Ji}$ of the pn-junction structure of the i-th type.

The tolerance range of 0.05 indicates a range for each of the junction grading coefficients. In the present context, the grading coefficients $m_1$ to $m_n$ are considered to comply with the ellipse equation within this tolerance range in case the ellipse intersects or at least touches the volume defined by the tolerance range around a specific point ($m_1$ to $m_n$) in the n-dimensional space (coordinate system) of the grading coefficient. For illustrative purposes, in the two dimensional case of two pairs of pn-junction structures with grading coefficients $m_1$ and $m_2$, said volume defined by the tolerance ranges is a circle with diameter 0.10 and the specific point ($m_1$, $m_2$) in the middle. Thereby, effectively, a range of width 0.10 around the ellipse is defined in which possible combinations of grading coefficients $m_1$ to $m_1$ may be situated.

Therein the i-th junction grading coefficient $m_i$, the zero bias junction capacitance $C_{J0i}$ and the junction potential $V_{Ji}$ of the pn-junction structure of the i-th type may also be described by the above mentioned formula (A1).

Thus, embodiments relate to a semiconductor device having at least two pairs of anti-serially connected pn-junction structures with, for each of the at least two pairs, adjusted junction grading coefficients for providing an at least reduced or a minimum generation of a spurious odd harmonics, e.g., the third harmonics.

According to a further embodiment, a semiconductor device comprises a composite pn-junction structure in a semiconductor substrate, wherein the composite pn-junction structure is arranged to have a predetermined first junction grading coefficient $m_1$, with $m_1 > 0.50$, wherein the composite pn-junction structure comprises a first partial pn-junction structure and a second partial pn-junction structure, wherein the first partial pn-junction structure is arranged to have a predetermined first partial junction grading coefficient $m_{11}$, and wherein the second partial pn-junction structure is arranged to have a predetermined second partial junction grading coefficient $m_{12}$, wherein the predetermined first partial junction grading coefficient $m_{11}$ is different to the predetermined second partial junction grading coefficient $m_{12}$, with $m_{11} \neq m_{12}$, and wherein at least one of the predetermined first and second partial junction grading coefficients $m_{11}$, $m_{12}$ is greater than 0.5, with $m_{11}$ and/or $m_{12} > 0.5$, and wherein the predetermined first junction grading coefficient $m_1$ of the composite pn-junction structure is based on a predetermined combination of the first and second partial junction grading coefficients $m_{11}$, $m_{12}$.

Thus, embodiments relate to a semiconductor device having at least two pairs of anti-serially connected pn-junction structures with adjusted junction grading coefficients, wherein at least one of the at least two pairs of pn-junction structures is a pair of anti-serially connected composite pn-junction structures (also denoted composite diode structure herein), to adjust and obtain a desired TVS behavior (TVS=transient voltage suppressor) of the semiconductor device regarding breakdown voltage and to provide an at least reduced or a minimum generation of a spurious odd harmonics, e.g., third harmonics.

BRIEF DESCRIPTION OF THE DRAWINGS

Embodiments of the present concept are described herein making reference to the appended drawings and figures, wherein:

FIG. 4b shows a zoomed-in plot (view) of FIG. 4a;

FIG. 5a shows a schematic cross-sectional view of a first portion of the semiconductor device of FIG. 1a;

FIG. 5b shows a schematic cross-sectional view of a second portion of the semiconductor device of FIG. 1a;

FIG. 6b shows a schematic top view of the semiconductor device of FIG. 6a;

FIG. 9b shows a schematic simulated plot of different exemplary doping profiles of the composite pn-junction structure of the semiconductor device of FIG. 9a;

Figure 1A:
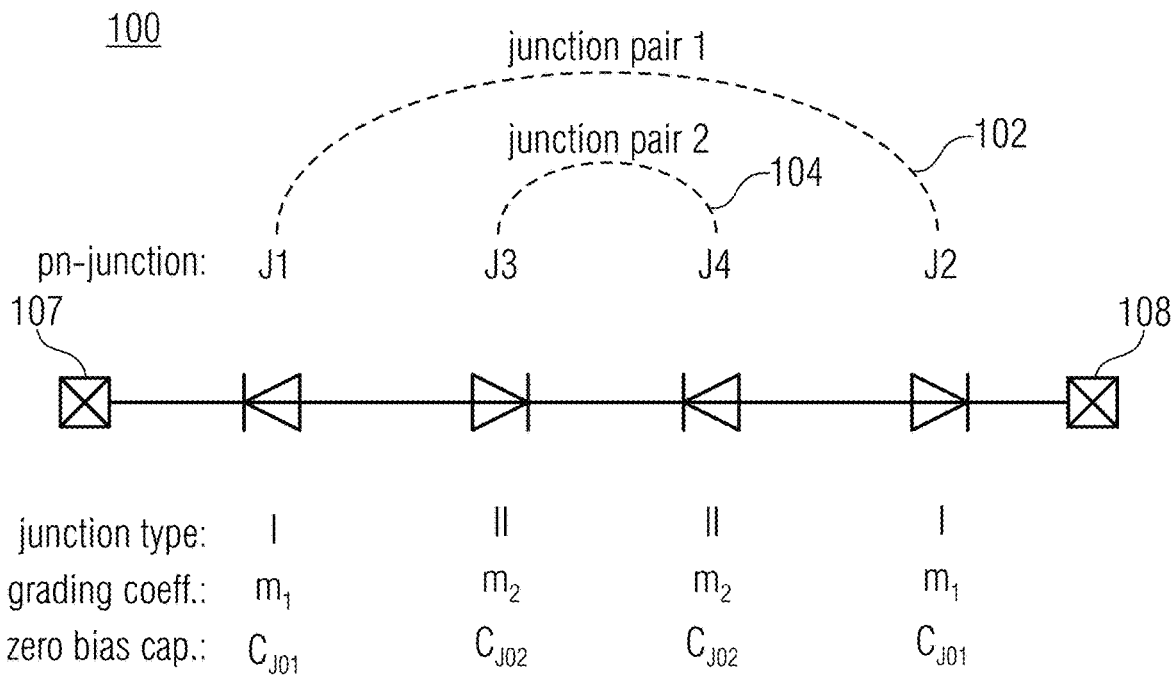
FIGS. 1a-1d show exemplary schematic circuit diagrams of a semiconductor device having n pairs of anti-serially connected pn-junction structures according to an embodiment.

Before discussing embodiments of the present invention in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments of the invention are discussed in detail, however, it should be appreciated that the invention provides many applicable concepts that can be embodied in a wide variety of semiconductor devices. The specific embodiments discussed are merely illustrative of specific ways to make and use the invention, and do not limit the scope of the invention. In the following description of embodiments, the same or similar elements having the same function have associated therewith the same reference signs or the same name, and a description of the such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between," "adjacent" versus "directly adjacent," etc.).

The abbreviation CV or C(V), respectively, as used herein stands for Capacitance vs. Voltage. The terms C(V) characteristics, C(V) properties and C(V) behavior may be used synonymously in this document.

FIGS. 1a-1d show different schematic circuit diagrams of a semiconductor device 100 having "n" pairs 102, 104 ( . . . ) of anti-serially connected pn-junction structures $J_1$, $J_2$, $J_3$, $J_4$ ( . . . ), which can be adjusted on the basis of the present concept as described below to comprise a reduced, for instance strongly reduced, or even minimized generation of a spurious odd harmonics, e.g., third harmonics.

To be more specific, the semiconductor device 100 comprises "n" pairs 102, 104 ( . . . ) of pn-junction structures $J_1$, $J_2$ and $J_3$, $J_4$ ( . . . ), with n is an integer≥2, wherein the i-th pair, with i∉{1, . . . , n}, comprises two pn-junction structures of the i-th type, wherein the two pn-junction structures of the i-th type are anti-serially connected. The pn-junction structure of the i-th type is arranged to have an i-th junction grading coefficient $m_i$ ($m_1$, $m_2$, . . . ), an i-th zero bias junction capacitance $C_{Joi}$, and an i-th junction voltage potential $V_{Ji}$, and to have the following capacitance behavior $C_i(V_i)$ based on a reverse bias voltage $V_i$ applicable to the pn-junction structure of the i-th type, with $$C_i(V_i) = \frac{C_{Joi}}{\left(\frac{V_i}{V_{Ji}} + 1\right)^{m_i}}.$$

The C(V) characteristics described by the above equation are also valid for small forward bias voltages. In other words, the expression is also valid for a range of applied voltages where the reverse bias voltage is negative, i.e., the applied voltage is a forward bias voltage. In this specification the wording "pn-junction (or diode structure) with a grading coefficient $m_i$" is used to express that the C(V) characteristics of the said pn-junction or diode structure can be described by the above equation with grading coefficient or power law exponent $m_i$.

According to an embodiment, at least a first pair 102 of the n pairs 102, 104 ( . . . ) of pn-junction structures $J_1$, $J_2$ and $J_3$, $J_4$ ( . . . ) is arranged to have a first junction grading coefficient $m_1$ with $m_1 \notin \{0.00, 0.50\}$ and a second pair 104 of the n pairs 102, 104 ( . . . ) of pn-junction structures $J_1$, $J_2$ and $J_3$, $J_4$ ( . . . ) is arranged to have a second junction grading coefficient $m_2$ with $m_2 \notin \{0.00, 0.50\}$, and wherein the first pair 102 of the pn-junction structures $J_1$, $J_2$ is arranged to have the first junction grading coefficient $m_1$ with $m_1 < 0.50$, and wherein the junction grading coefficients $m_1$, $m_2$ of the first and second pair 102, 104 ( . . . ) of the n pairs of pn-junction structures $J_1$, $J_2$ and $J_3$, $J_4$ ( . . . ) are adjusted to result in generation of a spurious third harmonic signal of the semiconductor device 100 with a signal power level PH3, which is at least 10 dB lower, preferably at least 15 dB lower, and more preferably at least 20 dB lower, than a (e.g., simulated) reference signal power level PH3' of the spurious third harmonic signal obtained for a (e.g., simulated) reference case in which the first and second junction grading coefficients $m_1$, $m_2$ are respectively 0.25. It may be preferable from the point of facilitated manufacturing of the pn-junction structure that $m_1 \leq 0.48$ holds.

The second pair 104 of the pn-junction structures $J_3$, $J_4$ may be arranged to have the second junction grading coefficient $m_2$ with $m_2 > 0.50$, preferably $m_2 \geq 0.52$.

In the reference case, a reference signal power level PH3' of the spurious third harmonic signal of the semiconductor device 100 is simulated and calculated by setting the reference value of the junction grading coefficients $m_1$, $m_2$ ( . . . ), i.e., all junction grading coefficients $m_1$, $m_2$, ( . . . ), which have been adjusted above and deviate from 0.00 and 0.50, to the reference value of $m_i = 0.25$.

According to the above defined embodiment, the junction grading coefficients $m_1$, $m_2$ ( . . . ) of the n pairs 102, 104 ( . . . ) of the pn-junction structures $J_1$, $J_2$ and $J_3$, $J_4$ ( . . . ) are adjusted to provide an at least reduced signal power level of the spurious third harmonic signal PH3, when compared to the, e.g., simulated, reference signal power level PH3' of the spurious third harmonic signal of the semiconductor device 100 which is obtained in the reference case in which the junction grading coefficients $m_1$, $m_2$ ( . . . ) are set to a reference value of 0.25. The following evaluations with respect to FIGS. 2a-2i, for example, will show that a simulation with a circuit simulation tool described in further detail below of the reference signal power level PH3' of the semiconductor device 100 having the junction grading coefficients $m_1$, $m_2$ ( . . . ) set to the reference value of 0.25 relates to a (theoretical) local maximum of the reference signal power level PH3' of the spurious third harmonic signal of the semiconductor device 100.

According to a further embodiment, the semiconductor device 100 comprises "n" pairs 102, 104 ( . . . ) of pn-junction structures $J_1$, $J_2$ and $J_3$, $J_4$ ( . . . ), with n being an integer 2, wherein the i-th pair, with $i \in \{1, \ldots, n\}$, comprises two pn-junction structures of the i-th type, wherein the two pn-junction structures of the i-th type are anti-serially connected. The pn-junction structure of the i-th type is arranged to have an i-th junction grading coefficient $m_i$, an i-th zero bias junction capacitance $C_{Joi}$, and an i-th junction voltage potential $V_{Ji}$, and to have the following capacitance behavior $C_i(V_i)$ based on a reverse bias voltage $V_i$ applicable to the pn-junction structure of the i-th type, with $$C_i(V_i) = \frac{C_{Joi}}{\left(\frac{V_i}{V_{Ji}}+1\right)^{m_i}} ; \text{and}$$

and
wherein the first to n-th junction grading coefficients $m_1$ to $m_n$ comply within a tolerance range of 0.05 with the following ellipse equation:

$$\sum_{k=1}^{n}\left(\frac{m_i - 0,25}{a_i}\right)^2 = 1, \text{ with } \sum_{k=1}^{n}\left(\frac{1}{a_i}\right)^2 = 16,$$

wherein at least a first pair of the n pairs of pn-junction structures is arranged to have a first junction grading coefficient $m_1$ with $m_1 \notin \{0.00, 0.50\}$, wherein $m_1 < 0.50$, and a second pair of the n pairs of pn-junction structures is arranged to have a second junction grading coefficient $m_2$, with $m_2 \notin \{0.00, 0.50\}$, and wherein the first to n-th parameters "$a_1$ to $a_n$" depend on the zero bias capacitances $C_{Joi}$ and the junction voltage potentials $V_{Ji}$ of the pn-junction structures. It may be preferable from the point of facilitated manufacturing of the pn-junction structure that $m_1 \leq 0.45$ holds.

The second pair 104 of the pn-junction structures $J_3$, $J_4$ may be arranged to have the second junction grading coefficient $m_2$ with $m_2 > 0.50$, preferably $m_2 \geq 0.52$.

As indicated above, the first to n-th junction grading coefficients $m_1$ to $m_n$ comply within a tolerance range of ±0.05 with the indicated (n-dimensional) ellipse equation. The tolerance range of ±0.05 (or ±0.03) may, for example, take into account inevitable semiconductor fabrication tolerances of the semiconductor device 100. The tolerance range of ±0.05 (or ±0.03) may, for example, further take into account a (possibly appearing) difference between the trajectory of the theoretical optimum suppression of spurious third harmonics and the trajectory of the actual (e.g., input power dependent) optimum of suppression at different input power levels of the semiconductor device 100. This will be described in more detail below with reference to FIGS. 4g-4j.

In the following, schematic circuit diagrams of some possible implementations of the semiconductor device 100 according to the present concept are described with respect to FIGS. 1a-1d.

As exemplarily shown in FIG. 1a, the semiconductor device 100 may comprise n=2 pairs 102, 104 of anti-serially connected pn-junction structures $J_1$, $J_2$, $J_3$, $J_4$, wherein the first pair 102 of the pn-junction structures comprises the pn-junction structures $J_1$, $J_2$ of the first type having the first grading coefficient $m_1$, the first junction voltage potential $V_{J1}$ and the first zero bias capacitance $C_{Jo1}$, wherein the second pair of pn-junction structures 104 comprises the pn-junction structures $J_3$, $J_4$ of the second type having the second grading coefficient $m_2$, the second junction voltage potential $V_{J2}$ and the second zero bias capacitance $C_{Jo2}$. As shown in FIG. 1a, the pn-junction structures $J_1$, $J_2$ of the first pair 102 and the pn-junction structures $J_3$, $J_4$ of the second pair 104 are respectively anti-serially connected, wherein the (at least) two pairs 102, 104 of pn-junction structures $J_1$-$J_4$ are connected between the first and second terminal 107, 108.

Figure 1B:
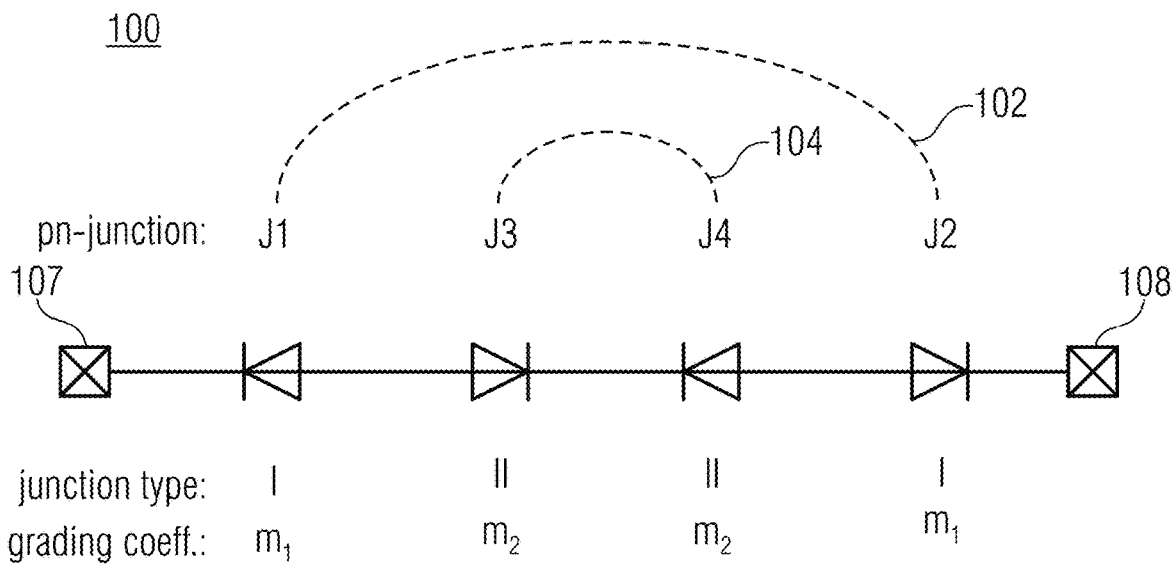

FIG. 1b shows a further exemplarily schematic circuit diagram of the semiconductor device 100 having two (n=2) pairs 102, 104 of pn-junction structures $J_1$, $J_2$, $J_3$, $J_4$, wherein the first pair 102 comprises the pn-junction structures $J_1$, $J_2$ of the first type having the first grading coefficient $m_1$, the first junction voltage potential $V_{J1}$ and the first zero bias capacitance $C_{Jo1}$, and the second pair 104 comprises the pn-junction structures $J_3$, $J_4$ of the second type having the second grading coefficient $m_2$, the second junction voltage potential $V_{J2}$ and the second zero bias capacitance $C_{Jo2}$. As shown in FIG. 1b, the pn-junction structures $J_1$, $J_2$ of the first pair 102 are anti-serially connected and the pn-junction structures $J_3$, $J_4$ of the second pair 104 are anti-serially connected, wherein the (at least) two pairs 102, 104 of pn-junction structures $J_1$-$J_4$ are connected between the first and second terminal 107, 108. The arrangement of the two pairs 102, 104 of the pn-junction structures $J_1$, $J_2$, $J_3$, $J_4$ as shown in FIG. 1b differs only by an inverted direction of the respective pn-junction structures $J_1$-$J_4$ when compared to the semiconductor device 100 of FIG. 1a.

Figure 1C:
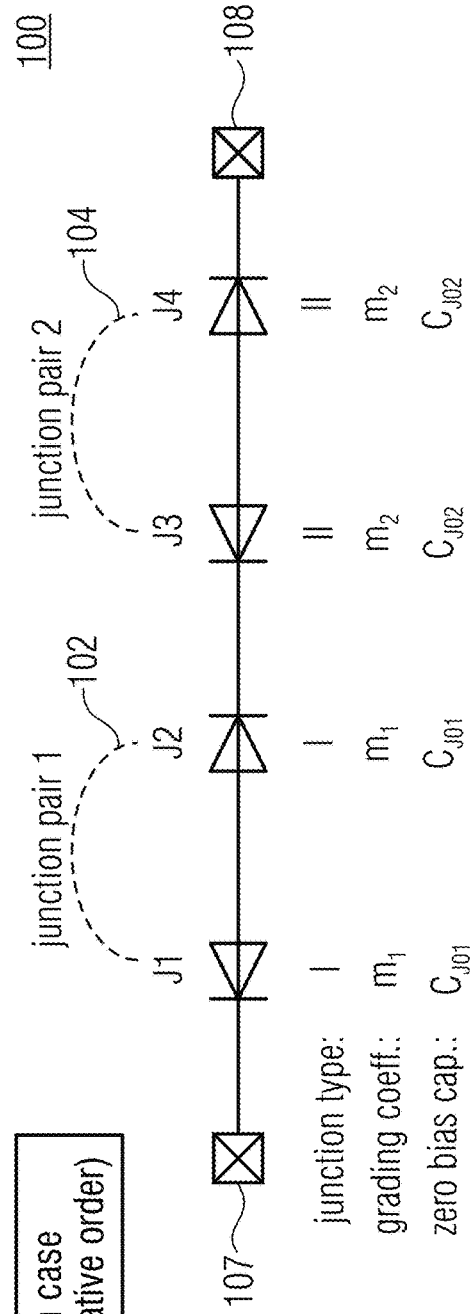

FIG. 1c shows a further schematic circuit diagram of the semiconductor device 100 having n=2 pairs 102, 104 pairs on pn-junction structures $J_1$, $J_2$, $J_3$, $J_4$, wherein in FIG. 1c, the first pair 102 comprises the pn-junction structures $J_1$, $J_2$ of the first type having the first grading coefficient $m_1$, the first junction voltage potential $V_{Ji}$ and the first zero bias capacitance $C_{Jo1}$, wherein the second pair 104 comprises the pn-junction structures $J_3$, $J_4$ of the second type having the second grading coefficient $m_2$, the second junction voltage potential $V_{J2}$ and the second zero bias capacitance $C_{Jo2}$. As shown in FIG. 1c, the pn-junction structures $J_1$, $J_2$ of the first pair 102 and the pn-junction structures $J_3$, $J_4$ of the second pair 104 are respectively anti-serially connected, wherein the (at least) two pairs 102, 104 of pn-junction structures $J_1$-$J_4$ are connected between the first and second terminal 107, 108. The arrangement of the two pairs 102, 104 of the pn-junction structures $J_1$-$J_4$ as shown in FIG. 1c differs only by the order of arrangement of the respective pn-junction structures $J_1$-J4 when compared to the semiconductor device 100 of FIG. 1a.

Figure 1D:
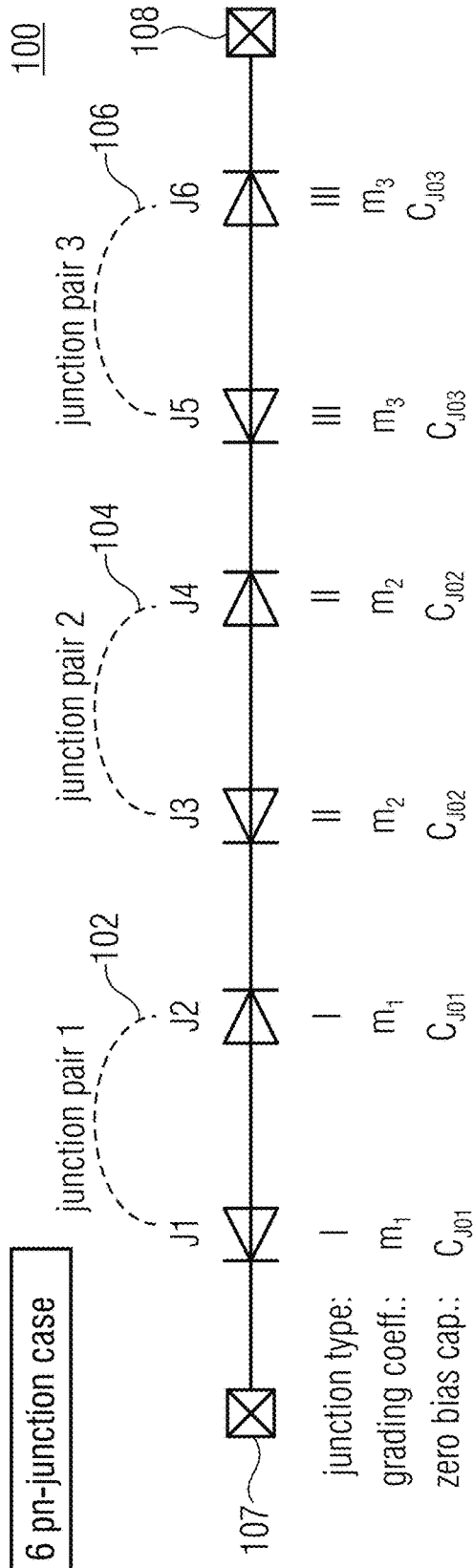

FIG. 1d shows a further schematic circuit diagram of the semiconductor device 100 having n=3 pairs 102, 104, 106 of anti-serially connected pn-junction structures $J_1$, $J_2$, $J_3$, $J_4$ and $J_5$, $J_6$. As shown in FIG. 1d, the first pair 102 comprises the two pn-junction structures $J_1$, $J_2$ of the first type having the first grading coefficient $m_1$, the first junction voltage potential $V_{J1}$ and the first zero bias capacitance $C_{Jo1}$, the second pair 104 comprises the pn-junction structures $J_3$, $J_4$ of the second type having the second grading coefficient $m_2$, the second junction voltage potential $V_{J2}$ and the second zero bias capacitance $C_{Jo2}$, and wherein the third pair 106 comprises the pn-junction structures $J_5$, $J_6$ of the third type having the third grading coefficient $m_3$, the third junction voltage potential $V_{J3}$ and the third zero bias capacitance $C_{Jo3}$, for example. As shown in FIG. 1d, the pn-junction structures $J_1$, $J_2$ of the first pair 102, the pn-junction structures $J_3$, $J_4$ of the second pair 104, and the pn-junction structures $J_5$, $J_6$ of the third pair 104 are respectively anti-serially connected, wherein the three pairs 102, 104, 106 of pn-junction structures $J_1$-$J_6$ are connected between the first and second terminal 107, 108.

The above-described schematic circuit diagrams of the semiconductor devices 100 show that the semiconductor device 100 may comprise a plurality of pairs 102, 104, 106 of pn-junction structures $J_1$-$J_6$ wherein the two associated pn-junction structures of the respective pair are anti-serially arranged or connected, respectively between the first and second terminal 107, 108, wherein the order of the respective pn-junction structures does not influence the resulting reduction of third harmonic generation of the semiconductor device so that the different pn-junction structures of the n pairs may be arbitrarily arranged in an anti-serial manner between the first and second terminal 107, 108.

The spurious odd harmonics generation, for instance of the reference case, may be determined by simulations using a standard circuit simulation tool such as the Advanced Design System (ADS) by Keysight Technologies, wherein, for instance, a harmonic balance analysis may be employed which is generally known in the art. The simulation results may be compared with a measurement of the spurious harmonics generation of a semiconductor device under test and hence compared with the harmonic generation of the reference case to determine a power level of the measured spurious third harmonics of the device under test relative to the power level of the spurious third harmonics determined by simulation for the reference case. Model parameters for the simulation of the reference case, other than the grading coefficient—such as the zero bias junction capacitance and the junction potential, may be obtained from the measurements of the device to be compared by methods generally known in the art.

Figure 2:
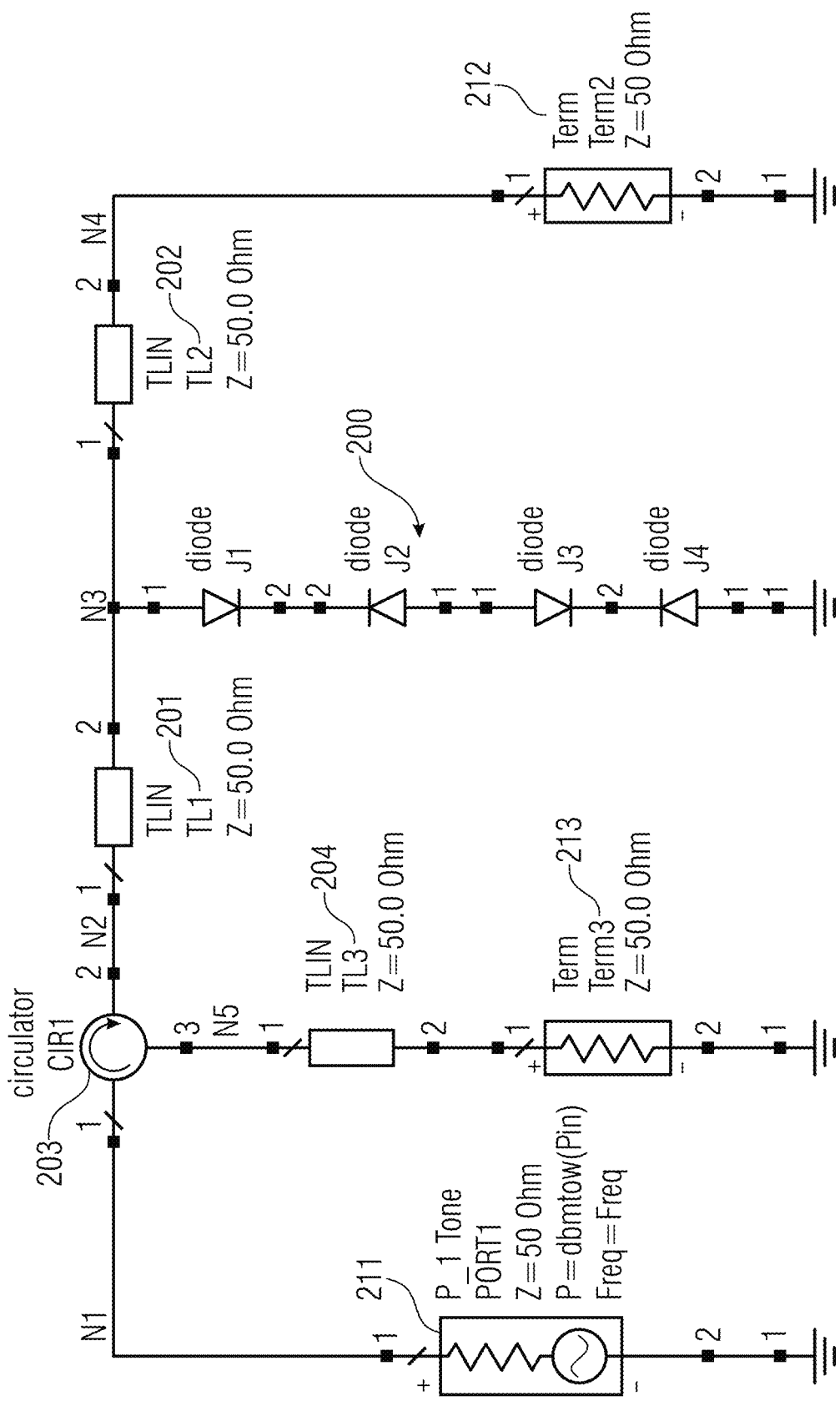
FIG. 2 shows an exemplary circuit block diagram for testing the semiconductor device.

A possible circuit set-up for measurement or simulation of harmonics generation of a semiconductor device under test is illustrated by the block circuit diagram of FIG. 2. It depicts a transmission line comprising two parts TL1 201 and TL2 202, in which the semiconductor device under test 200 (shown as four diode structures $J_1$-$J_4$ by way of example) is connected in shunt configuration to ground. An RF signal is delivered at a fundamental frequency fo by an RF source PORT1 211 and, on a depicted left end of the transmission line TL1 201, coupled into TL1 201 by a circulator CIR1 203.

The RF signal is conducted to the semiconductor device under test 200 ($J_1$-$J_4$), where harmonic signals at integer multitudes of the fundamental frequency (overtones) are generated due to non-linearities in the electrical properties of the semiconductor device under test 200. The generated harmonic signals are transmitted from the semiconductor device under test 200 via TL2 202 to the termination Term2 212 and via TL1 201, the circulator CIR1 203, and transmission line TL3 204 to the termination Term3 213. By use of a spectrum analyzer (not shown), the RF power distribution of the harmonic signals can be determined either at the position of termination Term2 212 or termination Term3 213. By sweeping the power of the delivered RF signal at the fundamental frequency, the input power dependency of the harmonics generation can be determined.

The sensitivity of the determination of generated harmonic signal may be further increased by adding e.g., additional filters or diplexers (not shown) for filtering out the signal at the fundamental frequency fo.

Figure 3B:
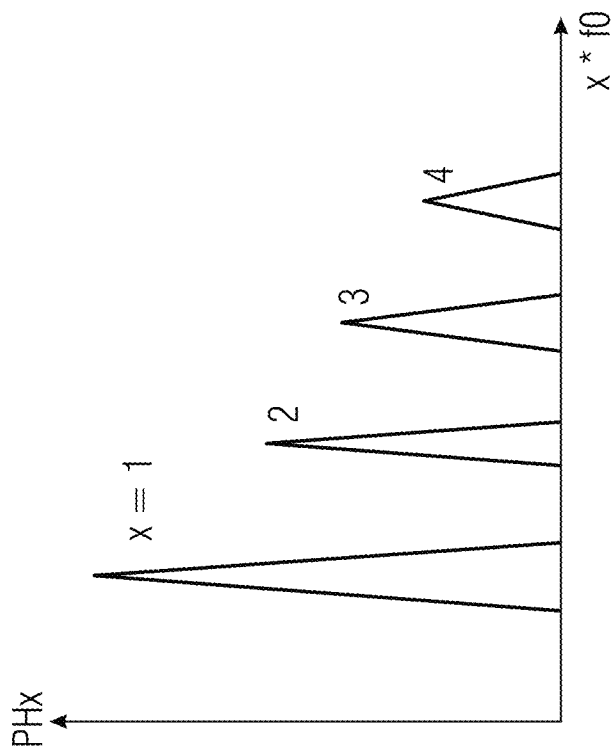
FIGS. 3a-3b show schematic power distributions of RF-signals according to an embodiment.
Figure 3A:
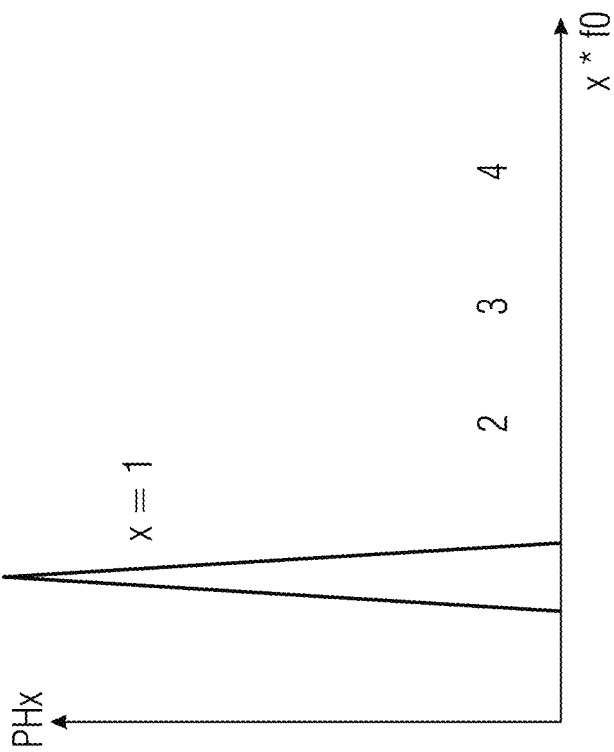

Typical spectra of the generated RF-signal and the harmonic signals are schematically illustrated in FIGS. 3a and 3b respectively. FIG. 3a illustrates the spectrum of the RF signal as delivered by the RF source PORT1 211. This signal is delivered to only consist of the fundamental frequency fo (1st harmonic, x=1). FIG. 3b depicts the spectrum of the signal that is arriving at e.g., termination Term2 212. The signal power at the fundamental frequency is reduced compared to the incident signal as shown in FIG. 3a, (1) due to impedance mismatch caused by the semiconductor device under test 200 in shunt configuration, and (2) due to partial conversion of the electrical signal at the fundamental frequency into the overtones, here shown for the second to fourth harmonic for simplicity. The spectrum further shows that the signal in the e.g., termination Term2 212 also comprises power contributions at integer multitudes of the fundamental frequency, such as the second harmonic power PH2 at 2 times fo (2×fo, x=2), third harmonic power PH3 at 3 times fo (3×fo, x=3), and so forth. Generally, the power contribution of the overtones decrease with the order of the harmonic.

The following evaluations provide a comprehensive explanation of the present concept in form of the described implementations and embodiments of the semiconductor device 100 having properly adjusted junction gradient coefficients $m_1$ ($m_1$, $m_2$, . . . ) according to FIGS. 1a-1d. In particular, the following discussion with respect to FIGS. 4a-4j relates to the technical and mathematical analysis on the field of semiconductor devices, e.g., on the field of discrete ESD protection devices and TVS devices, respectively, by the applicant and to the technical findings and conclusions resulting therefrom for properly adjusting the junction gradient coefficients $m_i$ of the n pairs of pn-junction structures of the semiconductor device 100.

Under the assumption that the "capacitance versus voltage C(V) characteristics" of a pn-junction structure (or simply a pn-junction) is the main contributor to the generation of odd harmonics of the semiconductor device 100, the third harmonic generation can be essentially completely cancelled or at least strongly reduced in case of a proper adjustment of the C(V) characteristics of the individual pn-junction structures, which may comprise at least two pairs 102, 104 ( . . . ) of anti-serially connected pn-junction structures $J_1$, $J_2$, $J_3$, $J_4$ ( . . . ).

To be more specific, in case of a connection or stack of e.g., four anti-serially connected pn-junction structures $J_1$-$J_4$ (i.e., two pairs of pn-junction structures), the third harmonic generation can be cancelled or at least minimized by choosing a suitable combination of C(V) behavior of the different pn-junction structures $J_1$-$J_4$ in the four pn-junction stack, e.g., by suitably choosing the (first and second) n junction gradient coefficients $m_1$, $m_2$ according to the below indicated equations and formulas for the junction gradient coefficients $m_1$ and the parameters $a_1$, $a_2$, which depend on the zero bias capacitances $C_{Jo1}$, $C_{Jo2}$ and junction voltage $V_{J1}$, $V_{J2}$ of the two pairs 102, 104 of pn-junction structures.

The C(V) behavior of a pn-junction labelled with "i" in the present description to indicate the "i-th" type can generally be described with the following expression:

$$Ci(V) = \frac{c_{j0i}}{\left(\frac{V}{V_{ji}} + 1\right)^{m_i}}. \tag{A1}$$

In many cases this expression provides an accurate description of the C(V) characteristics of pn-junction structures. The parameters have the following meaning: $C_{jo}$ is the capacitance at 0V bias, $V_{ji}$ is the built-in voltage, and $_{mi}$ is the "junction grading coefficient". V represents the reverse bias across the i-th pn-junction. As can be appreciated from expression (A1), the junction grading coefficient $m_1$ is a key parameter to control the C(V) behavior of the pn-junction structure and thereby of the semiconductor device 100. $m_i$ can be adjusted by the doping profile of the respective pn-junction structure J1-J4 ( . . . ).

Some examples for the grading coefficient m are:

- m=0.5 represents the behavior (1.) of an abrupt pn-junction with uniform dopants (=doping concentrations) in the n- and the p-region, or (2.) of a one-sided junction with a very abrupt pn-junction between a highly-doped region and a uniform doped lower-doped region. It may be difficult or expensive to realize this kind of idealized junction with the conventional semiconductor technologies.
- m=0.33 represents the behavior of a linearly-graded junction. In this case the dopant concentration around the junction varies linearly with depth. This pn-junction type is very common with the conventional semiconductor technology as a result of diffusion of a p- and a n-doped region.
- In the case of m>0.5 the term hyper-abrupt junction is used. It can be considered as a one-sided junction where the lower doped region does not have a constant doping profile but rather a doping concentration that decreases with distance from the metallurgical junction.

In the following, the mathematical derivation of the optimum C(V) parameters to suppress $3^{rd}$ harmonics generation of the semiconductor device 100 is generally discussed. The below derivation may describe the C(V)-characteristics sufficiently well for low input powers $P_{in}$ of the input RF-signal, for instance not more than 20 dBm, but may be less accurate for higher input powers.

In the following equations (1) to (38) and in related FIGS. 4a to 4j, the radii $r_i$ correspond to the so far described parameters $a_i$ of the described ellipse equation, that is $r_i$=$a_i$. Generally inside this document the radii $r_i$ as described and/or depicted herein correspond to the parameters $a_i$ as described and/or depicted herein, that is $r_i$=$a_i$.

The capacitance vs. voltage behavior of 2 different pn-junctions is express by the following equations. These equations can be successfully used to describe the depletion capacitance behavior under reverse and small forward bias conditions of pn-junctions within a wide range of doping profiles.

$$C_1(V) = \frac{C_{J0,1}}{\left(\frac{V}{V_{J1}} + 1\right)^{m_1}} \tag{1}$$

$$C_2(V) = \frac{C_{J0,2}}{\left(\frac{V}{V_{J2}} + 1\right)^{m_2}} \tag{2}$$

where V is the applied reverse bias voltage, $C_{JO1}$ is the zero bias junction capacitance, $V_{ji}$ the junction voltage or junction potential (equal or closely related to the built-in voltage, sometimes referred to as "effective built-in voltage"), and $m_1$ the grading coefficient (also referred to as "diode power law exponent").

The capacitance voltage behavior equations can be expanded into a Taylor series:

$$C_1(V) = K_{10} + K_{11}V + K_{12}V^2 + \ldots \tag{3}$$

$$C_2(V) = K_{20} + K_{21}V + K_{22}V^2 + \ldots \tag{4}$$

By integration of the $C_1(v)$ expressions from 0 V to a certain voltage $V_{ij}$ the total charge $Q_{ij}$ is determined. In the case of a series connection of 2 pairs of anti-serial pn-junctions the following are to be applied to find the charge on each pn-junction, taking into account that in each junction pair one junction is reverse biased and one is forward biased.

$$Q_{11}(V_{11}) = \int_0^{V_{11}} C_1(V)dV \tag{5}$$

$$Q_{12}(V_{12}) = \int_0^{-V_{12}} C_1(V)dV \tag{6}$$

$$Q_{21}(V_{21}) = \int_0^{V_{21}} C_2(V)dV \tag{7}$$

$$Q_{22}(V_{22}) = -\int_0^{-V_{22}} C_2(V)dV. \tag{8}$$

Applying the integration of capacitance vs. voltage relation C(v) to the series expansions yields the following expressions:

$$Q_{11} = K_{10}V_{11} + \frac{K_{11}V_{11}^2}{2} + \frac{K_{12}V_{11}^3}{3} + \ldots \tag{9}$$

$$Q_{12} = K_{10}V_{12} - \frac{K_{11}V_{12}^2}{2} + \frac{K_{12}V_{12}^3}{3} + \ldots \tag{10}$$

$$Q_{21} = K_{20}V_{21} + \frac{K_{21}V_{21}^2}{2} + \frac{K_{22}V_{21}^3}{3} + \ldots \tag{11}$$

$$Q_{22} = K_{20}V_{22} - \frac{K_{21}V_{22}^2}{2} + \frac{K_{22}V_{22}^3}{3} + \ldots . \tag{12}$$

In a series connected configuration of capacitors the charge on all capacitors is equal:

$$Q_{11} = Q_{12} = Q_{21} = Q_{22} = Q \tag{13}.$$

By series reversion the charge as function of voltage (Equations 9-12) can be inverted into voltage as function of charge.

$$V_{11} = \frac{Q}{24K_{10}^7}\left[24K_{10}^6 + 12K_{10}^4K_{11}Q + \right. \tag{14}$$
$$\left. K_{10}^2Q^2(-8K_{10}K_{12} + 12K_{11}^2) + 5K_{11}Q^3(4K_{10}K_{12} - 3K_{11}^2)\right] + \ldots$$

$$V_{12} = \frac{Q}{24K_{10}^7}\left[24K_{10}^6 - 12K_{10}^4K_{11}Q + \right. \tag{15}$$
$$\left. K_{10}^2Q^2(-8K_{10}K_{12} + 12K_{11}^2) + 5K_{11}Q^3(-4K_{10}K_{12} + 3K_{11}^2)\right] + \ldots$$

The total V across the 2 pairs of anti-series connected pn-junction is $$V = V_{11} V_{12} + V_{21} + V_{22} \tag{18}$$

By summation of Equations 14-17 the total voltage V over the series connected pn-junctions as function of charge Q is:

$$V = 2\left(\frac{1}{K_{20}} + \frac{1}{K_{10}}\right)Q + \left(\frac{K_{11}^2}{K_{10}^5} + \frac{K_{21}^2}{K_{20}^5} - \frac{2K_{12}}{3K_{10}^4} - \frac{2K_{22}}{3K_{20}^4}\right)Q^3 + \ldots \tag{19}$$

By series reversion of Equation 19 the charge Q as function of the total voltage V across the series connected pn-junction follows as:

$$Q = \frac{K_{10} K_{20}}{2(K_{10} + K_{20})} V + \frac{K_{10}^5 (2K_{20} K_{22} - 3K_{21}^2) + K_{20}^5 (2K_{10} K_{12} - 3K_{11}^2)}{48 K_{10} K_{20} (K_{10} + K_{20})^4} V^3 + \ldots \tag{20}$$

The capacitance vs. voltage characteristics of the series connected junction can be calculated by differentiation of the Q(V) expression (Eq. 20).

$$C = \frac{dQ}{dV} \tag{21}$$

$$C = \frac{K_{10} K_{20}}{2(K_{10} + K_{20})} + \frac{K_{10}^5 (2K_{20} K_{22} - 3K_{21}^2) + K_{20}^5 (2K_{10} K_{12} - 3K_{11}^2)}{16 K_{10} K_{20} (K_{10} + K_{20})^4} V^2 + \ldots \tag{22}$$

We define the coefficients in this resulting series for the C(V) behavior as follows:

$$C = \kappa_0 + \kappa_1 V + \kappa_2 V^2 + \ldots \tag{23}$$

The coefficient of the quadratic term $\kappa_2 V^2$ determines the generation of the $3^{rd}$ harmonic. This coefficient $\kappa_2$ is:

$$\kappa_2 = \frac{K_{10}^5 (2K_{20} K_{22} - 3K_{21}^2) + K_{20}^5 (2K_{10} K_{12} - 3K_{11}^2)}{16 K_{10} K_{20} (K_{10} + K_{20})^4} \tag{24}$$

Now the coefficients $K_{10}$, $K_{11}$, $K_{12}$, $K_{20}$, $K_{21}$, $K_{22}$ of the series expansion of the individual pn-junctions are substituted by the respective Taylor Coefficients, that result from a Taylor expansion of the C(V) behavior (Equations 1 and 2). After this substitution the coefficient $K_2$ of the quadratic term becomes:

$$\kappa_2 = -\frac{1}{8\left(\frac{1}{C_{J0,1}} + \frac{1}{C_{J0,2}}\right)^4} \left[ \frac{1}{C_{J0,1}^3 V_{J1}^2} \left(m_1^2 - \frac{1}{2} m_1\right) + \frac{1}{C_{J0,2}^3 V_{J2}^2} \left(m_2^2 - \frac{1}{2} m_2\right) \right] \tag{25}$$

In a series expansion of the C(V) behavior the quadratic term is responsible for the generation of the third harmonics. If the quadratic term is zero the $3^{rd}$ harmonics will cancel out completely.

$$\kappa_2 = 0 \tag{26}$$

We can transform this expression Eq. 24 for $\kappa_2 = 0$ into the following form which describes an ellipse in the $m_1$, $m_2$ place:

$$\frac{(m_1 - m_{0,1})^2}{r_1^2} + \frac{(m_2 - m_{0,2})^2}{r_2^2} = 1 \tag{27}$$

where $(m_{0,1}, m_{0,2})$ is the center point of the ellipse and $r_1$ and $r_2$ are the radii in the $m_1$ and $m_2$ direction, respectively.

Equation 25 under the condition expressed by Equation 26 is transformed into the form of Equation 27 and thus yields:

$$\frac{\left(m_1 - \frac{1}{4}\right)^2}{\left(\frac{\sqrt{C_{J0,1}^3 V_{J1}^2 + C_{J0,2}^3 V_{J2}^2}}{4 C_{J0,2}^{\frac{3}{2}} V_{J2}}\right)^2} + \frac{\left(m_2 - \frac{1}{4}\right)^2}{\left(\frac{\sqrt{C_{J0,1}^3 V_{J1}^2 + C_{J0,2}^3 V_{J2}^2}}{4 C_{J0,1}^{\frac{3}{2}} V_{J1}}\right)^2} = 1 \tag{28}$$

from which we can conclude that the $3^{rd}$ harmonics generation is cancelled if the grading coefficients $m_1$ and $m_2$ are located on the ellipse, centered at (¼, ¼) with radii $r_1$ and $r_2$ as described by the following equations:

$$r_1 = \frac{1}{4} \sqrt{\left(\frac{C_{J0,1}}{C_{J0,2}}\right)^3 \left(\frac{V_{J1}}{V_{J2}}\right)^2 + 1} \tag{29}$$

$$r_2 = \frac{1}{4} \sqrt{\left(\frac{C_{J0,2}}{C_{J0,1}}\right)^3 \left(\frac{V_{J2}}{V_{J1}}\right)^2 + 1} \tag{30}$$

From Equations 29 and 30 we can conclude that the shape of the ellipse, on which the combinations of the grading coefficients $m_1$ and $m_2$ fall depends on the ratio of the zero bias capacitances and on the junction potentials of both junctions pairs. The zero bias capacitance can be varied over a wide range by adjusting the doping profile of the pn-junction and/or the physical design (layout) of the pn-junction. On the other hand is range of variation of the junction potential significantly smaller, because this parameter is related to the built-in voltage of the pn-junction. A usual range of variation of $V_j$ for a silicon pn-junction is from about 0.6 to 0.9V. In the case that a certain breakdown voltage needs to be provided by a pn-junction the possibility to influence $V_j$ is very limited and cannot be considered as a useful parameter for designing the device performance.

The FIGS. 4a-4j as described below show the influence of the device parameters, i.e., the zero bias junction capacitances $C_{Jo1}$, $C_{Jo2}$, and the junction voltage potentials $V_{J1}$, $V_{J2}$ on the relationship between the first to n-th (here: second) junction grading coefficients $m_1$ to $m_n$ (here: $m_1$ and $m_2$).

Figure 4A:
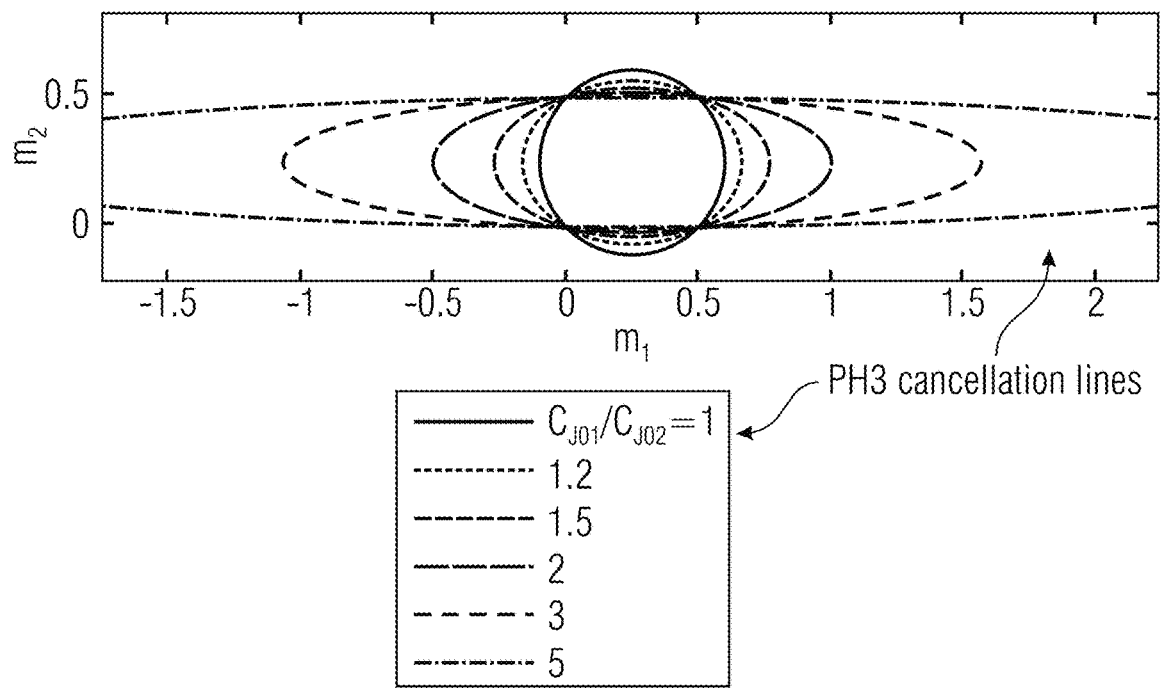
FIG. 4a shows the graphical representation (graph of function) of the cancellation lines of the third harmonic signal of the semiconductor device as a function of the first and second junction grading coefficients $m_1$, $m_2$ according to an embodiment.

FIG. 4a shows the graphical representation (graph of function) of the cancellation lines of the third harmonic signal PH3 of the semiconductor device 100 as a function of the first and second junction grading coefficients $m_1$, $m_2$ according to an embodiment.

Based on the above mathematical derivation of the optimum C(V) parameters, the ellipses of FIG. 4a, on which the combinations of the grading coefficients $m_1$, $m_2$ fall, indicate a cancellation of the third harmonic signal PH3 of the semiconductor device 100. Hence these ellipses are also called cancellation lines in the present context. The shape of the ellipses depends on the ratio of the zero bias capacitances $C_{Jo1}$, $C_{Jo2}$ and on the junction voltage potentials $V_{J1}$, $V_{J2}$ of both pairs 102, 104 of the pn-junction structures $J_1$-$J_4$ of the semiconductor device 100.

To be more specific, FIG. 4a shows the combinations of the junction grading coefficients $m_1$, $m_2$, where the third harmonics PH3 generated by the semiconductor device 100 (e.g., having two pairs 102, 104 of pn-junction structures $J_1$, $J_2$ and $J_3$, $J_3$) is zero or at least nearly zero, wherein the ratio of the zero bias capacitances $C_{Jo1}$, $C_{Jo2}$ determines the shape (=eccentricity) of the ellipse by determining the parameter $a_i$ and the parameter $a_2$ as indicated in above equations 29 and 30. As mentioned above, the parameters $a_i$ correspond to the radii $r_i$ of equations (1) to (31) above and to the radii $r_i$ as shown in FIGS. 4a to 4j, that is $r_i$=$a_i$. The other parameters, which have influence on the parameters $a_1$, $a_2$ of the ellipses, e.g., the first and second junction voltage potentials $V_{J1}$, $V_{J2}$, are set, for example, to equal values during calculation of the curves (functional graphs) of FIG. 4a.

Figure 4B:
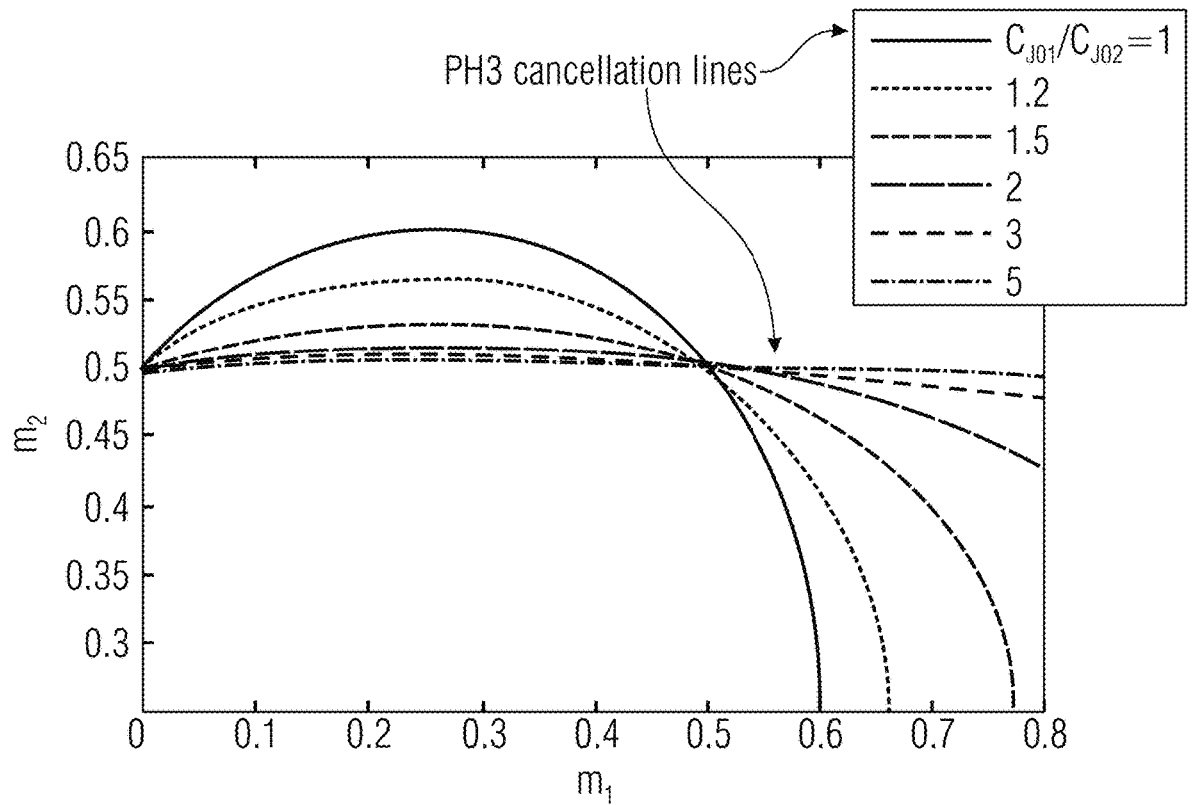

FIG. 4b shows a zoomed-in plot (view) of FIG. 4a. It can be seen from FIGS. 4a and 4b that all ellipses have crossing points for (1.) $m_1$=$m_2$=0; (2.) $m_1$=$m_2$=0.5; (3.) $m_1$=0 and $m_2$=0.5; and (4.) $m_1$=0.5 and $m_2$=0, i.e., for $m_i$ ∈{0.00,0, 50}.

Figure 4C:
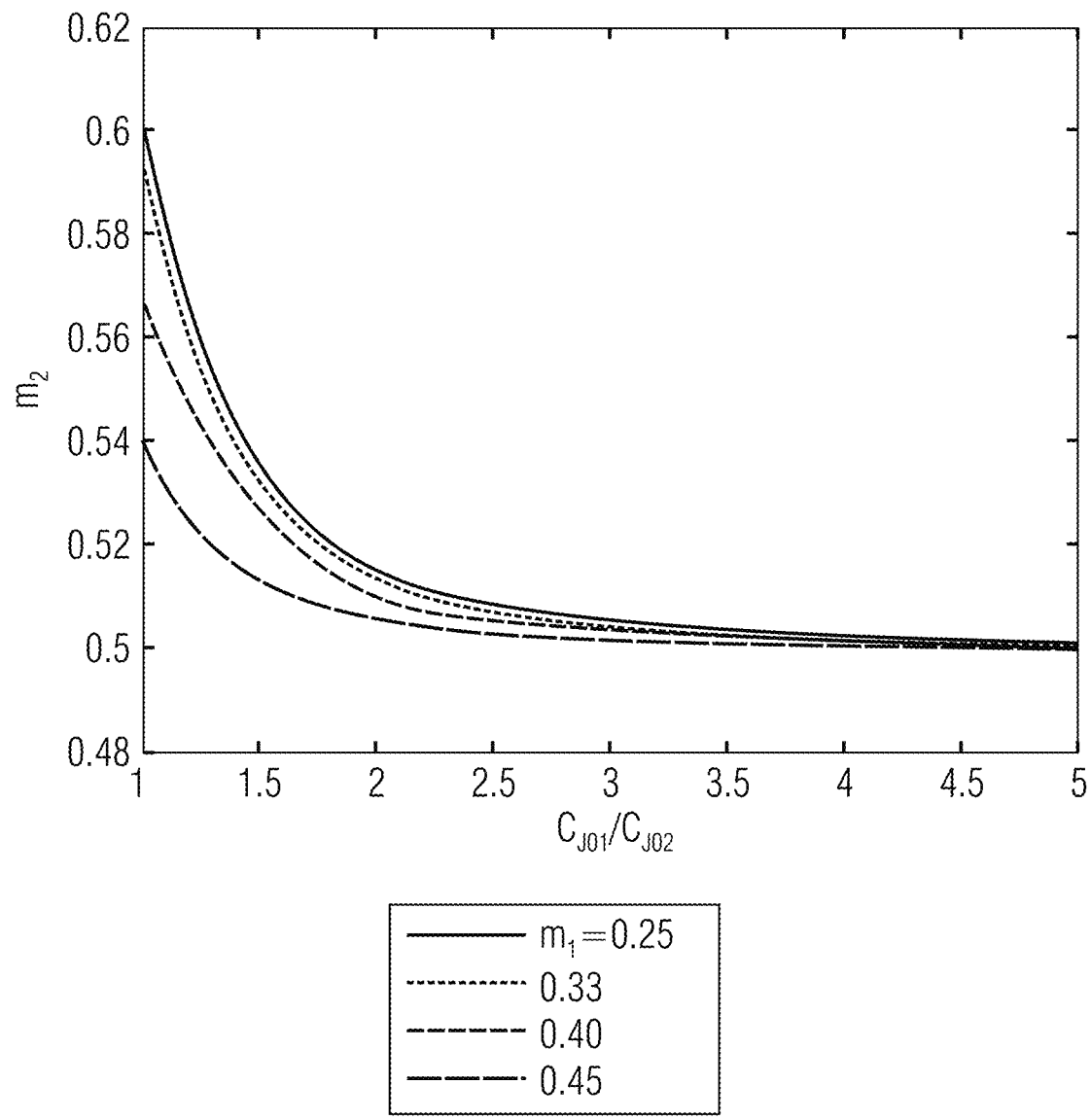
FIG. 4c shows a further graphical representation of the functional graphs for which the third harmonic generation PH3 of the semiconductor device may be optimally suppressed.

FIG. 4c shows a further graphical representation of the functional graphs for which the third harmonic generation PH3 of the semiconductor device 100 is theoretically completely suppressed. To be more specific, FIG. 4c shows the grading coefficient $m_2$ of the second pair 104 of pn-junction structures $J_3$, $J_4$ for which the third harmonic generation PH3 is completely suppressed, as a function of the ratio of the first and second zero bias capacitances $C_R$=$C_{Jo1}$/$C_{Jo2}$. The grading coefficient $m_1$ of the first pair 102 of pn-junction structures $J_1$, $J_2$ is a parameter of this plot (functional graph). During calculation of these curves of FIG. 4c, the first and second junction voltage potentials $V_{J1}$, $V_{J2}$ are set to equal values, with $V_R$=$V_{Jo1}$/$V_{Jo2}$=1.

Figure 4D:
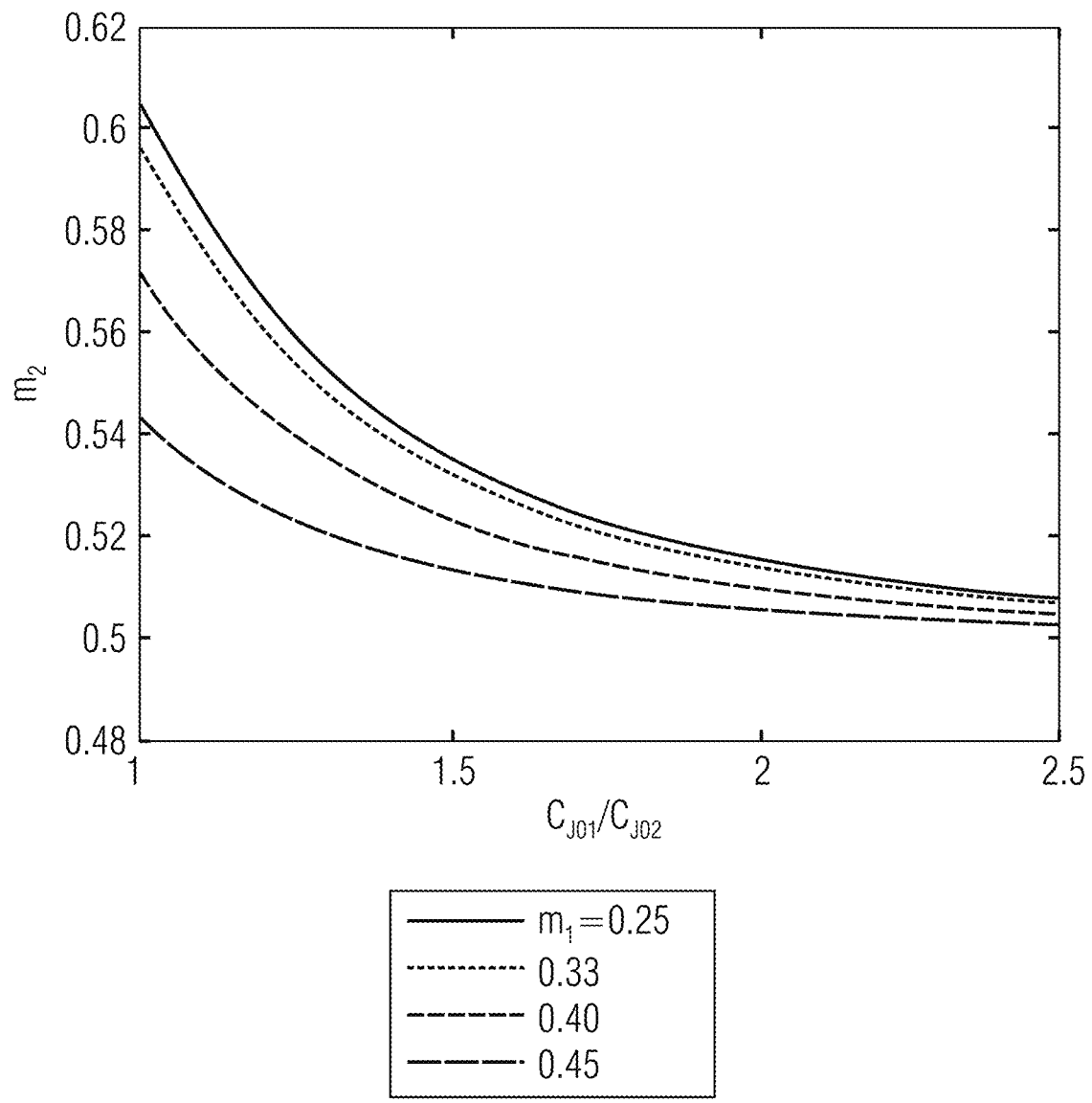
FIG. 4d shows a zoomed-in plot (view) of the graphical representation of FIG. 4c.

FIG. 4d shows a zoomed-in plot (view) of the graphical representation of FIG. 4c.

Figure 4E:
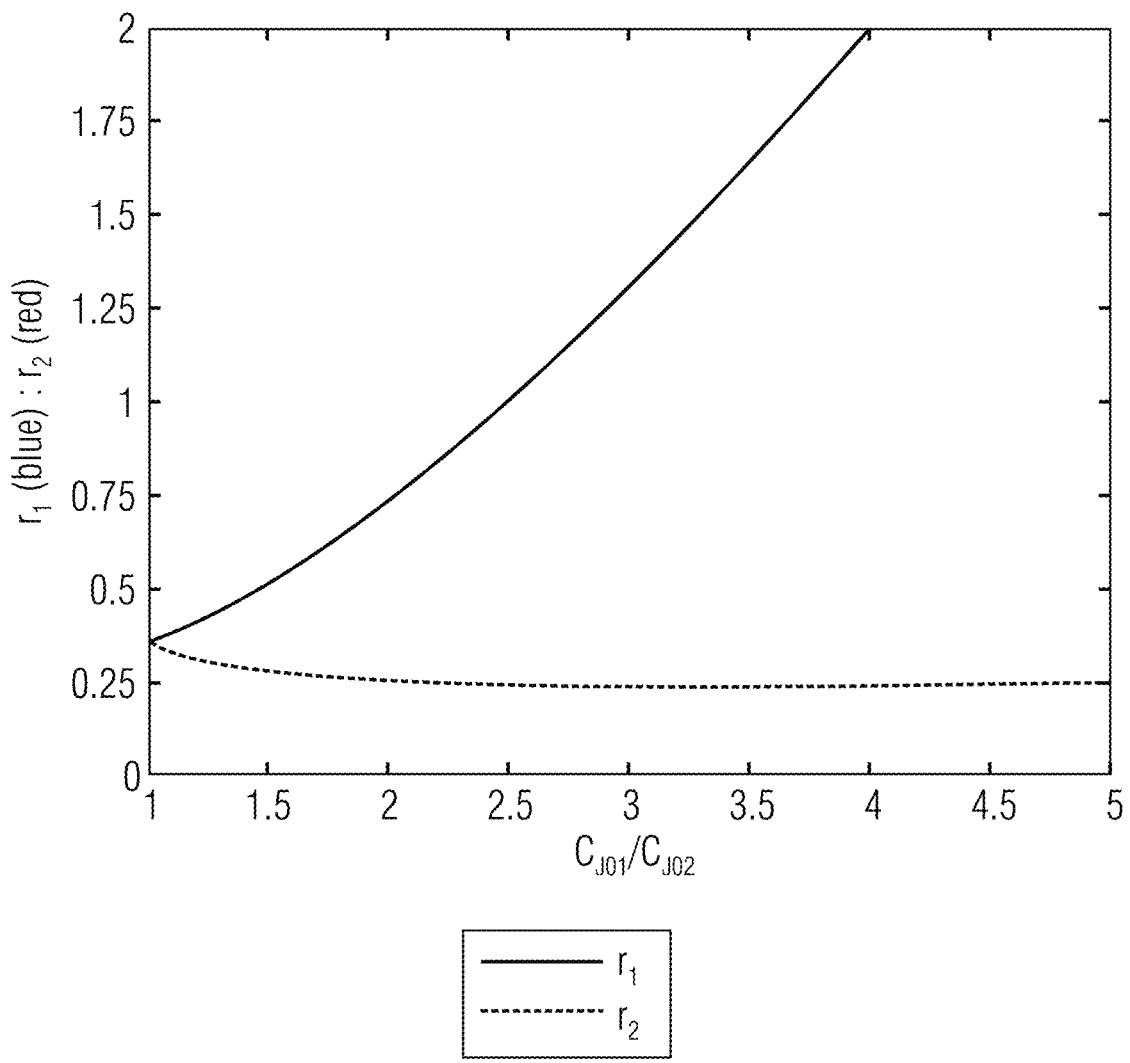
FIG. 4e shows a graphical representation of the parameters $a_1$, $a_2$ (=radii $r_1$, $r_2$) of the ellipse at which the third harmonics PH3 generation of the semiconductor device 100 may be optimally suppressed.

FIG. 4e shows a graphical representation of the parameters $a_1$, $a_2$ (radii $r_1$, $r_2$) of the ellipse at which the third harmonics PH3 generation of the semiconductor device 100 is, at least theoretically, completely suppressed, as a function of the ratio $C_R$ of the first and second zero bias capacitances $C_{Jo1}$/$C_{Jo2}$. During calculation of these curves, the first and second junction voltage potential $V_{J1}$, $V_{J2}$ are set to equal values, with $V_R$=$V_{Jo1}$/$V_{Jo2}$=1.

The relatively large dependency of the first parameter $a_i$ (first radius $r_1$) of the ellipse from the ratio $C_R$ of the first and second bias capacitances $C_{Jo1}$/$C_{Jo2}$ reflects the increasing eccentricity of the ellipse as shown in FIG. 4a with respect to the increasing ratio $C_R$ of the first and second zero bias capacitances $C_R$=$C_{Jo1}$/$C_{Jo2}$.

Figure 4F:
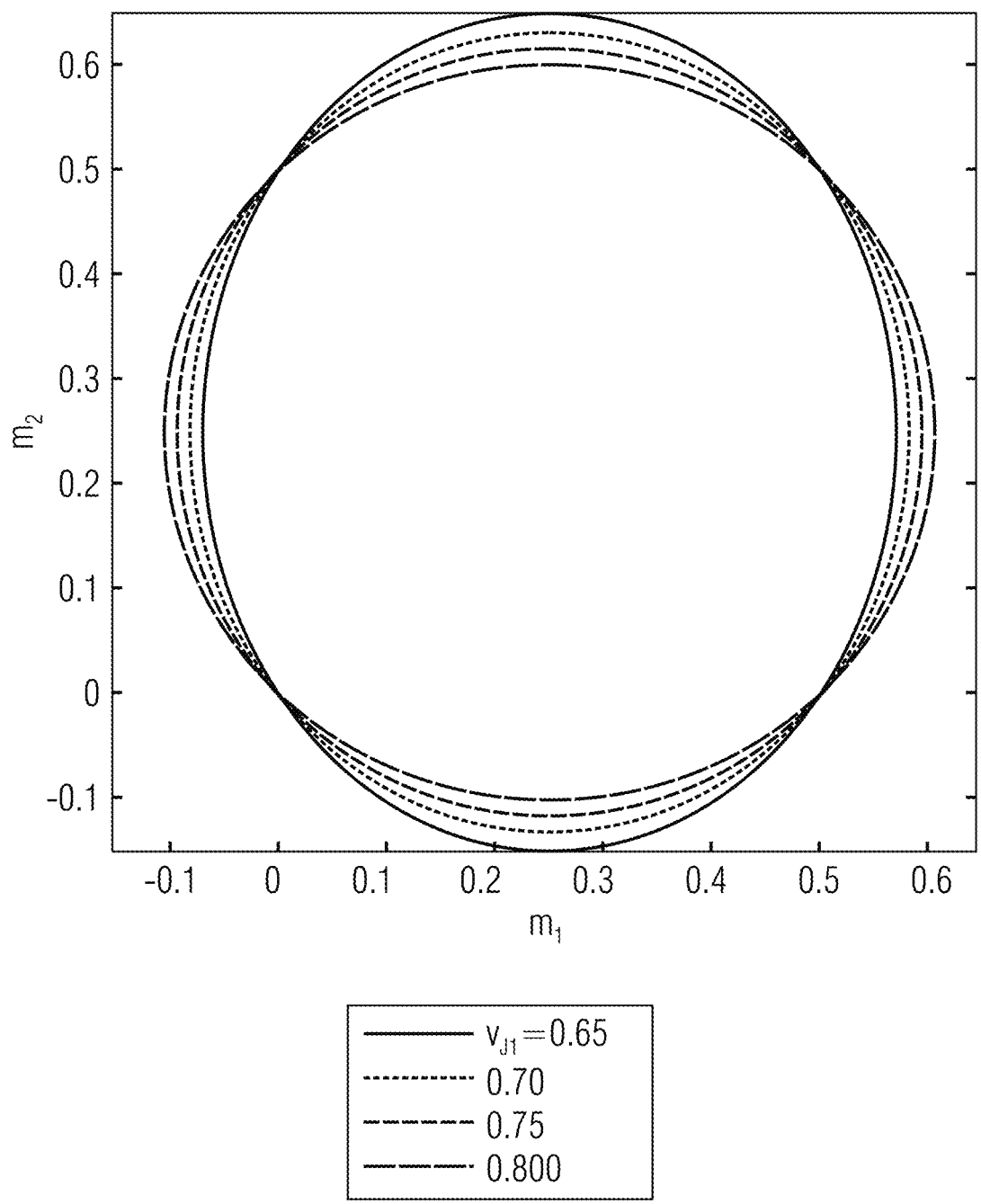
FIG. 4f shows a graphical representation of the cancellation lines of the third harmonic PH3 of the semiconductor device as a function of the first and second junction grading coefficients $m_1$, $m_2$ in view of the influence of non-equal values for the first and second junction voltage potentials $V_{J1}$, $V_{J2}$.
Figure 4G:
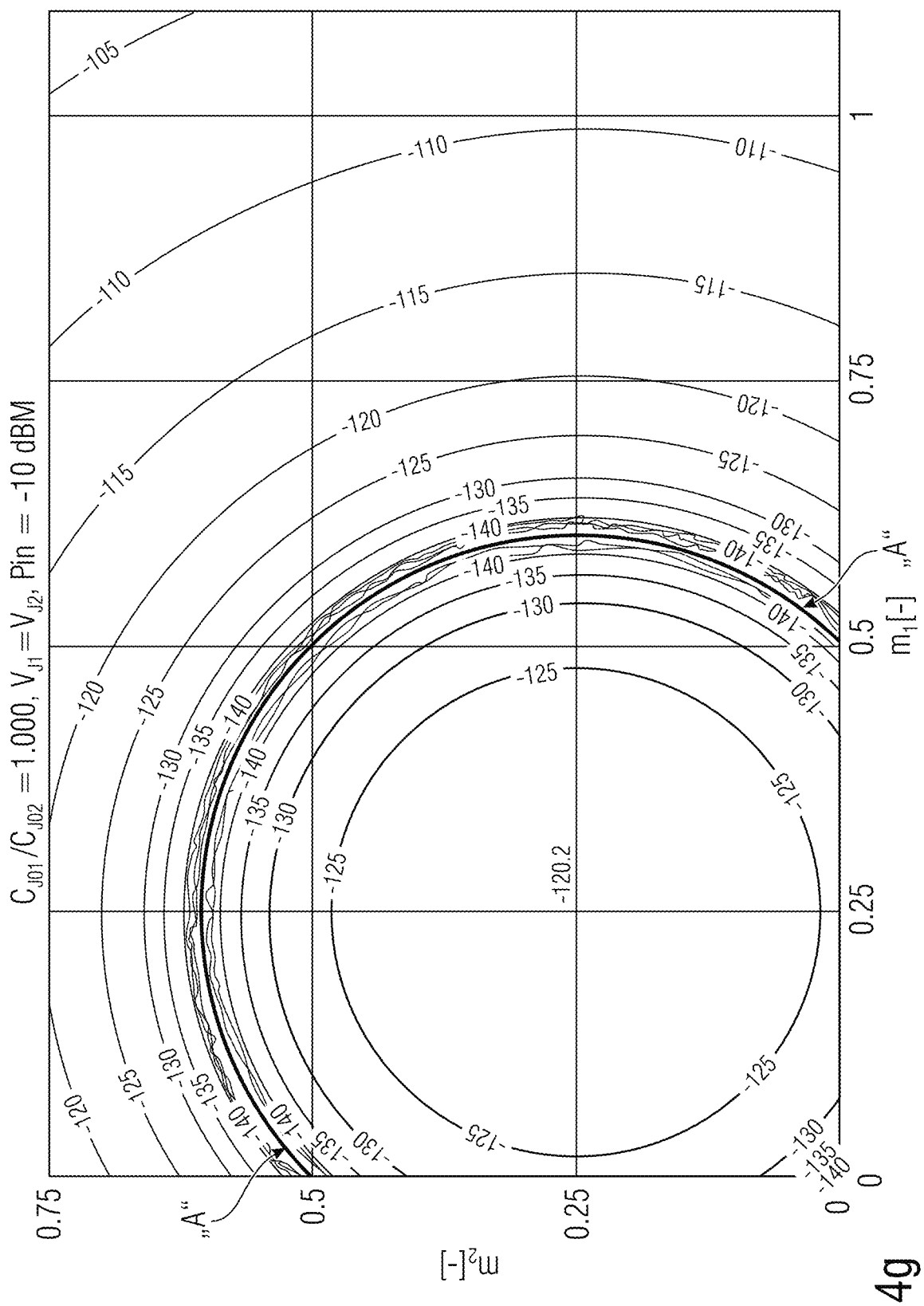
FIGS. 4g-4j show the simulated spurious third harmonic PH3 of the semiconductor device with equal first and second bias junction capacitances $C_{J01} = C_{J02}$ at different input power levels of the fundamental frequency signal.

FIG. 4f shows a graphical representation of the cancellation lines of the third harmonic PH3 of the semiconductor device 100 as a function of the first and second junction grading coefficients $m_1$, $m_2$ in view of the influence of non-equal values for the first and second junction voltage potentials $V_{J1}$, $V_{J2}$, i.e., for $V_R$=$V_{Jo1}$/$V_{Jo2}$*1. To be more specific, FIG. 4f shows the influence of non-equal values for the first and second junction voltage potential $V_{J1}$, $V_{J2}$ on the combinations of the grading coefficients $m_1$, $m_2$ that lead to a complete suppression of the third harmonics PH3 generation of the semiconductor device 100. In the case of FIG. 4f, the first and second zero bias capacitances $C_{Jo1}$, $C_{Jo2}$ are set to equal values, with $C_{Jo1}$=$C_{Jo2}$. The junction voltage potential $V_{J2}$ of the second pair 104 of pn-junction structures $J_3$, $J_4$ is set to a fixed value $V_{J2}$=0.8.

Figure 4H:
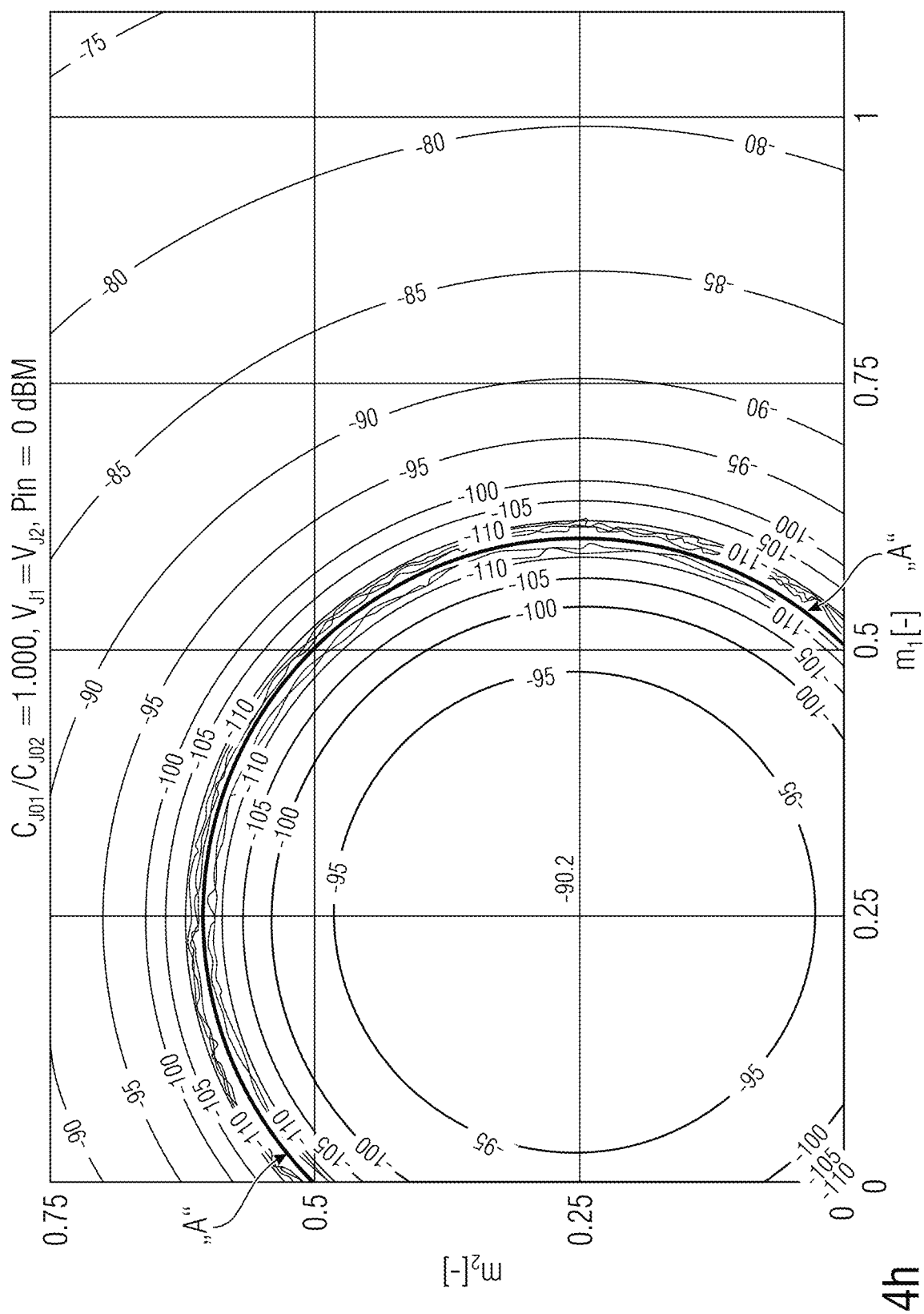
Figure 4I:
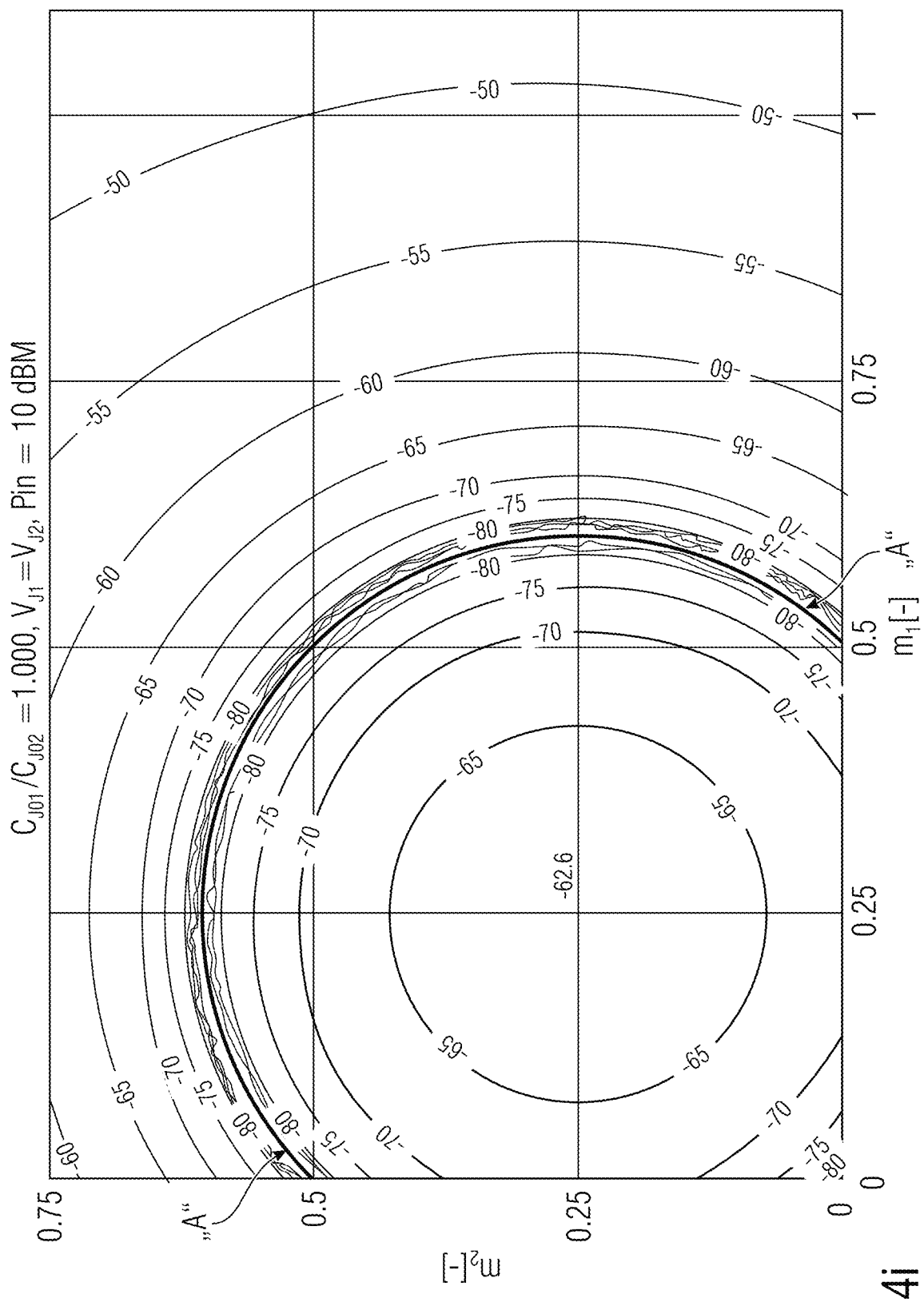

FIGS. 4g-4j show graphical representations of the respective power levels PH3 of the third harmonic for the semiconductor device 100 as a function of the first and second junction grading coefficients $m_1$, $m_2$ as a result of simulation using for instance the method as explained above with reference to FIGS. 2 and 3. Also shown in FIGS. 4g-4j is the theoretical cancellation line (=the trajectory of the theoretical optimum suppression of the third harmonics PH3 for low input power levels $P_{IN}$). To be more specific, FIGS. 4g-4j show the simulated spurious third harmonic PH3 of the semiconductor device 100 with equal first and second zero bias junction capacitances $C_{Jo1}$=$C_{Jo2}$ at different input power levels $P_{IN}$ (FIG. 4g $P_{IN}$=−10 dBm; FIG. 4h $P_{IN}$=0 dBm; and FIG. 4i $P_{IN}$=+10 dBm) of the fundamental frequency RF signal (e.g., using the circuit simulation tool described above). The trajectory of the theoretical optimum of PH3 suppression according to the derivation described above (also called the cancellation line herein) is represented by the curve "A" ("gray" curve). At lower input power levels $P_{IN}$, the minimum third harmonic PH3 of the circuit simulation and the theoretical derivation (curve "A") are matching very closely, wherein for increasing input power levels $P_{IN}$, the deviation of the minimum third harmonic PH3 resulting from the circuit simulation and from the theoretical optimum suppression (curve "A") becomes somewhat more pronounced, but remains moderate for the studied input powers and up to 20 dBm.

It is to be noted that the ragged features of the isolines in FIGS. 4g-4j and even the appearance of disconnected isoline regions near the cancellation line in the contour plots is due to the algorithm used to generate the contour plots from a simulation data set in which the simulation data is only present for a finite number of simulated $m_1$, $m_2$ combinations which are located on a regular rectangular mesh.

Figure 4J:
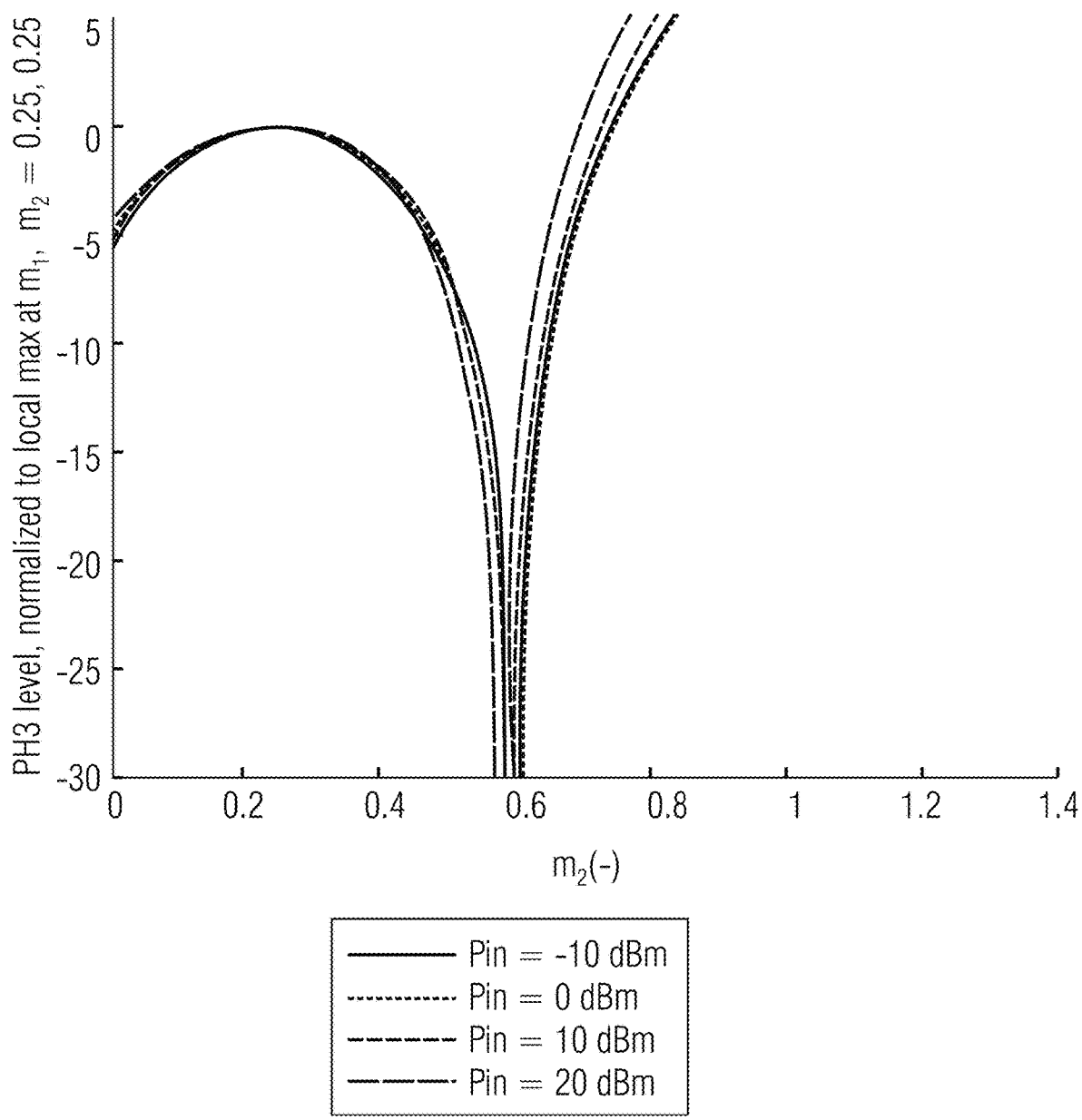

The change of the optimal junction grading coefficient with input power can be seen also from FIG. 4j which shows the simulated PH3 power level as a function of the junction grading coefficient $m_2$ for different input powers $P_{IN}$ (−10 dBm, 0 dBm, 10 dBm and 20 dBm). The junction grading coefficient $m_1$ is kept fixed at $m_1$=0.25, wherein further $C_{Jo1}$=$C_{Jo2}$ is set. The power levels are normalized to the local maximum at $m_1$=$m_2$=0.25 (reference case) to better compare the results. Therefrom, it can be appreciated that suppression of the generation of the spurious third harmonics can be optimized for an expected predetermined input power level. To this end, it may also be possible to purposefully deviate from the curve "A", which is analytically derived for small input power levels $P_{IN}$, and to arrange the pn-junction structures with respective junction grading coefficients designed to suppress the generation of the spurious third harmonics with respect to the reference case by a desired amount for a predetermined input level $P_{IN}$ using results from the above described simulation by the circuit simulation tool.

Moreover, it may only be necessary to reproduce the optimal junction grading coefficients up to a certain accuracy depending on the desired level of suppression. For instance if the power level of the spurious third harmonics is to be suppressed by 10 dB relative to the reference case, a deviation of ±0.05 for the junction grading coefficients $m_2$ may be acceptable. To achieve higher level of suppression, a smaller deviation of ±0.03 or even ±0.02 may be desirable. Similar considerations hold for the junction grading coefficient $m_1$ or generally speaking $m_i$.

The relationship between the simulated PH3 values and the optimal value (curve "A") is also valid for unequal zero-bias capacitances $C_{Jo,1}$, $C_{Jo,2}$, which lead to an increasing eccentricity of the ellipses, as described with respect to FIG. 4a.

In the following, the mathematical derivation of the optimum C(V) parameters to suppress $3^{rd}$ harmonics generation is extended to three (n=3) pairs 102, 104, 106 of anti-serially connected pn-junction structures $J_1$, $J_2$ and $J_3$, $J_4$ and $J_5$, $J_6$ and further generalized to n pairs.

By using the same steps described above we can determine the conditions under which the $3^{rd}$ harmonics generation is cancelled for 3 pair of anti-serial connected pn-junctions. In this case the quadratic coefficient of series expansion of the C(V) behavior follow as:

$$\kappa_2 = -\frac{1}{8\left(\frac{1}{C_{J0,3}} + \frac{1}{C_{J0,2}} + \frac{1}{C_{J0,1}}\right)^4}\left[\frac{1}{C_{J0,1}^3 V_{J1}^2}\left(m_1^2 - \frac{1}{2}m_1\right) + \frac{1}{C_{J0,2}^3 V_{J2}^2}\left(m_2^2 - \frac{1}{2}m_2\right) + \frac{1}{C_{J0,3}^3 V_{J3}^2}\left(m_3^2 - \frac{1}{2}m_3\right)\right] \quad (31)$$
$$= 0$$

which can be further simplified in:

$$\frac{1}{C_{J0,1}^3 V_{J1}^2}\left(m_1 - \frac{1}{4}\right)^2 + \frac{1}{C_{J0,2}^3 V_{J2}^2}\left(m_2 - \frac{1}{4}\right)^2 + \frac{1}{C_{J0,3}^3 V_{J3}^2}\left(m_3 - \frac{1}{4}\right)^2 = \frac{1}{16}\left(\frac{1}{C_{J0,1}^3 V_{J1}^2} + \frac{1}{C_{J0,2}^3 V_{J2}^2} + \frac{1}{C_{J0,3}^3 V_{J3}^2} + \right) \quad (32)$$

This is a 3 dimensional ellipsoid with the following generic form:

$$\frac{(m_1 - m_{0,1})^2}{r_1^2} + \frac{(m_2 - m_{0,2})^2}{r_2^2} + \frac{(m_3 - m_{0,3})^2}{r_3^2} = 1 \quad (33)$$

with the center point $m_{0,i} = 1/4$ for $i \in \{1, \ldots, n\}$ and radii $$r_1 = \frac{1}{4}\sqrt{\left(\frac{C_{J0,1}}{C_{J0,2}}\right)^3\left(\frac{V_{J1}}{V_{J2}}\right)^2 + \left(\frac{C_{J0,1}}{C_{J0,3}}\right)^3\left(\frac{V_{J1}}{V_{J3}}\right)^2 + 1} \quad (34)$$

$$r_2 = \frac{1}{4}\sqrt{\left(\frac{C_{J0,2}}{C_{J0,1}}\right)^3\left(\frac{V_{J2}}{V_{J1}}\right)^2 + \left(\frac{C_{J0,2}}{C_{J0,3}}\right)^3\left(\frac{V_{J2}}{V_{J3}}\right)^2 + 1} \quad (35)$$

$$r_3 = \frac{1}{4}\sqrt{\left(\frac{C_{J0,3}}{C_{J0,1}}\right)^3\left(\frac{V_{J3}}{V_{J1}}\right)^2 + \left(\frac{C_{J0,3}}{C_{J0,2}}\right)^3\left(\frac{V_{J3}}{V_{J2}}\right)^2 + 1} \quad (36)$$

Generalization for n pn-junction pairs: all combinations of $m_1$ with $i \in \{1, \ldots, n\}$ which lay on the following n-dimensional ellipsoid lead to a cancellation of the $3^{rd}$ harmonics $$\sum_{i=1}^{n}\left(\frac{m_i - \frac{1}{4}}{r_i}\right)^2 = 1 \quad (37)$$

where the radii of the ellipsoid $r_1$ with $i \in \{1, n\}$ are defined as $$r_i = \frac{1}{4}\sqrt{\sum_{j=1}^{n}\left(\frac{C_{J0,i}}{C_{J0,j}}\right)^3\left(\frac{V_{Ji}}{V_{Jj}}\right)^2}. \quad (38)$$

In the following, different aspects of the present concept of the semiconductor device 100 as derivable from the above evaluations are described in detail, wherein the semiconductor device 100 has n (at least two) pairs 102, 104 ( . . . ) of anti-serially connected pn-junction structures $J_1$, $J_2$, $J_3$, $J_4$ ( . . . ) with adjusted junction grading coefficients $m_1$-$m_n$ for providing an at least reduced or a minimum generation of a spurious odd harmonics, e.g., third harmonics for a predetermined input power level $P_{IN}$.

As derivable from the above evaluations for the semiconductor device 100 with n pairs 102, 104 ( . . . ) of anti-serially connected pn-junction structures $J_1$, $J_2$ and $J_3$, $J_4$ ( . . . ) with adjusted junction grading coefficients $m_1$-$m_n$, each of the first to n-th parameter "$a_1$ to $a_n$" is based on the n zero bias capacitances $C_{Jo,1}$-$C_{Jo,n}$ and on the n junction voltage potentials $V_{J1}$-$V_{Jn}$ of the n pairs of pn-junction structures.

As derivable from the above evaluations for the semiconductor device 100, the first to n-th parameter "$a_1$ to $a_n$" comply with the following equation:

$$a_i = \frac{1}{4}\sqrt{\sum_{j=1}^{n}\left(\frac{C_{J0,i}}{C_{J0,j}}\right)^3\left(\frac{V_{Ji}}{V_{Jj}}\right)^2}$$

Based on the above evaluations for the semiconductor device 100 and referring to FIGS. 4g-4j, the simulated graphical representations of the respective power levels PH3 of the third harmonic for the semiconductor device 100 as a function of the first and second junction grading coefficients $m_1$, $m_2$ and the theoretical cancellation line show, together with the general derivation above, that the values for the first to "n-th" junction grading coefficients $m_1$ to $m_n$ can be adjusted to result in a third-order intercept point IP3 of at least 50 dBm, 55 dBm, or even 60 dBm. For instance, a third-order intercept point IP3 of 50 dBm corresponds to PH3 power level of −70 dBm at 10 dBm input power. Therein one of the junction grading coefficients, for instance $m_2$, can be adjusted to $m_2 < 0.50$, preferably to $m_2 \leq 0.48$ the latter being advantageous from the point of manufacturing, as mentioned also above.

According to an embodiment of the semiconductor device 100, at least two of the first to n-th junction grading coefficient $m_1$ to $m_n$ are different. To be more specific, the "n" pairs of pn-junctions comprise at least a first pair 102 having a first type pn-junction with grading coefficient $m_1$ and a second pair 104 having a second type pn-junction with grading coefficient $m_2$.

According to an embodiment of the semiconductor device 100, for $C_{jo1} = C_{jo2}$, and $V_{j1} = V_{j2}$ the first type pn-junction structures $J_1$, $J_2$ are arranged to comprise a first junction grading coefficient $m_1 = 0.59 \pm 0.03$, and wherein the second type pn-junction structures $J_3$, $J_4$ are arranged to have a second junction grading coefficient $m_2$, with $m_2 = 0.33 \pm 0.10$. The latter may represent a nearly linearly graded junction.

Based on the above evaluations for some embodiments of the semiconductor device 100, with $i \in \{1, 2\}$, the parameters $a_1$ and $a_2$ (=radii $r_1$, $r_2$) of the ellipse equation comply with the following equations:

$$a_1 = \frac{1}{4}\sqrt{\left(\frac{C_{J0,1}}{C_{J0,2}}\right)^3 \left(\frac{V_{J1}}{V_{J2}}\right)^2 + 1}; \text{ and}$$

$$a_2 = \frac{1}{4}\sqrt{\left(\frac{C_{J0,2}}{C_{J0,1}}\right)^3 \left(\frac{V_{J2}}{V_{J1}}\right)^2 + 1}.$$

According to a further embodiment, the pn-junction structures $J_1$, $J_2$ and $J_3$, $J_4$ of the first and the second type/pair 102, 104 are arranged to have a ratio of the zero bias capacitances $C_{J0\text{-}1}$, $C_{J0\text{-}2}$ which complies with the following condition:

$$1\frac{1}{4} < \frac{C_{J0,1}}{C_{J0,2}} < 4.$$

According to a further embodiment, the pn-junction structure of the i-th type forms an i-th type diode structure with an anode region and a cathode region. Further, the semiconductor device 100 may comprise a first connecting terminal 107 and a second connecting terminal 108, wherein the "n" pairs 102, 104 ( . . . ) of pn-junction structures $J_1$-$J_4$ ( . . . ) are connected between the first and second terminal 107, 108.

According to a further embodiment, the "n" pairs 102, 104 ( . . . ) of pn-junction structures $J_1$-$J_4$ ( . . . ) are arranged in a stacked configuration in a semiconductor substrate. According to a further embodiment, differently doped semiconductor regions of the pn-junction structures extend vertically with respect to a main surface region of the semiconductor substrate into the semiconductor substrate, and wherein the main portion of the area of the metallurgical pn-junction is a planar pn-junction which extend in parallel to a main surface region of the semiconductor substrate. According to a further embodiment, the two pn-junction structures of i-th pair may be arranged together in a stacked configuration in the semiconductor substrate. According to a further embodiment, one of the two pn-junction structures of the first pair may be arranged in a stacked configuration in the semiconductor substrate with one of the two pn-junction structures of the second pair. According to a further embodiment, the stacked configuration may comprise a pn-structure with a floating base region in the semiconductor substrate.

Figure 5A:
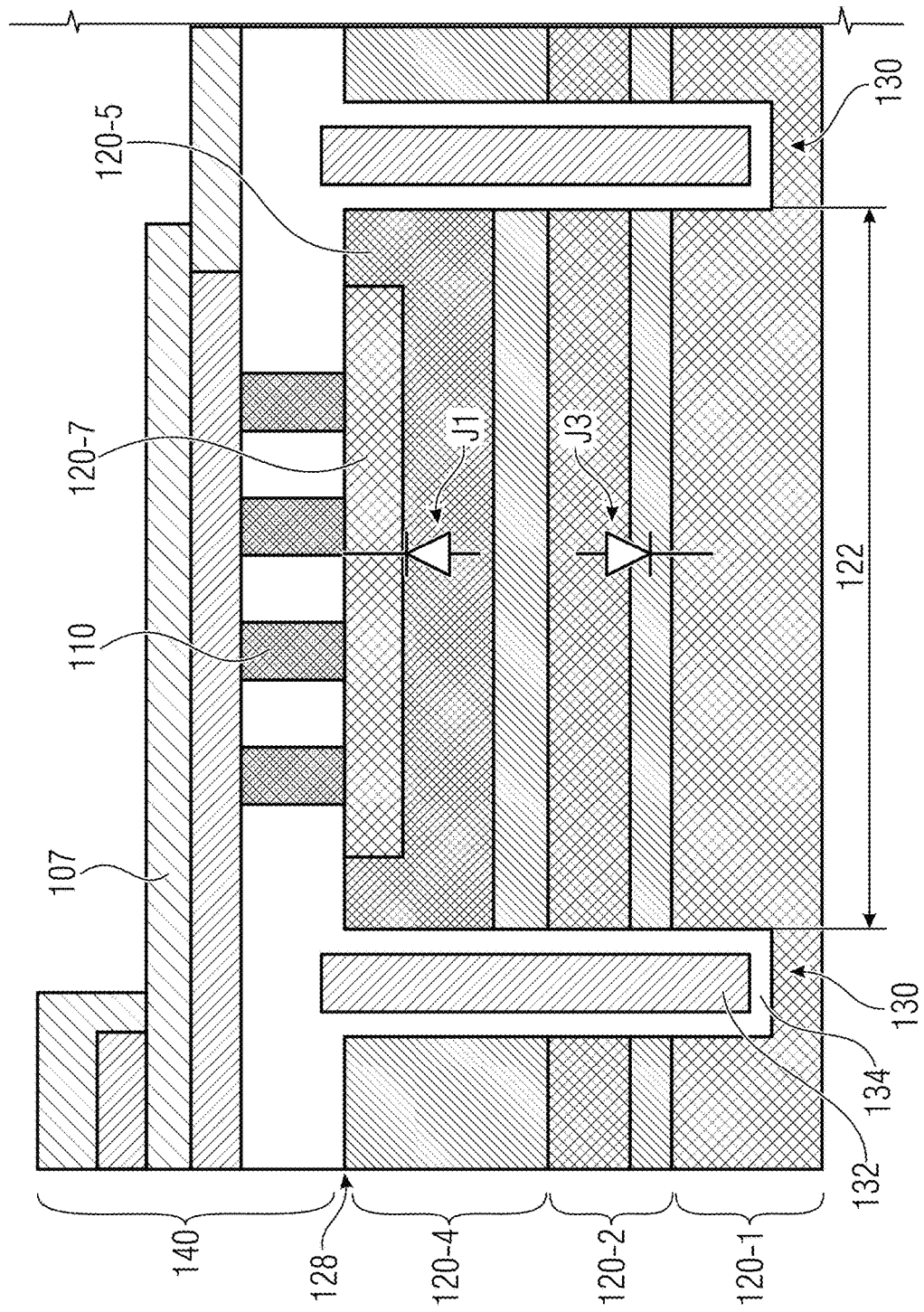
Figure 5B:
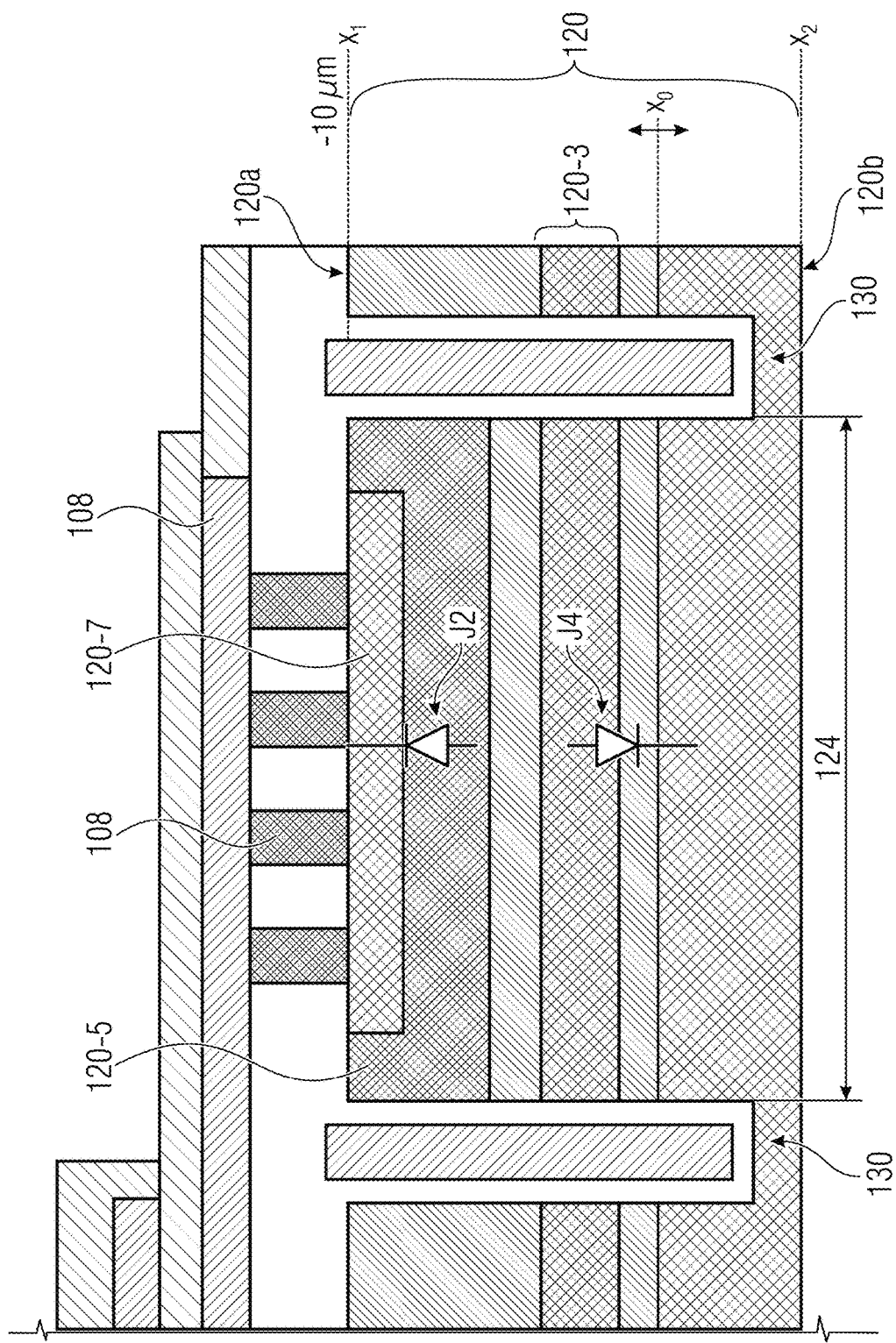

FIGS. 5a and 5b show a schematic cross-sectional view of the semiconductor device 100 according to an embodiment having, for example, the four anti-serially connected pn-junction structures $J_1$, $J_2$, $J_3$, $J_4$ according to an embodiment (see e.g., FIG. 1a), wherein the first stack or pair 102 comprises the pn-junction structures $J_1$, $J_2$ of the first type (i=1), and wherein the second stack or pair 104 comprises the pn-junction structures $J_3$, $J_4$ of the second type (i=2).

As shown in FIGS. 5a and 5b, the semiconductor device 100 comprises the semiconductor substrate 120 having a first main surface portion 120a and a second main surface portion 120b on opposing main sides of the semiconductor substrate 120.

The following exemplary description of the different layers and regions of the semiconductor substrate 120 essentially extends from the second main surface portion 120b to the first main surface portion 120 of the semiconductor substrate 120. The different regions and structures in the semiconductor substrate 120 may be manufactured, for example, during the so-called front end of line (FEOL) process stage.

The semiconductor substrate 120 may comprise a low ohmic n-type substrate 120-1. A p-type semiconductor layer 120-2 is arranged on the n-type substrate 120-1. The p-type semiconductor layer 120-2 (e.g., p-epi layer 120-2) may be epitaxially applied on the n-type substrate 120-1. The p-type semiconductor layer 120-2 comprises a buried p-type semiconductor layer 120-3 (P buried layer 120-3). The buried p-type semiconductor layer 120-3 may be formed e.g., in form of a blanket (unmasked) implantation of a p-type dopant in the semiconductor layer 120-2.

A further p-type layer 120-4 (e.g., p-epi layer 120-4) is arranged on the p-type layer 120-2 with the buried p-type layer 120-3. The p-type semiconductor layer 120-4 may be epitaxially applied on the p-type layer 120-2. Alternatively, layer 120-4 may also be realized by an i-type (i.e., intrinsic or not intentionally doped) layer.

In the second epitaxial layer 120-4, a p-type well region 120-5 (p-well 120-5) may be arranged. The p-type well region 120-5 may be formed after having conducted a LOCOS oxidation of the main surface area 120a of the p-type layer 120-4 of the semiconductor substrate 120 and by conducting a blanket implantation step. Based on this approach, no lithographical resist mask would be necessary on the surface area 120a of the p-type layer 120-4, but a self-aligned implantation process could be conducted due to the LOCOS oxidation on the surface 120a. A LOCOS process (LOCOS=LOCal OXidation of Silicon) is a microfabrication process where silicon dioxide is formed in selected areas on a silicon wafer, i.e., the semiconductor substrate 120, having the $S_i$-$S_iO_2$ interface at a lower point or plane than the rest of the silicon main surface area 120a. Of course p-well 102-5 may also be formed by employing lithography method generally known in the art.

As shown in FIGS. 5a and 5b, the pn-junction structures $J_1$, $J_3$ and the pn-junction structures $J_2$, $J_4$ may be arranged in separated semiconductor areas 122, 124 of the semiconductor substrate 120, wherein the separated areas 122, 124 may be achieved by means of so-called deep isolation trenches 130 which laterally confine and/or laterally surround the semiconductor regions 122, 124 with the pn-junction structures $J_1$, $J_3$ and $J_2$, $J_4$. The deep isolation trenches 130 may be formed for example by means of RIE process steps (RIE=reactive ion etching) in the semiconductor substrate 120, wherein the achieved trenches may be lined with an oxide material 134, e.g., a $SiO_2$ liner, by means of a trench liner oxidation process and filled by means of a semiconductor material 132, e.g., poly-silicon.

The semiconductor device 100 further comprises highly doped n-type contact regions 120-7 in the form of implantation regions adjacent to the surface area of the p-type well 120-5. N-type contact region 120-7 may also be regarded simply as a shallow n-region 120-7 or as an emitter region in some embodiments. The n-type contact regions 120-7 may be formed by means of an n-contact implantation process step, e.g., by means of a blanket implantation, which may be self-aligned by means of the (above described) LOCOS process so that no lithographical resist mask is necessary.

As a further (e.g., final) process step of the front end of line process for processing the semiconductor substrate 120, an oxide material 128 may be deposited on the first main surface area 120a of the semiconductor substrate 120. The semiconductor device 100 may further comprise a contact and metallization layer stack 140 (BEOL stack, BEOL=back end of line) on the first main surface area 120a of the semiconductor substrate 120 for providing interconnections 110 (for example contact plugs or vias) and interconnect layers 107, 108 for the semiconductor device(s) 100 and, optionally, for further circuit elements (not shown in FIGS.

5a and 5b) in the semiconductor substrate 120. The contact structures and (structured) metallization layers of the metallization stack 140 may be formed by means of BEOL process steps. Finally, the semiconductor devices 100 may be packaged and separated (diced), if a plurality of semiconductor devices 100 are fabricated in the semiconductor substrate 120, such as a semiconductor wafer 120. For example, a chip scale packaging process comprising, for instance, the formation of electrodes (or pads) as the top layer of the metallization stack 140 and a dicing process.

As shown in FIGS. 5a and 5b, the n-type contact region 120-7 (=cathode region) and the p-type well region 120-5 (=anode region) form the first type pn-junction structure $J_1$ and $J_2$, respectively, in the different semiconductor substrate areas 122 and 124. Moreover, the buried p-type layer 120-3 (=anode region) and the n-type substrate 121 (=cathode region) form the second type pn-junction structures $J_3$ and $J_4$, respectively, in the separated semiconductor regions 122, 124 of the semiconductor substrate 120.

FIG. 5b shows a schematic calculated plot of an exemplary doping profile of the semiconductor device 100 of FIGS. 5a and 5b, wherein different doping concentrations in the p-type well 120-5 may be achieved by different implantation doses, which are indicated with "36" to "42". The plot of FIG. 5c further contains an exemplary indication of the approximate extension of the different layers and/or regions of the of the semiconductor substrate 120 of FIGS. 5a and 5b. The metallurgical junction between n-type region 120-7 and p-type region 120-5 falls in the declining slope of the p-type implantation profile of region 120-5. With a sufficiently steep slope of the n-type implantation of n-type region 120-7, the C(V) properties of the pn-junction formed by regions 120-5 and 120-7 may represent hyper-abrupt character and thus may have a grading coefficient>0.5.

Figure 6A:
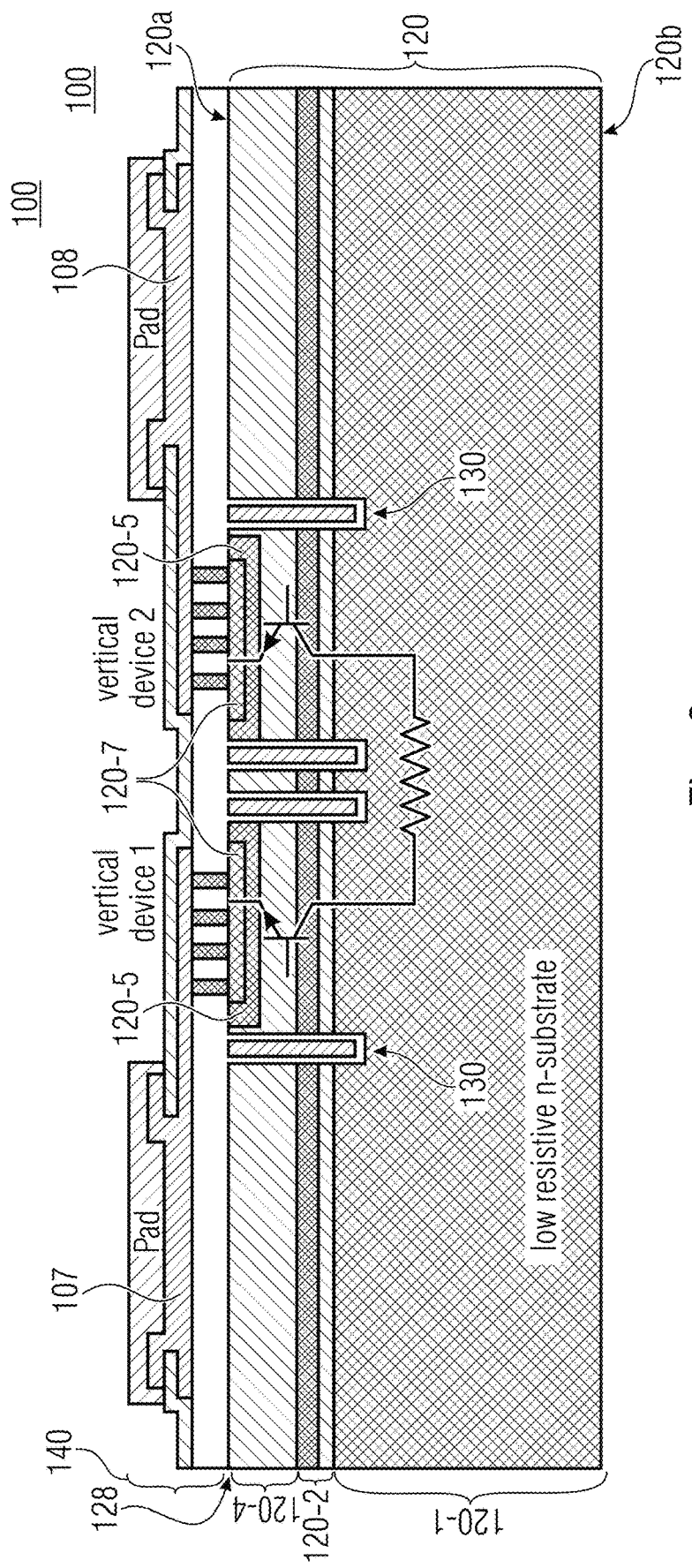
FIG. 6a shows a schematic cross-sectional view of a semiconductor device according to an embodiment.
Figure 6B:
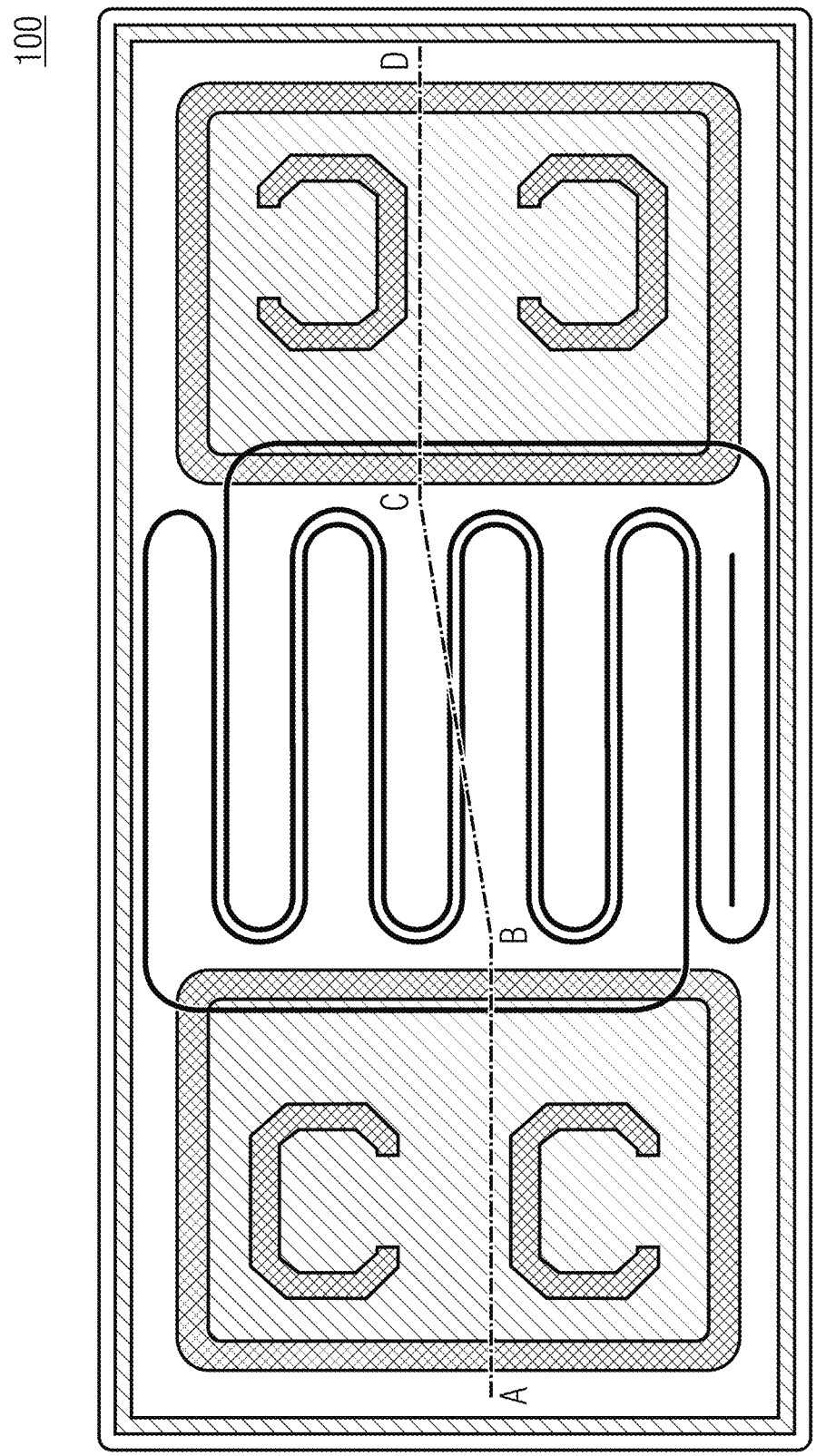

FIG. 6a shows a schematic cross-sectional view of the semiconductor device 100 along the cut line A-B-C-D in the schematic top view through the semiconductor device 100 of FIG. 6b. The semiconductor device 100 has, for example, the four anti-serially connected pn-junction structures $J_1$, $J_2$, $J_3$, $J_4$ according to an embodiment (see e.g., FIG. 1a). The pn-junction structures $J_1$, $J_3$ (vertical device 1) may comprise a first npn-structure with a first floating base region in the semiconductor substrate 120, wherein the pn-junction structures $J_2$, $J_4$ comprises a second npn-structure with a second floating base region in the semiconductor substrate 120. The floating base regions are respectively formed by the p-type parts between the n-type substrate 120 and the n-type contact region 120-7, i.e., for instance by p-type regions 120-2 to 120-5.

Figure 5C:
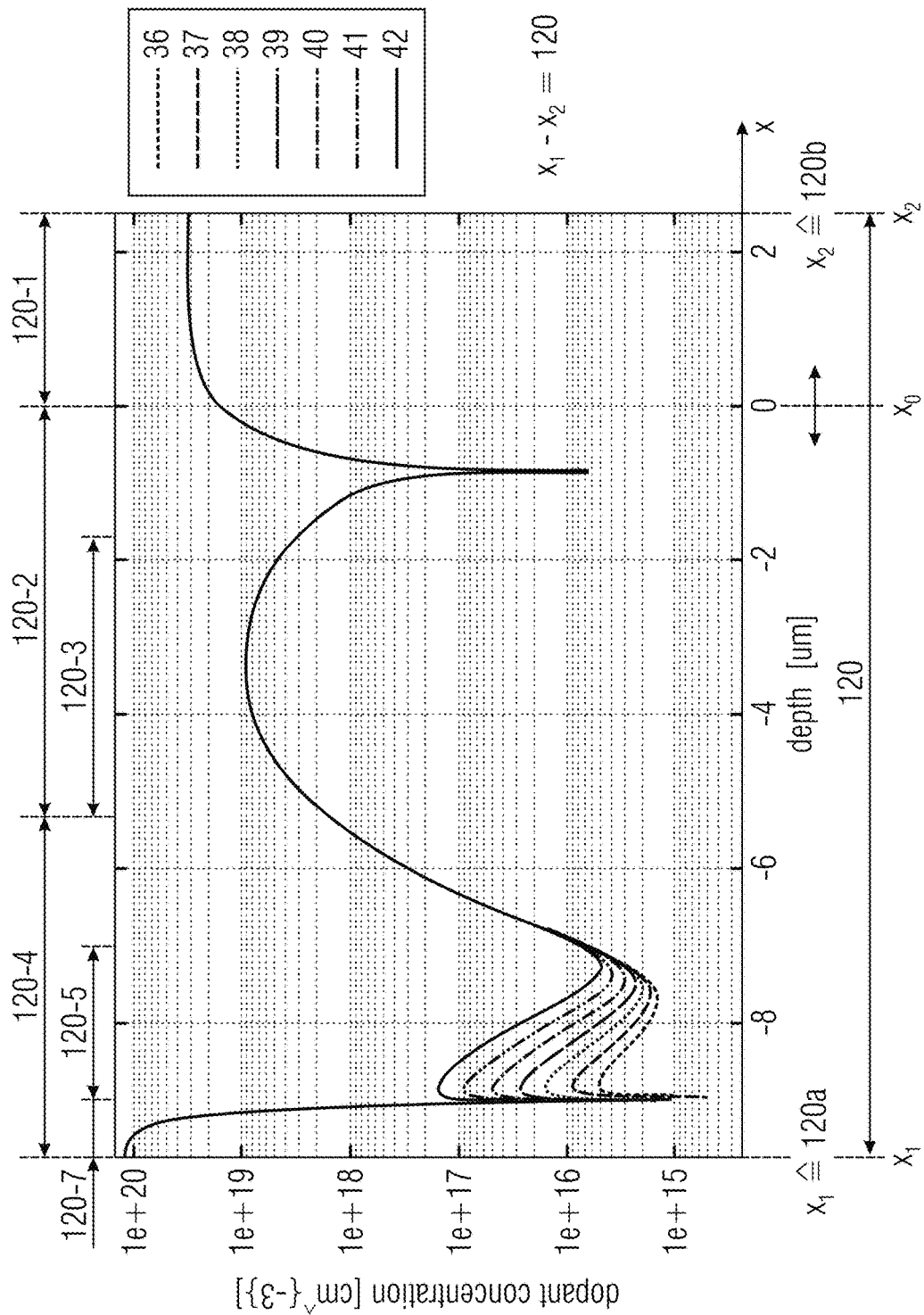
FIG. 5c shows a schematic simulated plot of an exemplary doping profile of pn-junction structures of the semiconductor device of FIG. 5a and FIG. 5b.

As discussed with respect to FIGS. 5a, 5b and 5c, with respect to the first and second pair 102, 104 of pn-junction structures $J_1$, $J_2$ and $J_3$, $J_4$, which are anti-serially connected, the first type pn-junction structures $J_1$ and $J_2$ may have (essentially) the same layout and doping profile and have the grading coefficient $m_1$, wherein the second type pn-junction structures $J_3$ and $J_4$ may also have (essentially) the same layout and doping profile and have the second junction grading coefficient $m_2$.

According to an embodiment, the semiconductor device forms a discrete ESD device (ESD=electrostatic discharge) having a TVS functionality, for example.

According to further embodiments, the semiconductor device 100 may have n (at least two) pairs of anti-serially connected pn-junction structures 102, 104 ( . . . ) with adjusted junction grading coefficients $m_1$, $m_2$ . . . $m_n$, wherein (at least) one of the n pairs 102, 104 ( . . . ) of the pn-junction structures $J_1$-$J_4$ ( . . . ) comprises a "composite" diode structure, to adjust and obtain a desired behavior regarding the breakdown voltage of the device 100 and to provide an at least reduced or a minimum generation of a spurious odd harmonics, e.g., third harmonics. The device 100 may for instance be used for TVS (Transient Voltage Suppressor) devices.

Figure 7A:
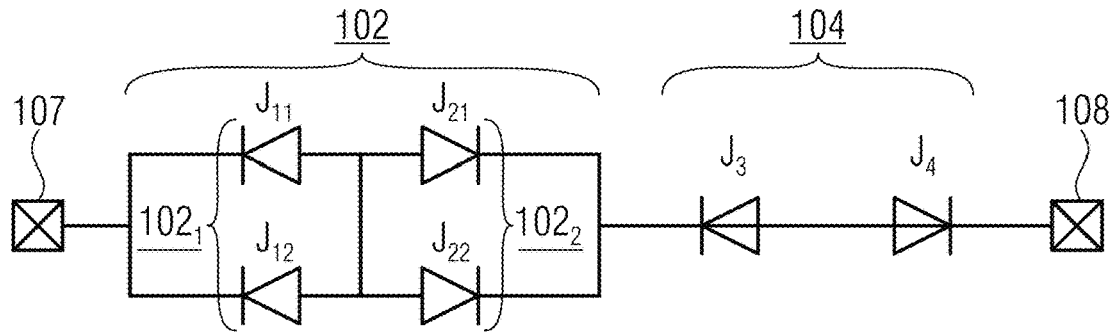
FIGS. 7a-7b show exemplary schematic circuit diagrams of a semiconductor device having n pairs of anti-serially connected pn-junction structures according to an embodiment.

FIG. 7a shows a schematic diagram of the semiconductor device 100 having n=2 pairs 102, 104 of anti-serially connected pn-junction structures, wherein (at least) one pair 102 of the at least two pairs 102, 104 of the pn-junction structures is arranged to have a junction type which is described here as a composite pn-junction structure (composite diode structure) and will be detailed with reference to FIG. 7b below.

Figure 7B:
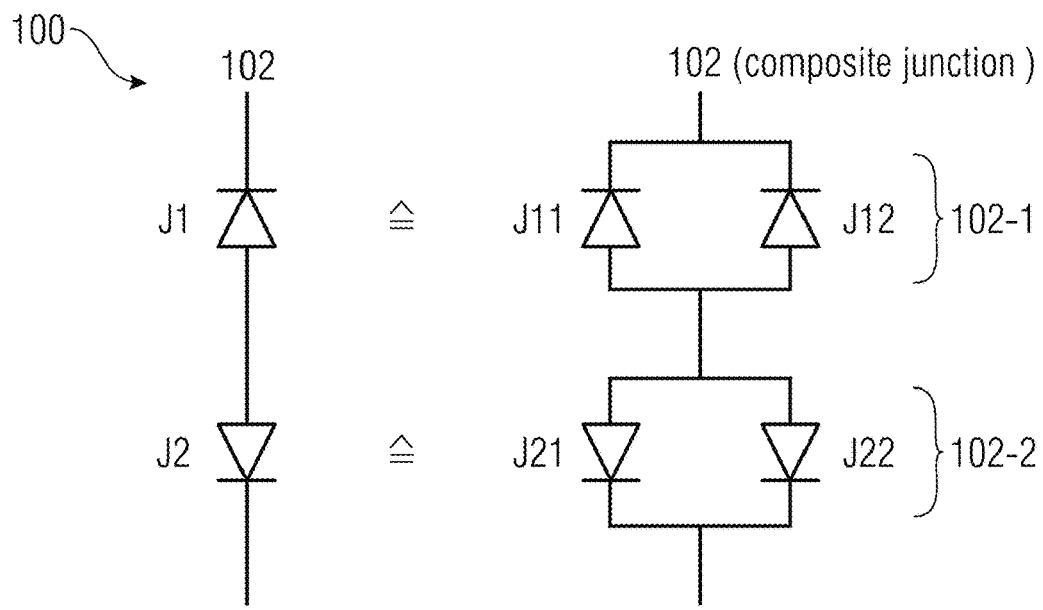

FIG. 7b shows only the first pair 102 of the semiconductor device 100 shown in FIG. 7a which is formed as a pair of two composite pn-junction structures 102-1, 102-2. The first composite pn-junction structure 102-1 comprises a first partial pn-junction structure $J_{11}$ and a second partial pn-junction structure $J_{12}$ and the second composite pn-junction structure 102-2 comprises the first partial pn-junction structure $J_{21}$ and the second partial pn-junction structure $J_{22}$. That is to say the first pair 102 of FIGS. 7a and 7b is formed by a pair of anti-serially connected composite pn-junction structures 102-1, 102-2 each of which has parallel connection of a first partial pn-junction structure $J_{11}$, $J_{21}$ and a second partial pn-junction structure $J_{12}$, $J_{22}$. The first partial pn-junction structures $J_{11}$, $J_{21}$ have a first partial junction grading coefficient $m_{11}$, a first partial junction voltage potential $V_{J11}$ and a first partial zero bias capacitance $C_{Jo11}$, wherein the second partial pn-junction structures $J_{12}$, $J_{22}$ have a second partial junction grading coefficient $m_{12}$, a second partial junction voltage potential $V_{12}$ and a second partial zero bias capacitance $C_{Jo12}$, which can be different to the first partial junction grading coefficient $m_{11}$, the first partial junction voltage potential $V_{J11}$ and the first partial zero bias capacitance $C_{Jo11}$ for example. Based on a combination of the first and second partial junction grading coefficients $m_{11}$, $m_{12}$, a first effective junction grading coefficient $m_1$ of the respective composite pn-junction structure 102-1 and 102-2 results. That is to say the composite pn-junction structures 102-1 and 102-2 behave as pn-junction structures having an effective junction grading coefficient $m_1$, an effective junction potential $V_{J1}$, and an effective zero bias junction capacitance $C_{Jo1}$. This effective behavior of the composite pn-junction structure as a simple pn-junction structure is indicated in FIG. 7b by the correspondence of the composite pn-junction structure 102-1 to the pn-junction structure $J_1$ and of the composite pn-junction structure 102-2 to the pn-junction structure $J_2$. Correspondingly, the voltage dependent capacitance characteristics of the composite pn-junction structures can, in many cases, be satisfactorily described or modeled by the expression A1 above, taking $m_i$ as the effective (combined) junction grading coefficient and similarly for the junction potential $V_{Ji}$ and the zero bias junction capacitance $C_{Joi}$.

In other words, the semiconductor device 100 as shown in FIGS. 7a and 7b according to an embodiment comprises a first parallel circuit 102-1 of the first partial pn-junction structure $J_{11}$ and the second partial pn-junction structure $J_{12}$, and a second parallel circuit 102-2 of the first partial pn-junction structure $J_{21}$ and the second partial pn-junction structure $J_{22}$, wherein the first and second parallel circuit 102-1, 102-2 are anti-serially connected. The anti-serially connected first and second parallel circuits 102-1, 102-2 form the first pair 102 of the pn-junction structures $J_1$, $J_2$ which is serially connected to the second pair 104 of the pn-junction structures $J_3$, $J_4$ as indicated in FIG. 7a.

That is to say, according to embodiments of the semiconductor device 100, at least one pair 102 of the n pairs 102, 104 ( . . . ) of pn-junction structures $J_1$-$J_4$ ( . . . ) may be arranged to form a composite pn-junction structure 102 as shown in FIG. 7b having first partial pn-junction structure $J_{11}$, $J_{21}$ and second partial pn-junction structure $J_{12}$, $J_{22}$ connected in parallel, wherein the first partial pn-junction structures $J_{11}$, $J_{21}$ have a first partial junction grading coefficient $m_{11}$, and wherein the second partial pn-junction structures $J_{12}$, $J_{22}$ have a second partial junction grading coefficient $m_{12}$, which may be different in some embodiments to the first partial junction grading coefficient $m_{11}$. The resulting effective junction grading coefficient $m_1$ of the composite pn-junction structure 120 is based on a combination of the first and second partial junction grading coefficients $m_{11}$, $m_{12}$.

Figure 8A:
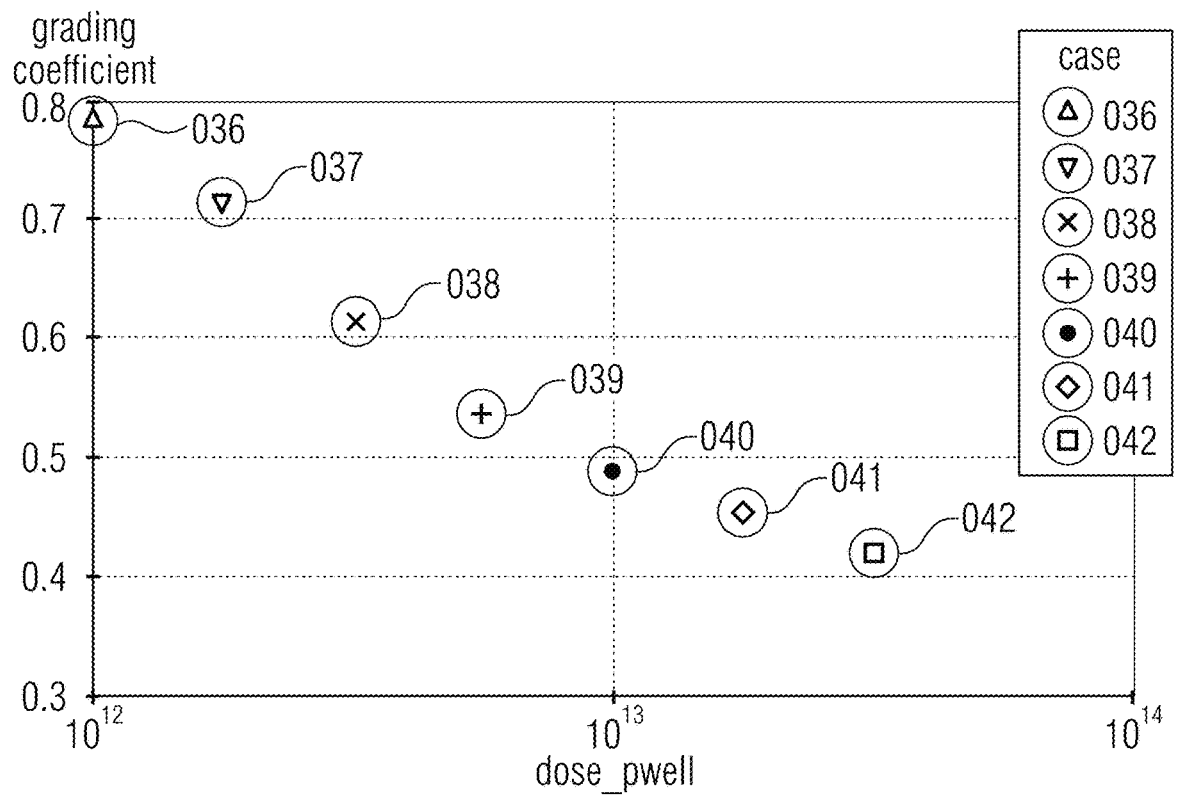
FIG. 8a shows a schematic simulated plot of the resulting junction grading coefficient $m_1$ as a function of the doping concentration based on different implantation doses for the doping profiles of FIG. 5c.
Figure 8B:
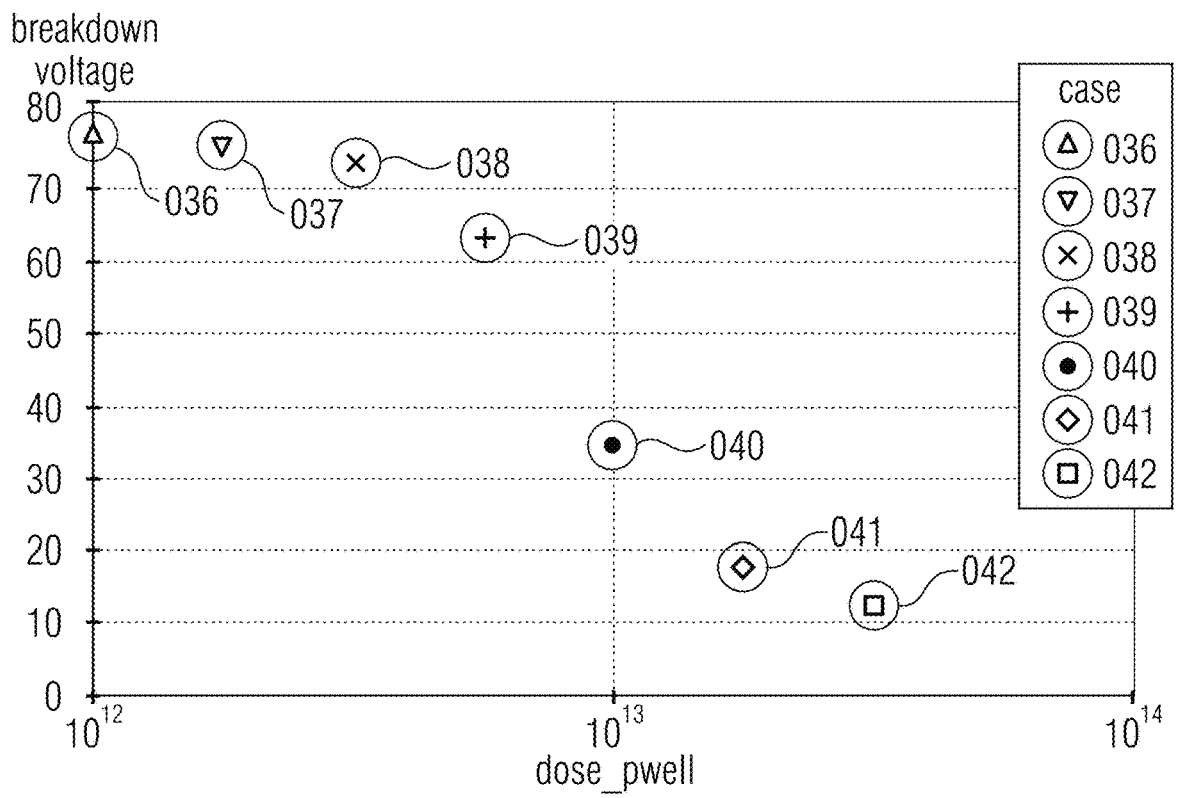
FIG. 8b shows a schematic simulated plot of the resulting breakdown voltage as a function of the doping concentration based on different implantation doses for the doping profiles of FIG. 5c.
Figure 8C:
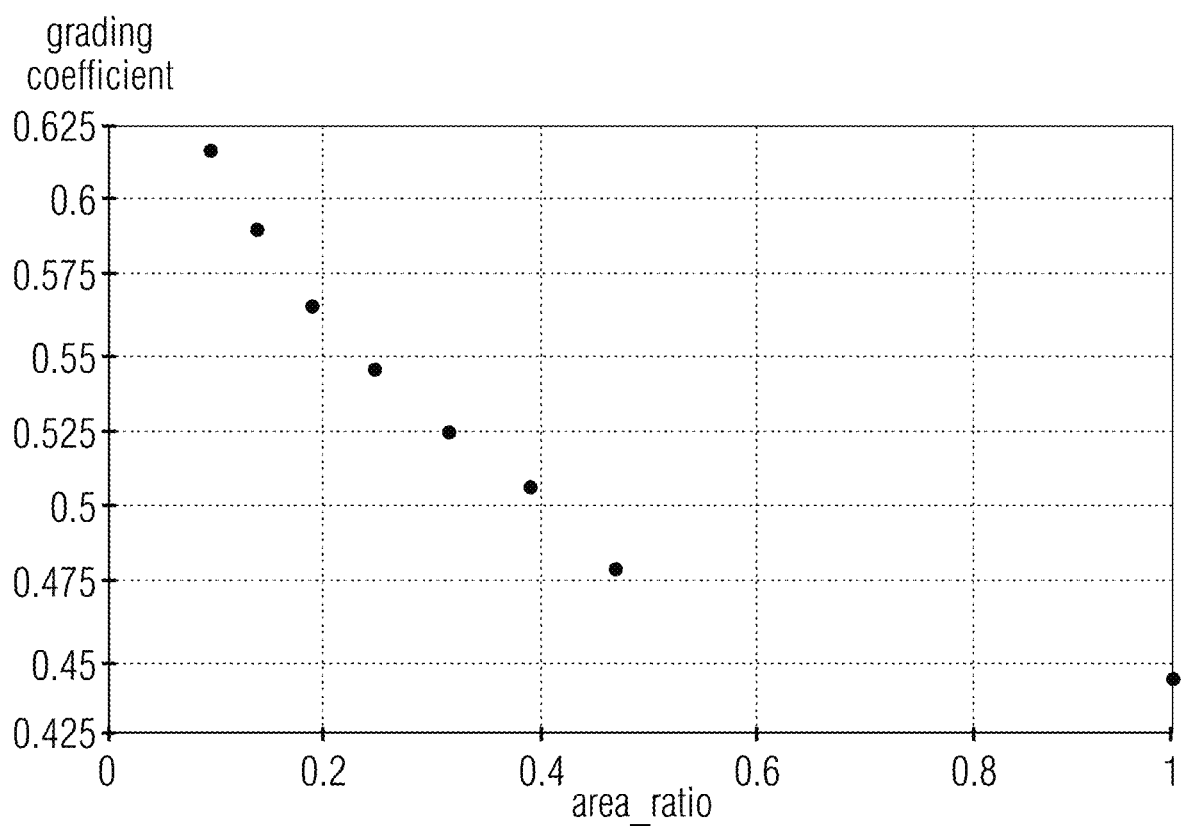
FIG. 8c shows the resulting combined junction grading coefficient of the composite first type pn-junction structure as a function of the area ratio between the areas of the first and second partial pn-junction structures based on two adjusted partial junction grading coefficients $m_{11}$, $m_{12}$ for two of the doping profiles shown in FIG. 5c.

In order to provide a further explanation of the present concept in form of the described implementations and embodiments of the semiconductor device 100 according to FIGS. 7a and 7b, the following discussion with respect to FIGS. 8a-8c relate to the exemplary technical analysis on the field of semiconductor devices, e.g., on the field of discrete ESD protection devices and TVS devices, respectively, by the applicant and the technical findings and conclusions resulting therefrom.

As shown in FIG. 7a, the semiconductor device 100 with the resulting junction grading coefficients $m_1$, $m_2$ of the first (102) and second pair (104) of pn-junction structures can be realized with a large degree of freedom. In particular, a pn-junction structure with a large freedom of tuning the breakdown voltage with a grading coefficient m≥0.5 can be realized as a composite pn-junction structure and used for the semiconductor device 100 of some embodiments.

In the conventional semiconductor technologies, there is a difficulty to realize hyper-abrupt junctions with low breakdown voltages below 25 V or even below 16 V or 12 V with a controllable grading coefficient m>0.5. Some embodiments provide the semiconductor device 100 with both desired properties, i.e., a low breakdown voltage and adjustable gradient coefficient of at least 0.5. This is due to the fact that conventionally used processing steps in semiconductor technology, such as implantation and diffusion, yield dopant profiles that show some grading in a narrow region around the metallurgical junction. The space-charge region, which determines the capacitance vs. voltage behavior and the breakdown voltage of a pn-junction, is extending around the metallurgical junction. In case of a low breakdown voltage the doping concentrations are high and the extent of the space charge region is small. With increasing breakdown voltage the doping concentration at one or both sides of the metallurgic junction is decreasing and the width of the space charge region is increasing. Due to the inevitable grading near the metallurgical junction low-voltage breakdown junctions will in practice see a more or less graded profile, instead of the desired abrupt or hyper-abrupt doping profile. Therefore the combination of low breakdown voltage and a grading coefficient m≥0.5 is difficult be realized with semiconductor processes that are conventionally used in mass production of semiconductor devices and circuits.

To summarize, higher doping levels lead to a less extended space charge region (=depletion region) and, thus, to a low(er) breakdown voltage $V_{bd}$. Moreover, a resulting more linear graded junction behavior leads to a small(er) gradient coefficient m.

A high(er) grading coefficient m≥0.5 requires a more (or hyper) abrupt doping profile. In case of a lower doping level at one side of metallurgical junction the depletion layer will extend further into this lower doped region. Therefore, the depletion layer is not restricted to a narrow region around the metallurgical junction as in the case of higher doping levels, in which usually the doping profile is showing a more or less linear grading. Because the depletion region extends beyond this graded region close to the metallurgical junction in case of a lower doping level, the C(V) characteristics of the lower doped junction can more easily be adapted to a grading coefficient m≥0.5. At the same time a low(er) doping level leads to a higher break down voltage $V_{bd}$.

Therefore, the combination of low breakdown voltage and a grading coefficient m≥0.5 is difficult to realize with the conventional technology.

To overcome this limitation, the embodiments, as shown in FIGS. 7a and 7b introduce a concept to obtain a junction (pn-junction structure) with both desired properties, i.e., a predetermined low breakdown voltage of not more than 25 V and predetermined grading coefficient equal to or above 0.5 by subdividing the junction into two areas, i.e., into partial pn-junction structures that together from a composite pn-junction structure:

(1) one active area with a higher well implantation dose, which results in a part of the pn-junction $J_{11}$, $J_{21}$ with a low predetermined breakdown voltage and a grading coefficient $m_{11}$<0.5, and (2) another active area with a lower well implant dose, which results in a part of the pn-junction $J_{12}$, $J_{22}$ with a breakdown voltage higher than the predetermined one and a grading coefficient $m_{12}$>0.5.

The overall behavior of this composite pn-junction 102-1 and 102-2, respectively, shows a breakdown voltage that is determined by the higher well doping and the grading coefficient of the capacitance-vs-voltage characteristics is determined by the parallel connection in the two branches of the first and second partial pn-junction structures $J_{11}$, $J_{12}$ and $J_{21}$, $J_{22}$, respectively.

By adjusting (1) the grading coefficients $m_{11}$, $m_{12}$ in the two regions of the first and second partial pn-junction structures $J_{11}$, $J_{12}$ and $J_{21}$, $J_{22}$ (by well implantation dose and energy, as well by further diffusion steps) and by adjusting (2) the area ratio of the two regions of the first and second partial pn-junction structures $J_{11}$, $J_{12}$ and $J_{21}$, $J_{22}$ with different well implantation, the resulting effective grading coefficient $m_1$ of the resulting composite junction structure 102-1, 102-2 can be adjusted to a target value close to the value that yield a minimized third harmonic (H3) generation. In some embodiments, for the pair 102 of the composite junctions 102-1 and 102-2 a zero bias capacitance ($C_{Jo}$) of $J_{11}$ and $J_{21}$ (as well as of $J_{12}$ and $J_{22}$, respectively) may be arranged to be equal from the perspective of forming a symmetric device 100 for suppressing also generation of even (e.g., 2nd) harmonics. Similar considerations hold for the junction voltage potentials ($V_{Jo}$) of the partial pn-junction structures $J_{11}$ and $J_{21}$ (as well as $J_{12}$ and $J_{22}$, respectively) as well as for the area ratios of the partial pn-junctions in each of the composite structures 102-1 and 102-2 forming the pair of composite pn-junction structures 102. In the concept described above a pair of composite pn-junctions 102-1 and 102-2 is realized in which the breakdown voltage and the net grading coefficient can be both controlled in a much larger parameter range by technology and physical design or layout adjustments.

FIG. 8a shows a schematic simulated plot of the resulting junction grading coefficient $m_1$ as a function of the doping concentration based on different implantation doses. To be more specific, the simulated Capacitance vs. Voltage characteristics of the pn-junction between an highly n-doped shallow contact region and the p-doped well region are shown in FIG. 8a for the doping profiles shown in FIG. 5c (described in more detail above) for semiconductor region 120-4 comprising regions 120-7 and 120-5 (cf. e.g., FIGS. 5a and 5b), wherein equal numbers (36-42) denote corresponding doping profiles. From this figure, it can be seen that with low implantation doses for the p-well hyper-abrupt junctions with m>0.5 can be obtained.

FIG. 8b shows a schematic simulated plot of the resulting breakdown voltage as a function of the doping concentration based on different implantation doses and doping profiles as indicated by the same numbers as in FIGS. 8a and 5c. However, as discussed above, the breakdown voltage of the junction with the lowest p-well doses and highest grading coefficients tend to have high breakdown voltages, as shown in FIG. 8b. In the case of this simulation example it is shown that, if for minimum 3rd harmonic generation a grading coefficient between 0.5 and 0.6 is required, the junction would have a breakdown voltage of 40 V or higher without using a composite pn-junction structure as explained above.

FIG. 8c shows the resulting, combined junction grading coefficient $m_1$ of the composite pn-junction structure 102-1 (or 102-2) as a function of the area ratio between the active areas of the first and second partial pn-junction structures $J_{11}$ and $J_{12}$ (or $J_{21}$ and $J_{22}$) of the composite pn-junction structure 102-1 (102-2) based on two adjusted partial junction grading coefficients $m_{11}$ (of $J_{11}$ or $J_{21}$) and $m_{12}$ (of $J_{12}$ or $J_{22}$). The doping profiles of the first and second partial pn-junction structure in this case correspond to numbers 37 and 41 shown in FIG. 5c (see also respective numbers in FIGS. 8a and 8b). As discussed above the breakdown voltage of the junction with the lowest p-well doses and highest grading coefficients tend to have high breakdown voltages, as shown in the FIG. 8b. The relative area contribution can be easily controlled by the physical design (layout) of the device.

More generally, the above described composite junction 102-1 may be described as 120-$i$ being placed as the i-th type pn-junction structure. Hence, according to an embodiment, the first partial pn-junction structure is arranged to have a first partial junction grading coefficient $m_{i1}>0.5$, and wherein the second partial pn-junction structure is arranged to have a second partial junction grading coefficient $m_{i2}<m_{i1}$, e.g. $m_{i1}$ may be between 0.30 and 0.5.

According to an embodiment, the first and second partial pn-junction structures $J_{11}$, $J_{21}$, and $J_{12}$, $J_{22}$ are arranged in a semiconductor substrate, wherein said combination proportionately depends on an area ratio between an active area parallel to a first main surface area of the semiconductor substrate of the first and second partial pn-junction structures $J_{11}$ and $J_{12}$ of the composite pn-junction structure 102-1 as well as $J_{21}$ and $J_{22}$ of the composite pn-junction structure 102-2. According to an embodiment, the first and second partial pn-junction structures $J_{11}$, $J_{12}$ of the first composite pn-junction structure 102-1 and the first and second partial pn-junction structure $J_{21}$, $J_{22}$ of the second composite pn-junction structure 102-2 may be arranged together in a laterally isolated common region of the semiconductor substrate. According to an embodiment, the first and second partial pn-junction structures vertically extend in a depth direction with respect to a first main surface area of the semiconductor substrate into the semiconductor substrate.

Figure 9A:
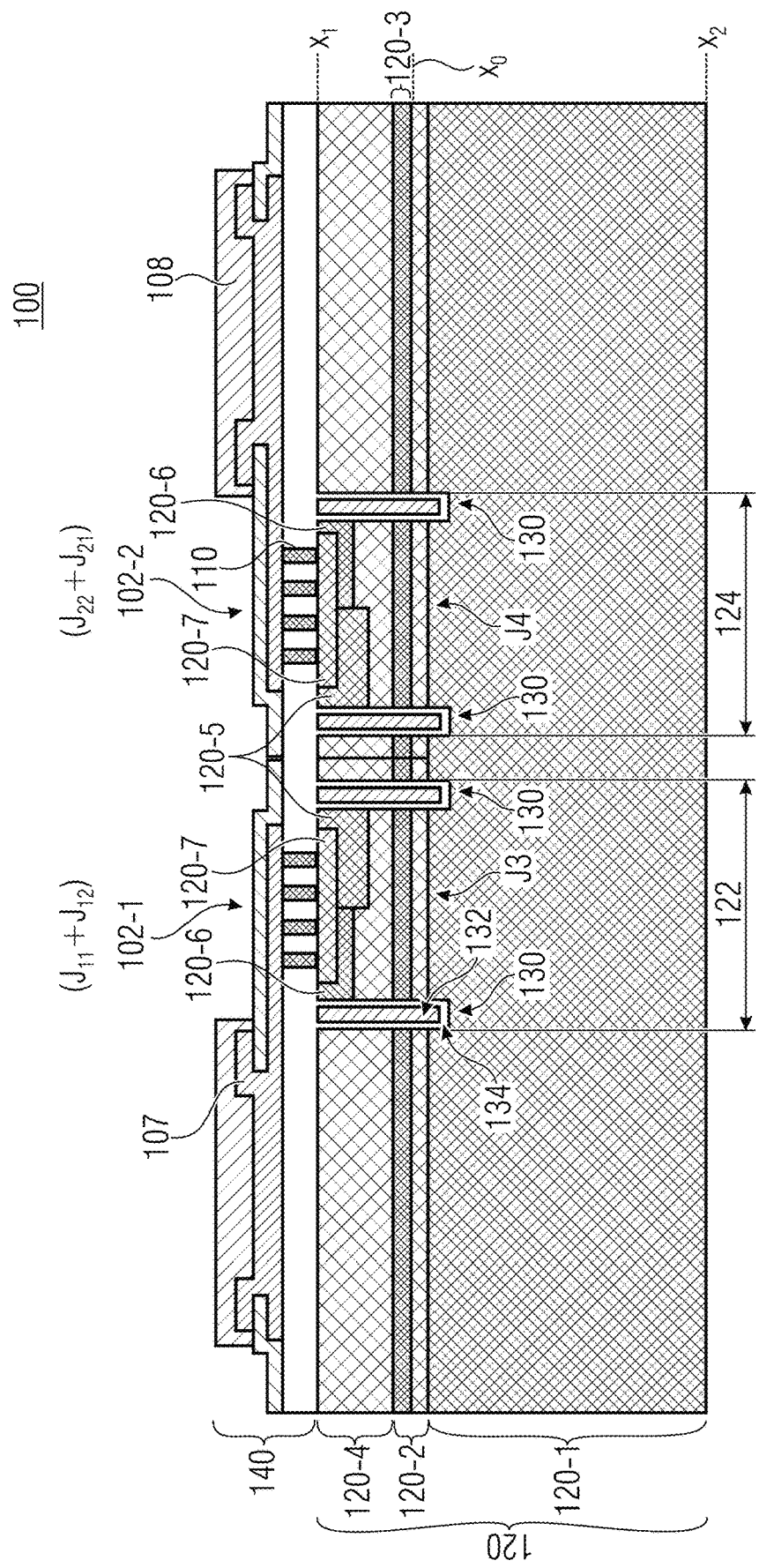
FIG. 9a shows schematic cross-sectional view of a further exemplary implementation of the semiconductor device.
Figure 9B:
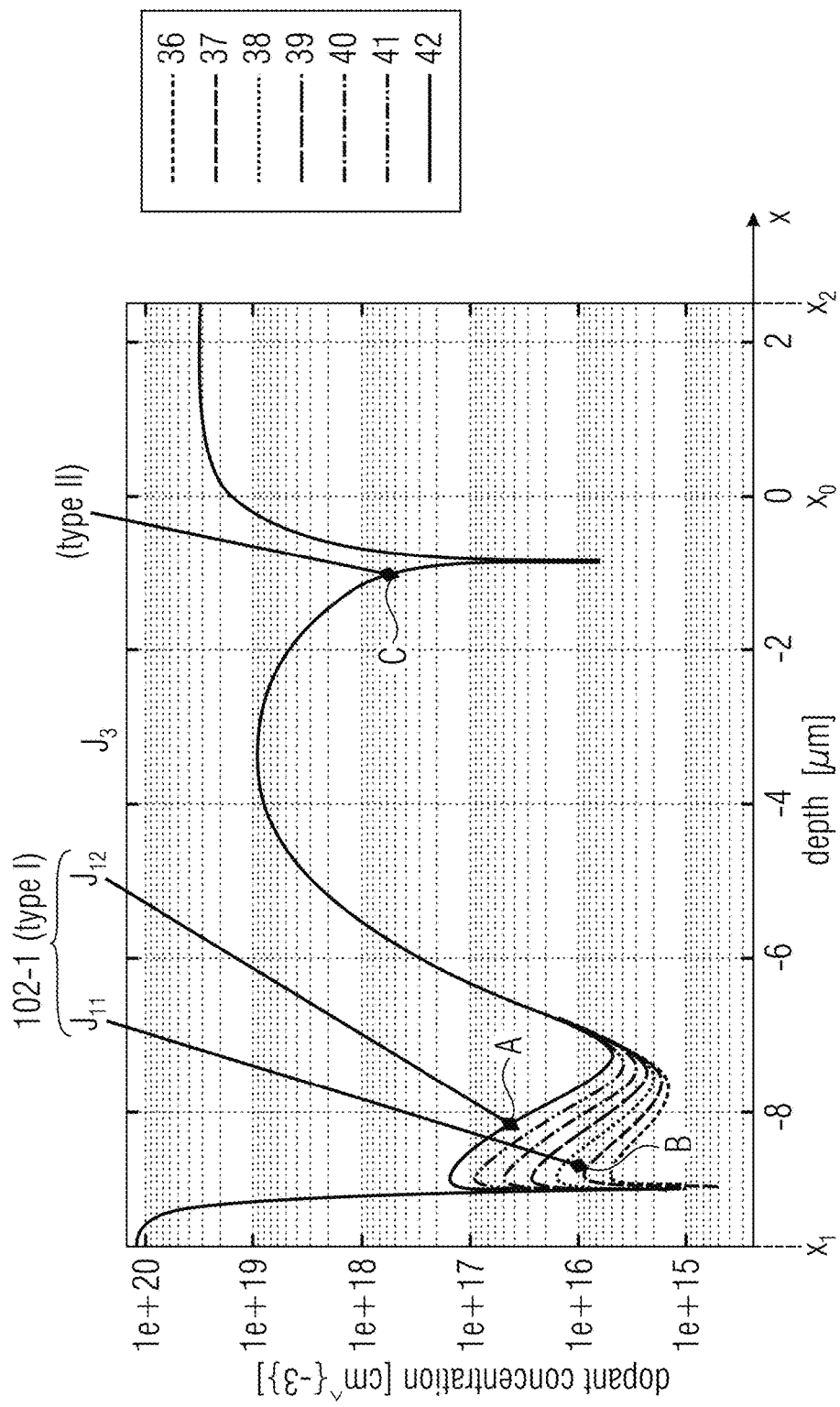
Figure 9C:
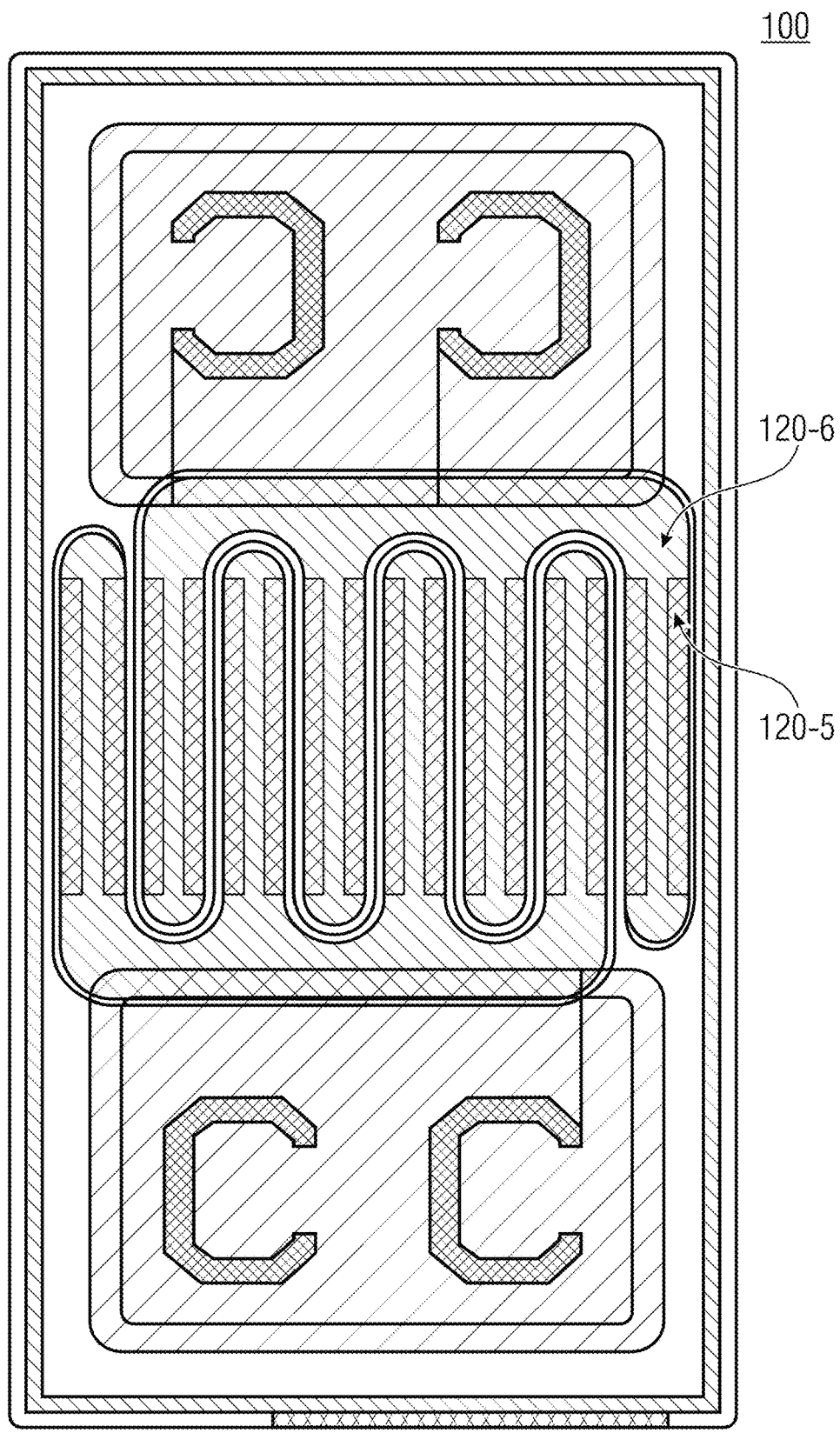
FIG. 9c shows a schematic top view through the semiconductor device of FIG. 9a in the plane through the composite first type pn-junction structure showing the "active" areas of the first and second partial anode regions of the first type pn-junction structure.
Figure 9D:
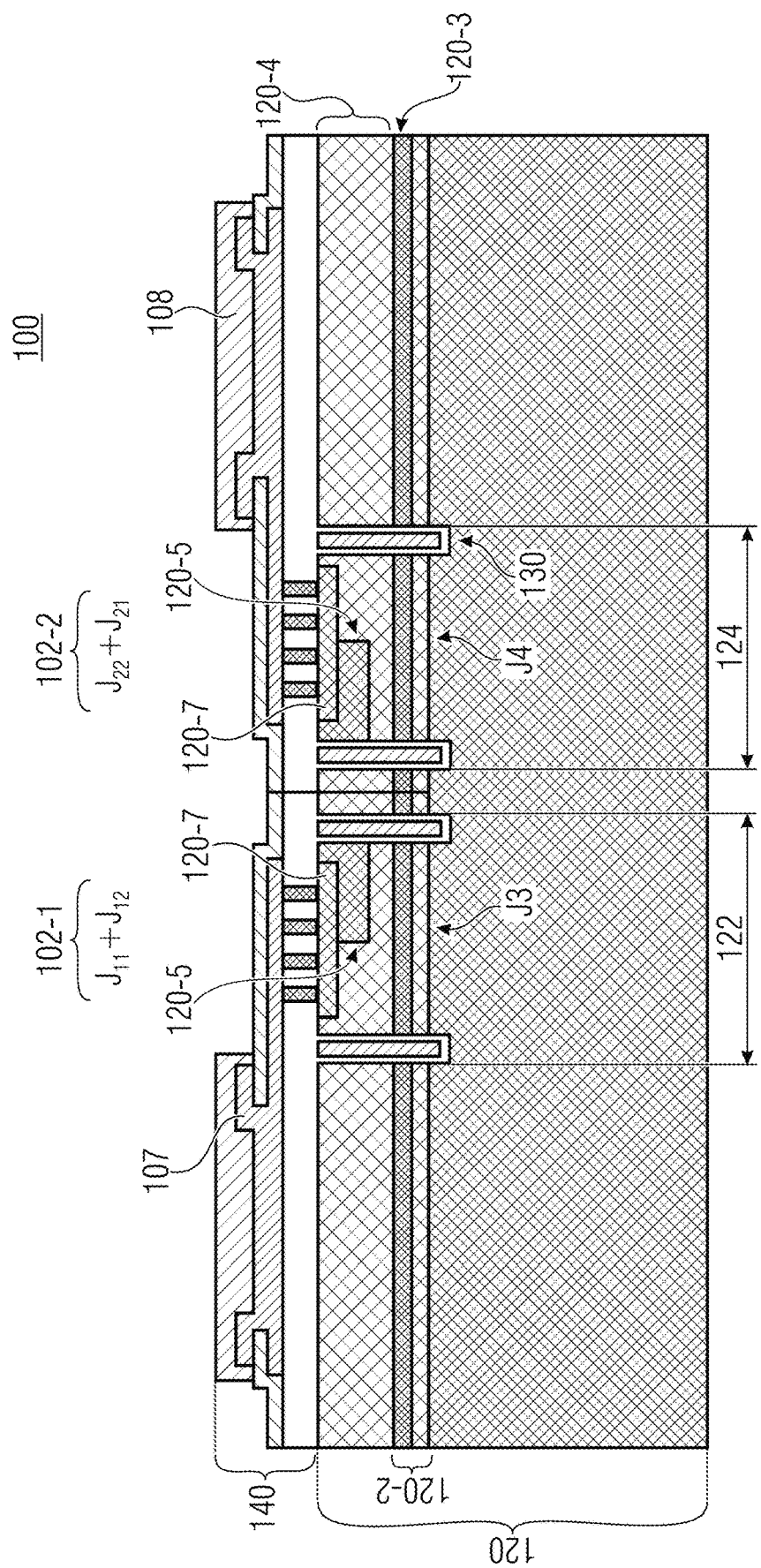
FIGS. 9d-9f show schematic cross-sectional views of further exemplary implementations of the semiconductor device.

FIGS. 9a and 9d show schematic cross-sectional views of further exemplary implementations of the semiconductor device 100 comprising a pair of composite pn-junction structures. FIG. 9b shows a schematic simulated plot of the different exemplary doping profiles also shown in FIG. 5c and now employed for the semiconductor device of FIG. 9a. FIG. 9c shows a schematic top view through the semiconductor device of FIG. 9a in the plane through the composite type pn-junction structures showing the "active" areas of the first and second partial anode regions 120-5, 120-6 of the composite pn-junction structures $J_1$ and $J_2$ for example.

In the figures and the specification identical elements and elements having the same functionality and/or the same technical or physical effect are provided with the same reference numbers or are identified with the same name. Thus, in the following description of the embodiments of the semiconductor device 100 in FIGS. 9a and 9d, a main focus is directed to the respective differences and adaptations between the different implementations of the semiconductor device 100 when compared, for example, to the embodiments of the semiconductor device 100 in FIGS. 5a, 5b, 5c and 6a-6b.

FIGS. 9a and 9d show different schematic cross-sectional views of the semiconductor device 100 having, for example, the two pairs of anti-serially connected pn-junction structures $J_1$, $J_2$ (=first pair 102) and $J_3$, $J_4$ (=second pair 104) according to an embodiment, wherein the first pair 102 comprises the composite pn-junction structures 102-1, 102-2, and wherein the second pair 104 comprises the pn-junction structures $J_3$, $J_4$ (see for example FIG. 7a), to adjust and obtain for instance a desired TVS behavior (TVS=transient voltage suppressor) of the semiconductor device 100 regarding its breakdown voltage and junction grading coefficients.

The first composite pn-junction structure 102-1 comprises the first partial pn-junction structure $J_{11}$ having the first partial junction grading coefficient $m_{11}$ and the second partial pn-junction structure $J_{12}$ having the second partial junction grading coefficient $m_{12}$. The second composite pn-junction structure 102-2 comprises the third partial pn-junction structure $J_{21}$ (substantially equal structure as $J_{11}$ also regarding zero bias capacitance $C_{Jo}$ and junction potential $V_{Jo}$) having also the partial junction grading coefficient $m_{11}$ and the partial pn-junction structure $J_{22}$ (substantially equal structure as $J_{12}$ also regarding zero bias capacitance $C_{Jo}$ and junction potential $V_{Jo}$) having the partial junction grading coefficient $m_{12}$. The resulting junction grading coefficient $m_1$ of the first and second composite pn-junction structures 102-1, 102-2 is based on a combination of the first and second partial junction grading coefficients $m_{11}$, $m_{12}$.

As shown in FIG. 9a, the first composite pn-junction structure 102-1 can be implemented by using two different implantation areas 120-5, 120-6 in the substrate region 122. Thus, the n-type contact region 120-7 in the substrate region 122 is embedded in the adjacent implantation areas 120-5, 120-6. The second composite pn-junction structure 102-2 can be implemented by using two different implantation areas 120-5, 120-6 in the substrate region 124. Thus, the further n-type contact region 120-7 in the substrate region 124 is embedded in the further adjacent implantation areas 120-5, 120-6.

As shown in FIG. 9a, the partial pn-junction structures $J_{11}$, $J_{12}$ may be arranged in the semiconductor area 122 of the semiconductor substrate 120 (as abutted partial pn-junction structures $J_{11}$, $J_{12}$), wherein the partial pn-junction structures $J_{21}$, $J_{22}$ may be arranged in the further semiconductor area 124 of the semiconductor substrate 120 (as abutted partial pn-junction structures $J_{21}$, $J_{22}$). The separated areas 122, 124 may be achieved by means of so-called deep isolation trenches 130 which laterally confine and/or laterally surround the semiconductor regions 122, 124. Moreover, the buried p-type layer 120-3 (=anode region) and the low ohmic n-type substrate 121 (=cathode region) form the second type pn-junction structures $J_3$ and $J_4$, respectively, in the separated semiconductor regions 122, 124 of the semiconductor substrate 120.

FIG. 9b shows a schematic simulated plot of different exemplary doping profiles for the semiconductor device 100 of FIG. 9a. The different doping concentrations of the implantation areas 120-5, 120-6 in the p-type layer 120-4 may be achieved by using different implantation doses, which are indicated with "36" to "42" in FIG. 9b. The plot further contains an indication of the approximate extensions of the different layers and/or regions of the semiconductor substrate 120. As shown in FIG. 9a, the first composite pn-junction structure 102-1 having the first and second partial pn-junction (diode) structures $J_{11}$, $J_{12}$ comprises two p-type well regions 120-5, 120-6. A p-well 120-5 doping concentration profile (A) results, for example, in the first partial junction grading coefficient $m_{11}$. A p-well 120-6 doping concentration profile (B), which may be lower than the p-well 120-5 doping concentration (A), results in the second partial junction grading coefficient $m_{12}$, e.g., with $m_{12} > m_{11}$. Based on the first and second partial junction grading coefficients $m_{11}$, $m_{12}$, an effective net grading coefficient m1 of the composite junction 102-1 may be achieved.

As higher doping levels lead to a less extended space charge region (=depletion region) and, thus, to a low(er) breakdown voltage $V_{bd}$, a resulting more linear graded junction behavior leads to a small(er) gradient coefficient m. A high(er) grading coefficient m requires a more (or hyper) abrupt doping profile. However, there are practical difficulties in creating "ideal" abrupt profiles. Therefore, for forming a pn-junction structure with a grading coefficient m≥0.50, a wide(r) space charge region with low(er) doping level may be necessary. A low(er) doping level leads to a high(er) break down voltage $V_{bd}$.

The above evaluations with respect to the schematic simulated plot of different exemplary doping profiles are correspondingly applicable to the second composite pn-junction structure 102-2 of the first pair of pn-junction structures 102 and the resulting effective net grading coefficient $m_1$.

FIG. 9c shows a schematic top view of a possible layout of the semiconductor device 100 of FIG. 9a showing the extension of the "active" areas of the first partial anode region 120-5 (having the higher p-well doping implantation) and of the second partial anode region 120-6 (having the lower p-well doping implantation) of the composite type pn-junction structure 102-1 and 102-2. The exemplary area ratio is about 40% of the first partial anode region 120-5 and 60% of the second partial anode region 120-6.

By optimizing the layout the ratio of the areas which are defined by the lower and the higher dopant concentration of the p-well regions 120-6, 120-5 can be adjusted to achieve the target (optimum) value of the junction grading coefficient $m_1 > 0.5$, e.g., $m_1 \sim 0.55$ while maintaining a breakdown voltage of not more than 25 V.

As shown in FIG. 9d, the first pair of partial pn-junction structures $J_{11}$, $J_{12}$ may be arranged in the semiconductor area 122 of the semiconductor substrate 120, wherein the second pair of partial pn-junction structures $J_{21}$, $J_{22}$ may be arranged in the further semiconductor area 124 of the semiconductor substrate 120. The separated areas 122, 124 may be achieved by means of so-called deep isolation trenches 130 which laterally confine and/or laterally surround the semiconductor regions 122, 124.

As shown in FIG. 9d, a p-type well region 120-5 (p-well 120-5) is arranged in the second epitaxial p-type layer 120-4 in the semiconductor regions 122 and 124, wherein the p-type well 120-5 only partially surrounds the highly doped n-type contact regions 120-7 in the p-type layer 120-4 of the semiconductor substrate 120. Thus, in the semiconductor region 122, the highly doped n-type contact regions 120-7 and the second epitaxial p-type layer 120-4 form the first partial pn-junction structure $J_{11}$, wherein the p-type well region 120-5 and the highly doped n-type contact region 120-7 form the second partial pn-junction structure $J_{12}$ (as abutted partial pn-junction structures $J_{11}$, $J_{12}$). Accordingly, in the semiconductor region 124, the highly doped n-type contact regions 120-7 and the second epitaxial p-type layer 120-4 form the third partial pn-junction structure $J_{21}$, wherein the p-type well region 120-5 and the highly doped n-type contact region 120-7 form the fourth partial pn-junction structure $J_{22}$ (as abutted partial pn-junction structures $J_{21}$, $J_{22}$). Thus, the first and third partial pn-junction structures $J_{12}$, $J_{21}$ do not comprise, for example, a p-type well region. As mentioned above, the layer 120-4 may also be realized by an i-type (i.e., intrinsic or not intentionally doped) layer.

Alternatively, a doping profile in the layer 120-4 can be adjusted to obtain a predetermined grading coefficient $m_{12}$ in partial pn-junction structures $J_{11}$ and $J_{21}$, respectively, by gradually adjusting the doping level during epitaxial growth of the layer 120-4. In other words, a hyper abrupt junction behavior can be realized in partial pn-junctions $J_{11}$ and $J_{21}$ by creating a depth dependence of the doping level in the epitaxial layer by means of controlling the gas flow of dopant source gas during epitaxial layer growth.

Moreover, the buried p-type layer 120-3 (=anode region) and the n-type substrate 121 (=cathode region) form the second type pn-junction structures $J_3$ and $J_4$, respectively, in the separated semiconductor regions 122, 124 of the semiconductor substrate 120.

The p-type well region 120-5 (p-well 120-5) may be arranged in the second epitaxial p-type layer 120-4 by forming the required doping profile in the p-type semiconductor layer 120-4, e.g., during epitaxial growth or by performing an implantation step.

Figure 9E:
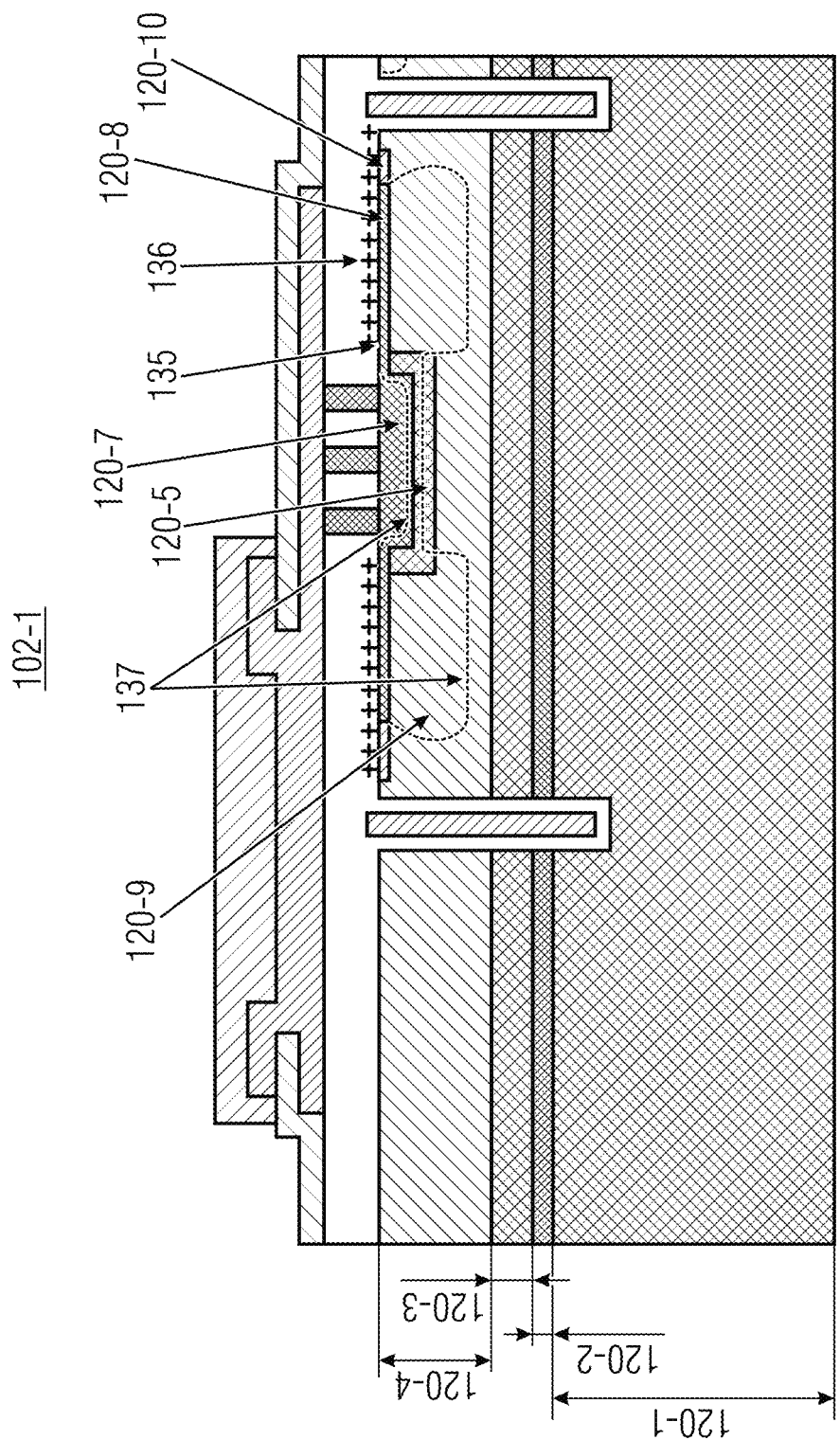

FIG. 9e shows a configuration of a composite pn-junction structure 102-1 according to another embodiment. The composite pn-junction structure 102-1 comprises a pn-junction between an n+ region 120-7 and a p-well region 120-5 and another adjoining voltage dependent capacitance, which—in this embodiment—may be formed by an inversion charge layer 120-8 at an interface 135 between an oxide layer and a bulk or epi-layer 120-4 of semiconductor material. The bulk semiconductor material or epi layer 120-4 may be p-doped or intrinsic (i.e., not intentionally doped) for example. One electrode (corresponding to the cathode) of this voltage dependent capacitance is formed by the inversion charge layer 120-8 which is caused by the presence of fixed oxide charges 136 at or near the semiconductor/oxide interface 135. Directly adjoining the inversion charge layer 120-8, the volume of semiconductor material is depleted of mobile charges as indicated by depletion region 120-9 in FIG. 9e and the un-depleted semiconductor material below the depleted zone forms the other electrode (corresponding to the anode) of the voltage dependent capacitance. The depletion zone is indicated in FIG. 9e by means of dashed lines 137 schematically representing the boundaries of the depletion layer.

In some embodiments the doping profile of the p-well 120-5 near the edges and the semiconductor/oxide interfaces 135 is adjusted so that also in this region an inversion charge layer 120-8 is present and an electrical connection between the n+ region 120-7 and the surrounding inversion charge layer 120-8 is established.

The characteristics of the voltage dependence capacitance formed due to the electron inversion charge layer 120-8 may be modeled according to formula (A1) above which defines a grading coefficient, a zero bias capacitance and junction potential also for this kind of voltage dependent capacitance. In this respect, the voltage dependent capacitance formed due to the presence of the inversion charge layer 120-8 as described above is also considered a partial pn-junction structure $J_{11}$, $J_{12}/J_{21}$, $J_{22}$ in the context of the composite pn-junction structure 102-1, 102-2.

The effective grading coefficient of the composite pn-junction structure 102-1 according to this embodiment is a combination of the grading coefficient of the pn-junction and the grading coefficient of the voltage dependent capacitance formed due to the presence of the electron inversion charge layer 120-8. The relative contribution of both grading coefficients can be adjusted by (1) the doping profiles of the respective regions defining the pn-junction and the voltage dependent capacitance 120-8, and (2) the relative areas of the pn-junction and the voltage dependent capacitance 120-8.

The voltage dependent capacitance 120-8 may be surrounded by a channel stop region 120-10 which avoids that regions outside the intended region, where the voltage dependent capacitance 120-8 is formed, contribute to the voltage dependent capacitance.

The breakdown voltage $V_{bd}$ of such a structure is determined by the pn-junction structure between the n+ region and the p-well region.

Figure 9F:
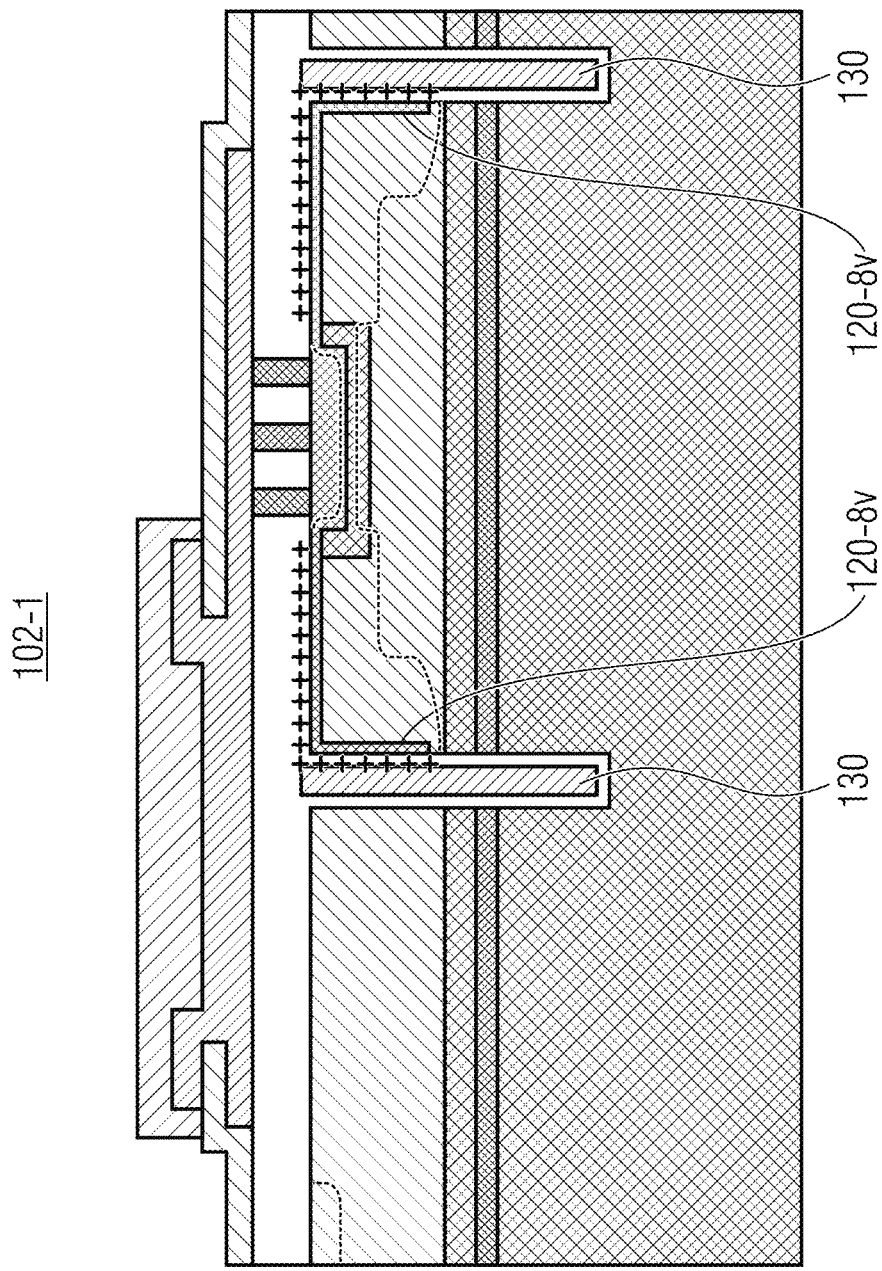

FIG. 9f shows yet another embodiment of the composite pn-junction structure. The voltage dependent capacitance of the embodiment shown in FIG. 9e is in FIG. 9f further extended by an inversion layer 120-8v which is formed on the vertical sidewalls of a deep isolation trench structure 130. The other specifics are similar to the ones described with respect to FIG. 9e and are not repeated here.

Aspects of the invention may also embrace a method of manufacturing a semiconductor device comprising at least a first pair of pn-junction structures of a first type and a second pair of pn-junction structures of a second type. The method may comprise a design step of determining a first grading coefficient for the pn-junction structures of the first type and a second grading coefficient of the pn-junction structure of the second type, wherein the first grading coefficient is different from the second grading coefficient and at least one of the first grading coefficient and the second grading coefficient is less than 0.50, wherein the grading coefficients are determined to suppress generation of spurious third harmonics by the semiconductor device.

Exemplary embodiments may provide a semiconductor device comprising: "n" pairs of pn-junction structures, with n is an integer≥2, wherein the i-th pair, with i∈{1, ..., n}, comprises two pn-junction structures of the i-th type, wherein the two pn-junction structures of the i-th type are anti-serially connected, wherein the pn-junction structure of the i-th type is arranged to have an i-th junction grading coefficient $m_i$, wherein at least a first pair of the n pairs of pn-junction structures is arranged to have a first junction grading coefficient $m_1$ with $m_1 \notin \{0.00, 0.50\}$ and $m_1 < 0.50$ and a second pair of the n pairs of pn-junction structures is arranged to have a second junction grading coefficient $m_2$ with $m_2 \notin \{0.00, 0.50\}$, and wherein the junction grading coefficients $m_1$, $m_2$ of the first and second pair of the n pairs of pn-junction structures are adjusted to result in generation of a spurious third harmonic signal of the semiconductor device with a signal power level (PH3), which is at least 10 dB lower than a reference signal power level (PH3) of the spurious third harmonic signal obtained for a reference case in which the first and second junction grading coefficients $m_1$, $m_2$ are 0.25.

According to an exemplary embodiment, the first to n junction grading coefficients $m_1$ to $m_n$ comply within a tolerance range of ±0.05 with the following ellipse equation:

$$\sum_{i=1}^{n}\left(\frac{m_i - 0,25}{a_i}\right)^2 = 1, \text{ with } \sum_{i=1}^{n}\left(\frac{1}{a_i}\right)^2 = 16,,$$

wherein the parameters $a_i$ are determined based on a zero bias capacitance $C_{Joi}$ and a junction voltage potential $V_{Ji}$ of the pn-junction structure of the i-th type.

Further exemplary embodiments may provide a semiconductor device comprising: "n" pairs of pn-junction structures, with n is an integer≥2, wherein the i-th pair, with i∈{1, ..., n}, comprises two pn-junction structures of the i-th type, wherein the two pn-junction structures of the i-th type are anti-serially connected, wherein the pn-junction structure of the i-th type is arranged to have an i-th junction grading coefficient $m_i$ wherein the first to n-th junction grading coefficients $m_1$ to $m_n$ comply within a tolerance range of 0.05 with the following ellipse equation:

$$\sum_{i=1}^{n}\left(\frac{m_i - 0,25}{a_i}\right)^2 = 1, \text{ with } \sum_{i=1}^{n}\left(\frac{1}{a_i}\right)^2 = 16,$$

wherein at least a first pair of the n pairs of pn-junction structures is arranged to have a first junction grading coefficient $m_1$ with $m_1 \notin \{0.00, 0.50\}$ and $m_1 < 0.50$ and a second pair of the n pairs of pn-junction structures is arranged to have a second junction grading coefficient $m_2$, with $m_2 \notin \{0.00, 0.50\}$, wherein the parameters $a_i$ are determined based on a zero bias capacitance $C_{Joi}$ and a junction voltage potential $V_{Ji}$ of the pn-junction structure of the i-th type.

According to an exemplary embodiment, said first pair of the n pairs of pn-junction structures is arranged to have said first junction grading coefficient $m_1$ with $m_1 \leq 0.48$.

According to an exemplary embodiment, said second pair of the n pairs of pn-junction structures is arranged to have said second junction grading coefficient $m_2$ with $m_2 > 0.50$.

According to an exemplary embodiment, each of the first to n-th parameter "$a_1$ to $a_n$" is determined based on the n zero bias capacitances $C_{Jo,1}$-$C_{Jo,ni}$ and on the n junction voltage potentials $V_{J1}$-$V_{Jn}$ of the n pairs of pn-junction structures.

According to an exemplary embodiment, the first to n-th parameter "$a_1$ to $a_n$" comply with the following equation:

$$a_i = \frac{1}{4}\sqrt{\sum_{j=1}^{n}\left(\frac{C_{J0,i}}{C_{J0,j}}\right)^3\left(\frac{V_{Ji}}{V_{Jj}}\right)^2}.$$

According to an exemplary embodiment, the values for the first to "n-th" junction grading coefficients $m_i$ to $m_n$ are adjusted to result in a third-order intercept point IP3 of at least 50 dBm.

According to an exemplary embodiment, at least two of the first to n-th junction grading coefficients $m_1$ to $m_n$ are different.

According to an exemplary embodiment, for n=2 and $C_{jo1}=C_{jo2}$, the first type pn-junction structure is arranged to have the first junction grading coefficient $m_1$ between 0.56 and 0.62, and wherein the second type pn-junction structure is arranged to have the second junction grading coefficient $m_2$ between 0.23 and 0.43.

According to an exemplary embodiment, for n=2, the pn-junction structures of the first and the second type are arranged to have a ratio of the zero bias capacitances $C_{Jo-1}$, $C_{Jo-2}$ which complies with the following condition:

$$\frac{1}{4} < \frac{C_{J0,1}}{C_{J0,2}} < 4.$$

According to an exemplary embodiment, the pn-junction structure of the i-th type forms an i-th type diode structure with an anode region and a cathode region.

According to an exemplary embodiment, the semiconductor device may further comprise a first connecting terminal and a second connecting terminal, wherein the "n" pairs of pn-junction structures are connected between the first and second terminal.

According to an exemplary embodiment, the "n" pairs of pn-junction structures are arranged in a stacked configuration in a semiconductor substrate.

According to an exemplary embodiment, differently doped semiconductor regions of the pn-junction structures extend vertically with respect to a main surface region of the semiconductor substrate into the semiconductor substrate, and wherein the main portion of the area of the metallurgical pn-junction is a planar pn-junction which extend in parallel to a main surface region of the semiconductor substrate.

According to an exemplary embodiment, the two pn-junction structures of i-th pair are arranged together in a stacked configuration in the semiconductor substrate.

According to an exemplary embodiment, one of the two pn-junction structures of a first pair of the n pairs of pn-junction structures is arranged in a stacked configuration in the semiconductor substrate with one of the two pn-junction structures of a second pair of the n pairs of pn-junction structures.

According to an exemplary embodiment, the stacked configuration comprises an npn-structure with a floating base region in the semiconductor substrate.

According to an exemplary embodiment, at least one pair of the n pairs of pn-junction structures is arranged as a pair of two composite pn-junction structures each of which has a first partial pn-junction structure and a second partial pn-junction structure, wherein the first partial pn-junction structure has a first partial junction grading coefficient $m_{i1}$, and wherein the second partial pn-junction structure has a second partial junction grading coefficient $m_{i2}$ different to the first partial junction grading coefficient $m_{i1}$, wherein the junction grading coefficient $m_i$ of the composite pn-junction structure is based on a combination of the first and second partial junction grading coefficients $m_{i1}$, $m_{i2}$.

According to an exemplary embodiment, the first and second partial pn-junction structures are arranged in a semiconductor substrate, wherein said combination proportionately depends on an area ratio between an active area parallel to a first main surface area of the semiconductor substrate of the first and second partial pn-junction structures.

According to an exemplary embodiment, the first and second partial pn-junction structure of the first type pn-junction structure and the first and second partial pn-junction structure of the second type pn-junction structure are arranged together in a laterally isolated common region of the semiconductor substrate.

According to an exemplary embodiment, the first partial pn-junction structure is arranged to have a first partial junction grading coefficient $m_{i1}>0.50$, and wherein the second partial pn-junction structure is arranged to have a second partial junction grading coefficient $m_{i2}$ between 0.30 and 0.5.

According to an exemplary embodiment, the first and second partial pn-junction structures vertically extend in a depth direction with respect to a first main surface area of the semiconductor substrate into the semiconductor substrate.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

What is claimed is:

1. A semiconductor device comprising:
"n" pairs of pn-junction structures, with n is an integer ≥2, wherein the i-th pair, with i∈{1, ..., n}, comprises two pn-junction structures of the i-th type, wherein the two pn-junction structures of the i-th type are anti-serially connected,
wherein the pn-junction structure of the i-th type comprises an i-th junction grading coefficient $m_i$, and
wherein at least a first pair of the n pairs of pn-junction structures comprises a first junction grading coefficient $m_1 \leq 0.48$ and a second pair of the n pairs of pn-junction structures comprises a second junction grading coefficient $m_2 \geq 0.52$.

2. The semiconductor device according to claim 1, wherein the first to n junction grading coefficients $m_1$ to $m_n$ comply within a tolerance range of ±0.05 with the following ellipse equation:

$$\sum_{i=1}^{n}\left(\frac{m_i - 0,25}{a_i}\right)^2 = 1, \text{ with } \sum_{i=1}^{n}\left(\frac{1}{a_i}\right)^2 = 16,$$

wherein the parameters $a_i$ are determined based on a zero bias capacitance $C_{Joi}$ and a junction voltage potential $V_{Ji}$ of the pn-junction structure of the i-th type.

3. The semiconductor device according to claim 1, wherein the first junction grading coefficient $m_1=0.33\pm0.1$, and wherein the second junction grading coefficient $m_2=0.59\pm0.03$.

4. A semiconductor device comprising:
"n" pairs of pn-junction structures, with n is an integer ≥2, wherein the i-th pair, with i∈{1, ..., n}, comprises two pn-junction structures of the i-th type, wherein the two pn-junction structures of the i-th type are anti-serially connected,
wherein the pn-junction structure of the i-th type comprises an i-th junction grading coefficient $m_i$,
wherein the first to n-th junction grading coefficients $m_1$ to $m_n$ comply with the following ellipse equation:

$$\sum_{i=1}^{n}\left(\frac{m_i - 0,25}{a_i}\right)^2 = 1, \text{ with } \sum_{i=1}^{n}\left(\frac{1}{a_i}\right)^2 = 16, \text{ and}$$

wherein at least a first pair of the n pairs of pn-junction structures comprises a first junction grading coefficient $m_1 \leq 0.48$ and a second pair of the n pairs of pn-junction structures comprises a second junction grading coefficient $m_2 \geq 0.52$, wherein the parameters $a_i$ are determined based on a zero bias capacitance $C_{Joi}$ and a junction voltage potential $V_{Ji}$ of the pn-junction structure of the i-th type.

5. The semiconductor device according to claim 4, wherein each of the first to n-th parameter "$a_1$ to $a_n$" is determined based on the n zero bias capacitances $C_{Jo,1}$-$C_{Jo,ni}$, and on the n junction voltage potentials $V_{J1}$-$V_{Jn}$ of the n pairs of pn-junction structures.

6. The semiconductor device according to claim 5, wherein the first to n-th parameter "$a_1$ to $a_n$" comply with the following equation:

$$a_i = \frac{1}{4}\sqrt{\sum_{j=1}^{n}\left(\frac{C_{J0,i}}{C_{J0,j}}\right)^3\left(\frac{V_{Ji}}{V_{Jj}}\right)^2}.$$

7. The semiconductor device according to claim 4, wherein at least two of the first to n-th junction grading coefficients $m_1$ to $m_n$ are different.

8. The semiconductor device according to claim 4, wherein, for n=2 and $C_{jo1}=C_{jo2}$, a first type pn-junction structure is arranged to have the first junction grading coefficient $m_1$ between 0.23 and 0.43, and wherein a second type pn-junction structure is arranged to have the second junction grading coefficient $m_2$ between 0.56 and 0.62.

9. The semiconductor device according to claim 5, wherein, for n=1, the pn-junction structures of a first and a second type are arranged to have a ratio of the zero bias capacitances $C_{Jo-1}$, $C_{Jo-2}$ which complies with the following condition:

$$\frac{1}{4} < \frac{C_{J0,1}}{C_{J0,2}} < 4.$$

10. The semiconductor device according to claim 4, wherein the pn-junction structure of the i-th type forms an i-th type diode structure with an anode region and a cathode region.

11. The semiconductor device according to claim 4, further comprising a first connecting terminal and a second connecting terminal, wherein the "n" pairs of pn-junction structures are connected between the first and second terminal.

12. The semiconductor device according to claim 11, wherein the "n" pairs of pn-junction structures are arranged in a stacked configuration in a semiconductor substrate.

13. The semiconductor device according to claim 12, wherein differently doped semiconductor regions of the pn-junction structures extend vertically with respect to a main surface region of the semiconductor substrate into the semiconductor substrate, and a planar metallurgical pn-junction that extends in parallel to a main surface region of the semiconductor substrate.

14. The semiconductor device according to claim 13, wherein the two pn-junction structures of i-th pair are arranged together in a stacked configuration in the semiconductor substrate.

15. The semiconductor device according to claim 14, wherein one of the two pn-junction structures of a first pair of the n pairs of pn-junction structures is arranged in a stacked configuration in the semiconductor substrate with one of the two pn-junction structures of a second pair of the n pairs of pn-junction structures.

16. The semiconductor device according to claim 14, wherein the stacked configuration comprises an npn-structure with a floating base region in the semiconductor substrate.

17. The semiconductor device according to claim 4, wherein at least one pair of the n pairs of pn-junction structures is arranged as a pair of two composite pn-junction structures each of which has a first partial pn-junction structure and a second partial pn-junction structure,
wherein the first partial pn-junction structure has a first partial junction grading coefficient $m_{i1}$, and wherein the second partial pn-junction structure has a second partial junction grading coefficient $m_{i2}$ different to the first partial junction grading coefficient $m_{i1}$, and
wherein the junction grading coefficient $m_i$ of the composite pn-junction structure is based on a combination of the first and second partial junction grading coefficients $m_{i1}$, $m_{i2}$.

18. The semiconductor device according to claim 17, wherein the first and second partial pn-junction structure of a first type pn-junction structure and the first and second partial pn-junction structure of a second type pn-junction structure are arranged together in a laterally isolated common region of a semiconductor substrate.

19. The semiconductor device according to claim 17, wherein the first partial pn-junction structure is arranged to have a first partial junction grading coefficient $m_{i1} > 0.50$, and wherein the second partial pn-junction structure is arranged to have a second partial junction grading coefficient $m_{i2}$ between 0.30 and 0.5.

20. The semiconductor device according to claim 4, wherein the first junction grading coefficient m1=0.33±0.1, and wherein the second junction grading coefficient m2=0.59±0.03.

* * * * *

UNITED STATES PATENT AND TRADEMARK OFFICE
CERTIFICATE OF CORRECTION

PATENT NO. : 11,764,205 B2
APPLICATION NO. : 17/348291
DATED : September 19, 2023
INVENTOR(S) : Joost Adriaan Willemen Page 1 of 1

It is certified that error appears in the above-identified patent and that said Letters Patent is hereby corrected as shown below:

In the Claims

In Column 33, in Claim 9, Line 63, delete "claim 5," and insert -- claim 4, --.

In Column 33, in Claim 9, Line 64, delete "n=1," and insert -- n=2, --.

Signed and Sealed this
Ninth Day of January, 2024

Katherine Kelly Vidal
*Director of the United States Patent and Trademark Office*